(12) United States Patent
Bonora et al.

(10) Patent No.: US 10,549,420 B2
(45) Date of Patent: Feb. 4, 2020

(54) OVER AND UNDER LINEAR AXIS ROBOT

(71) Applicant: Kimball Electronics Indiana, Inc., Jasper, IN (US)

(72) Inventors: Anthony C. Bonora, Portola Valley, CA (US); Lawrence A. Wise, Cupertino, CA (US)

(73) Assignee: Kimball Electronics Indiana, Inc., Jasper, IN (US)

(*) Notice: Subject to any disclaimer, the term of this patent is extended or adjusted under 35 U.S.C. 154(b) by 35 days.

(21) Appl. No.: 15/922,189

(22) Filed: Mar. 15, 2018

(65) Prior Publication Data

US 2019/0283244 A1   Sep. 19, 2019

(51) Int. Cl.
| | | |
|---|---|---|
| *B25J 9/12* | (2006.01) | |
| *B25J 18/02* | (2006.01) | |
| *B25J 9/00* | (2006.01) | |
| *B25J 13/06* | (2006.01) | |
| *B25J 9/02* | (2006.01) | |

(52) U.S. Cl.
CPC ............ *B25J 9/123* (2013.01); *B25J 9/0009* (2013.01); *B25J 9/126* (2013.01); *B25J 13/06* (2013.01); *B25J 18/02* (2013.01); *B25J 9/023* (2013.01)

(58) Field of Classification Search
CPC ...................................................... B25J 9/123
See application file for complete search history.

(56) References Cited

U.S. PATENT DOCUMENTS

| | | | | |
|---|---|---|---|---|
| 3,834,555 A | * | 9/1974 | Bennington | B21D 43/105 414/627 |
| 4,527,934 A | * | 7/1985 | Blaseck | G21C 19/065 414/4 |
| 4,652,204 A | * | 3/1987 | Arnett | B25J 5/007 212/901 |
| 4,664,873 A | * | 5/1987 | Hendrich | B25J 5/04 376/260 |
| 5,397,212 A | * | 3/1995 | Watanabe | B25J 9/041 310/90.5 |
| 5,989,346 A | * | 11/1999 | Hiroki | C23C 14/566 118/719 |

(Continued)

FOREIGN PATENT DOCUMENTS

| | | | |
|---|---|---|---|
| JP | 06336308 A | * | 12/1994 |
| JP | 07050334 A | * | 2/1995 |

(Continued)

*Primary Examiner* — Gerald McClain
(74) *Attorney, Agent, or Firm* — Faegre Baker Daniels LLP

(57) ABSTRACT

A linear axis robotic structure including a Z-tower. A vertical drive is configured within the Z-tower, and a vertical drive mechanism is adapted to integrate with the vertical drive for linear movement along the Z-tower along a Z-axis. A first section arm is adapted to attach to the vertical drive mechanism and having a horizontal orientation, wherein the first section arm is configured for linear movement along the Z-tower with movement of the vertical drive mechanism. A first linear drive is configured within the first section arm. A first linear drive mechanism is adapted to integrate with the first linear drive for linear movement along the first section arm along a Y-axis. A first gripper is adapted to attach to the first linear drive mechanism and adapted for linear movement along the Y-axis with movement of the first linear drive mechanism.

19 Claims, 33 Drawing Sheets

(56) References Cited

U.S. PATENT DOCUMENTS

2007/0274811 A1* 11/2007 Murata ............. H01L 21/67742
　　　　　　　　　　　　　　　　　　　　　　　　414/217
2010/0290886 A1* 11/2010 Hashimoto .............. B25J 9/042
　　　　　　　　　　　　　　　　　　　　　　　　414/800
2017/0062264 A1*　3/2017 Tang ................. H01L 21/68707

FOREIGN PATENT DOCUMENTS

| JP | 07297255 A | * | 11/1995 |
| JP | 2004311821 A | * | 11/2004 |

* cited by examiner

OVER AND UNDER LINEAR AXIS ROBOT

TECHNICAL FIELD

The present embodiments relate to robots, and more particularly to robots employed in automated Test and Assembly systems.

BACKGROUND

In automated Test and Assembly systems, robots are employed to move devices or modules (Device Under Test; DUT) from one location to another. For example, one or more robots may be employed to pick up a DUT from a DUT carrier in a loading port or conveyor, move the DUT to a test position, move the DUT to one or more intermediate locations (e.g., sequential testing), and move the DUT to one or more test exit locations, depending on the test results.

Typical robots employed in test and assembly systems can be of the type commonly referred to as SCARA (selective compliance assembly robot arm) robots. These SCARA robots include jointed arms that are movable in an x-y plane but not individually movable in the z-direction. That is, the arms may be bi-fold arms movable in the horizontal plane. For example, in an arm with two links, the arm is able to extend out into a space and fold back or retract upon itself within the horizontal plane. This movement is beneficial for transferring objects from one cell to another, such as transporting DUT's to and from test positions.

However, the cost for each SCARA robot unit may be prohibitive for some use cases. That is, a SCARA robot having multi-jointed arms requires multiple radial drive motors to control movement of the arms about a horizontal plane. A SCARA robot having multi-jointed arms that is employed in a use case that does not require movement about the horizontal plane of a SCARA robot would not need to use one or more of the radial drive motors. That is, the SCARA robot having multi-jointed arms would have extraneous features that are unnecessary and that add to the total cost of the SCARA robot.

Further, SCARA robots typically are limited in the number of arms used for manipulating objects. As such, in order to increase the number of objects being manipulated, additional SCARA robots are required. However, additional SCARA robots necessitate an increase in the footprint of the robot system. Many use cases cannot accommodate an increase in the footprint of the robot system, and as such, the overall system has a hard limit in the number of objects that it can handle and/or manipulate over a period of time.

It would be beneficial to design a robot capable of handling objects in a rectilinear fashion, and for handling a greater number of objects without necessarily increasing the footprint of the robot.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments arise.

SUMMARY

The present embodiments relate to solving one or more problems found in the related art, and more specifically include robots configured for vertically oriented articulated arm motions.

Embodiments of the present disclosure include a linear axis robotic structure. The robotic structure includes a Z-tower. The robotic structure includes a vertical drive configured within the Z-tower. The robotic structure includes a vertical drive mechanism adapted to integrate with the vertical drive for linear movement along the Z-tower along a Z-axis. The robotic structure includes a first section arm adapted to attach to the vertical drive mechanism and having a horizontal orientation. The first section arm is configured for linear movement along the Z-tower with movement of the vertical drive mechanism. The robotic structure includes a first linear drive configured within the first section arm. The robotic structure includes a first linear drive mechanism adapted to integrate with the first linear drive for linear movement along the first section arm along a Y-axis. The robotic structure includes a first gripper adapted to attach to the first linear drive mechanism and adapted for linear movement along the Y-axis with movement of the first linear drive mechanism.

Other embodiments disclose another linear axis robotic structure. The robotic structure includes a platform. The robotic structure includes a rotatable base mounted to the platform and is adapted to rotate in theta about the platform. The robotic structure includes a Z-tower attached to the rotatable base, wherein the Z-tower rotates with the rotatable base. The robotic structure includes a vertical drive configured within the Z-tower. The robotic structure includes a vertical drive mechanism adapted to integrate with the vertical drive for linear movement along the Z-tower along a Z-axis. The robotic structure includes a section arm adapted to attach to the vertical drive mechanism and having a horizontal orientation. The section arm is configured for linear movement along the Z-tower with movement of the vertical drive mechanism. The robotic structure includes a first linear drive configured within the section arm. The robotic structure includes a first linear drive mechanism adapted to integrate with the first linear drive for linear movement along the section arm along a Y-axis. The robotic structure includes a first gripper adapted to attach to the first linear drive mechanism and adapted for linear movement along the Y-axis with movement of the first linear drive mechanism.

Still other embodiments disclose a linear axis robotic structure. The robotic structure includes a Z-tower. The robotic structure includes a vertical drive configured within the Z-tower. The robotic structure includes a vertical drive mechanism adapted to integrate with the vertical drive for linear movement along the Z-tower along a Z-axis. The robotic structure includes an arm support structure adapted to attach to the vertical drive mechanism. The arm support structure is configured for linear movement along the Z-tower with movement of the vertical drive mechanism. The robotic structure includes a plurality of linear drives configured within the arm support structure. The robotic structure includes a plurality of slots, each arranged horizontally within an outward face of the arm support structure. The robotic structure includes a plurality of linear drive mechanisms, each adapted to integrate with a corresponding linear drive through a corresponding slot for linear movement along a corresponding Y-axis. The robotic structure includes a plurality of grippers, each adapted to attach to a corresponding linear drive mechanism and adapted for linear movement along a corresponding Y-axis with movement of the corresponding linear drive mechanism.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings. The drawings are not drawn to scale.

DETAILED DESCRIPTION

Figure 1:
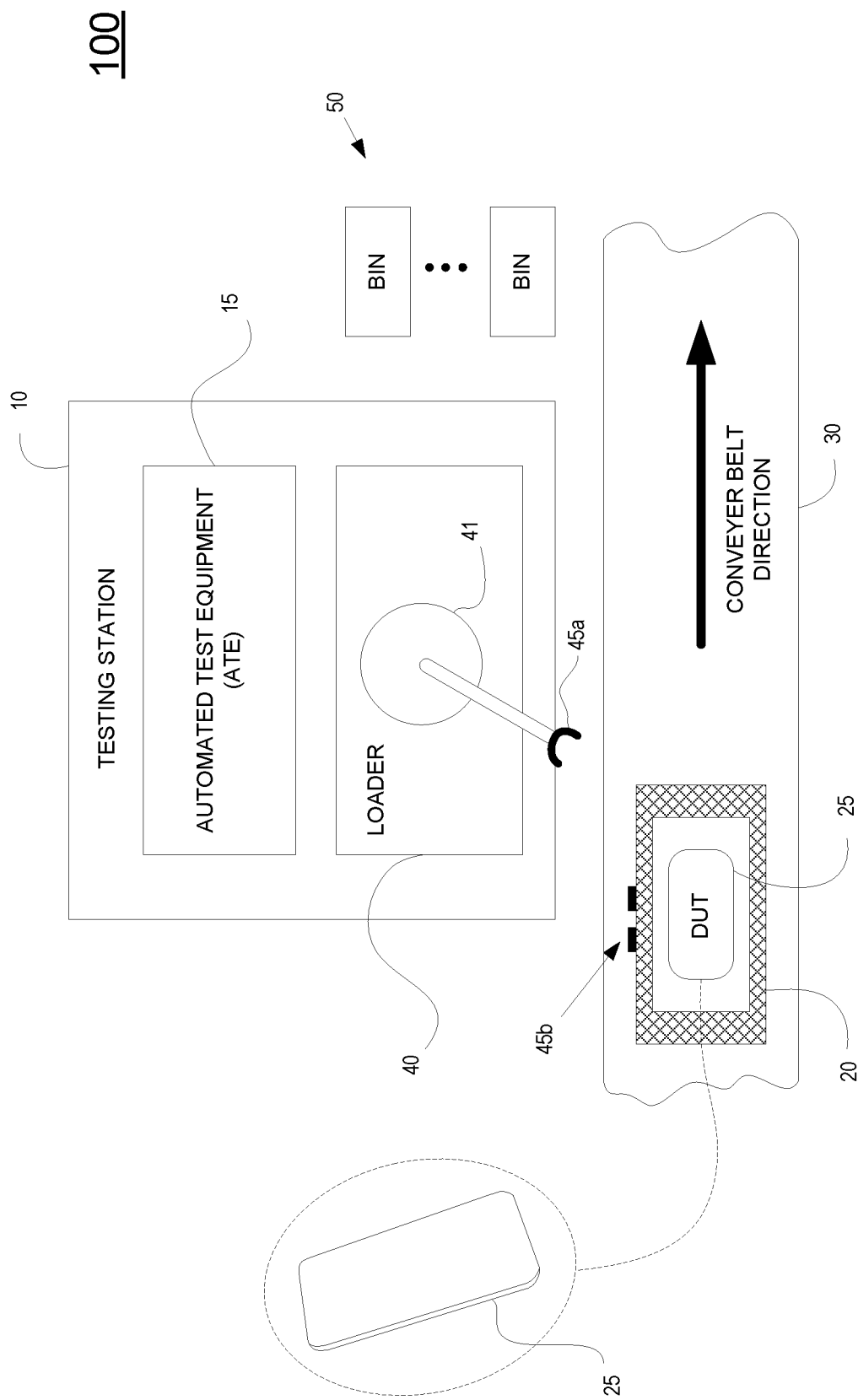
FIG. 1 illustrates a testing system configured for testing a device (e.g., substrate, DUT, etc.), in accordance with one embodiment of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe robotic systems having an over and under configuration and rectilinear arm motions. In particular, the robotic systems may be configured as a linear slide assembly attached to a vertically oriented Z-mast. The linear slide assembly may utilize one or more horizontal linear drive elements. The linear drive elements may include guiding bearings and motion elements that are arranged about an arm support structure in vertical fashion. For example, in one embodiment, the linear drive elements are configured in an over and under configuration about an arm structure (e.g., section arm). In another embodiment, one or more linear drive elements are stacked in a vertical fashion. In that manner, the vertical arrangement of one or more linear drive elements provides for a variable number of linear drive elements in one footprint to the robotic system. A single robotic system may provide scalability by increasing the number of arm elements (e.g., section arms), or increasing the size of the arm element to handle a required number of linear drive elements, all within the same footprint. In addition, restricting the motion of the robotic systems to rectilinear arm motions provides for optimum cost control based on the specific applications. In that manner, a use case or application that does not require articulated arm motions for increased extension is supported by the over and under configuration for the robotic system exhibiting rectilinear arm motions. Additional theta axis motion and/or x axis motions for the Z-mast may also be configured for specific application requirements. In addition, the vertical orientation of the arms provides for increased stiffness in the load bearing direction, as opposed to conventional robotic arms. This improved stiffness enables faster motions, less vibration, and a higher degree of placement position accuracy at drop-off/pick-up locations.

Embodiments of the present disclosure are beneficial for use in a variety of applications as they provide flexible object (e.g., substrate) motion capabilities while minimizing the envelope required for the associated mechanistic support and motion guidance componentry. For example, applications benefiting from the use of robotic systems having linear axis arm motions include substrate handling applications (e.g., DUT handling), panel display manufacturing that require multiple levels of assembly and testing for substrates, modules, manufacturing of medical appliances and/ or devices (e.g., stents, microbiological devices for pharmaceutical uses, etc.). In addition, flexibility for varying motion capabilities enables optimum cost control when considering specific applications.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Embodiments of the present disclosure relate to methods and apparatuses for performing the handling and transport of objects, including robots and/or tool systems coupled to DUT testing modules. Other embodiments are configured for handling and transport of objects using robots and/or tool systems coupled to semiconductor process modules. Various embodiments of the present disclosure may be implemented in various testing and/or process module configurations and/or systems. Further, embodiments of the present disclosure are not limited to the examples provided herein, and may be practiced in different testing and/or processing systems employing different configurations, geometries, and plasma-generating technologies, and may be practiced in different systems and/or applications requiring transport of objects, such as a testing facility transporting test objects between tool systems; fulfillment centers providing supply chain management and order processing that handle small, medium and large objects; manufacturing centers (e.g., manufacturing panel displays, smartphones, etc.); and others.

Although embodiments of the present disclosure are described herein in relation to systems for processing wafers, it is understood that the robotic systems of embodiments of the disclosure are not limited to handling wafers and are suitable for handling a variety of objects, such as when handling DUTs for testing processes.

FIG. 1 illustrates a testing system 100 configured for testing a device, such as a DUT 25, in accordance with one embodiment of the present disclosure. Testing system 100 may be employed during manufacturing operations at various stages. For example, the DUT 25 may be a substrate undergoing fabrication of a plurality of devices, wherein the substrate is tested to determine whether formed devices are operating properly, and to make a decision on whether to continue manufacturing devices on that substrate based on test results. In another example, DUT 25 may be a fully manufactured device, such as a mobile phone, and a final test is performed to determine whether the device satisfies operational requirements before it can be released for sale. FIG. 1 shows an example of a DUT 25 that is a mobile phone being held by and interfacing with carrier 20.

Testing system 100 may include one or more testing stations 10, each of which is configured for performing a particular test. The testing station 10 typically includes an automated test equipment (ATE) 15 that is configured for performing one or more testing operations on the DUTs 25. In addition, testing station 10 may include a loader 40 that is configured for loading and unloading DUTs 25 into the testing environment of the ATE 15. For example, loader 40 may include robotic system 41 having vertically oriented arm motions thereby enabling exhibiting compact motion drives (e.g., minimizing the envelope required for associated mechanistic support and motion guidance componentry) independent of arm extension. The robotic system 41 may be configured for loading and unloading the DUTs. For example, robotic system 41 may be configured to interface with carriers and/or trays that hold one or more DUTs. Further, the carriers and/or trays may be configured for transporting DUTs for entry into and exit from the testing system 100, as well as transporting DUTs within an overall system (e.g., manufacturing system) to various tool systems.

Further, once a DUT 25 has been tested, the robotic system 41 may deliver the DUT 25 to a particular bin in the plurality of bins 50. For example, in the case of a fully manufactured device (e.g., mobile phone), if the test results are positive, the DUT 25 is placed into a bin holding DUTs that have passed testing by the robotic system 41. On the other hand, if the DUT 25 failed a test, the robotic system may place the DUT 25 into another bin holding DUTs that are to be repaired and retested. Test results may further be stored in a data store (not shown) of the testing system 100.

As shown, the testing system 100 may move DUTs using test carriers 20. For instance, DUTs 25 may be moved between one or more test stations 10 using a conveyor belt 30, or any other means for transporting the DUTs via test carriers 20. For example, test carriers 20 may be transferred from one robotic system 41 to another robotic system 41 along a series of tracks, load ports, transfer modules, etc. In FIG. 1, testing station 10 is configured with a loading mechanism, such as loader 40 including a robotic system 41, wherein the loading mechanism picks up the test carrier from the conveyer belt, and transports the test carrier 20 to the ATE 15 for testing. After testing, the robotic system 41 may transport the test carrier 20 back to the conveyer belt 30, so that the test carrier 20 may be delivered to another location, such as another testing station, repair station, exit station, packing station, etc. Robotic system 41 may also transport the test carrier 20 directly to another test station 10. Further, robotic system 41 may deliver the test carrier 20 to a bin depending on testing results, as previously described.

The test carrier 20 includes a receiver 45b that is configured to mate with an interface 45a of the gripper (e.g., gripper 240) of robotic system 41. In that manner, the robotic system 41 is able to pick up the test carrier 20 for transporting purposes. In addition, the test carrier 20 may serve as an interface between the DUT 25 and the ATE 15 to the testing station 10. That is, the test carrier 20 may be configured to mate with the testing station 10 directly, instead of the DUT 25. For example, the test carrier 20 may a be more sturdy design and better equipped to handle the interface with the testing station 10, when compared to the DUT 25.

FIGS. 2A-2I illustrate various embodiments of robotic structures, each of which are configured for rectilinear arm motions. The robotic structures are similarly configured in FIGS. 2A-2E and where applicable include similarly numbered elements that may also be used throughout the specification. The robotic structures of FIGS. 2A-2I and throughout this specification are configured for handling various objects and/or devices, in accordance with embodiments of the present disclosure. For instance, in some embodiments, robotic structures (e.g., 200A of FIG. 2A) are configured for handling wafers and/or substrates, wherein the robotic structure includes grippers configured with and/or interfacing with end effectors. Other embodiments disclose robotic structures (e.g., 200D of FIG. 2F) that are configured for handling DUTs, wherein the robotic structure includes grippers configured with and/or interfacing with carriers and/or trays. As previously described, other embodiments disclose the use of other types of grippers configured for handling any of a variety of objects, carriers, trays, DUTs, etc.

Figure 2A:
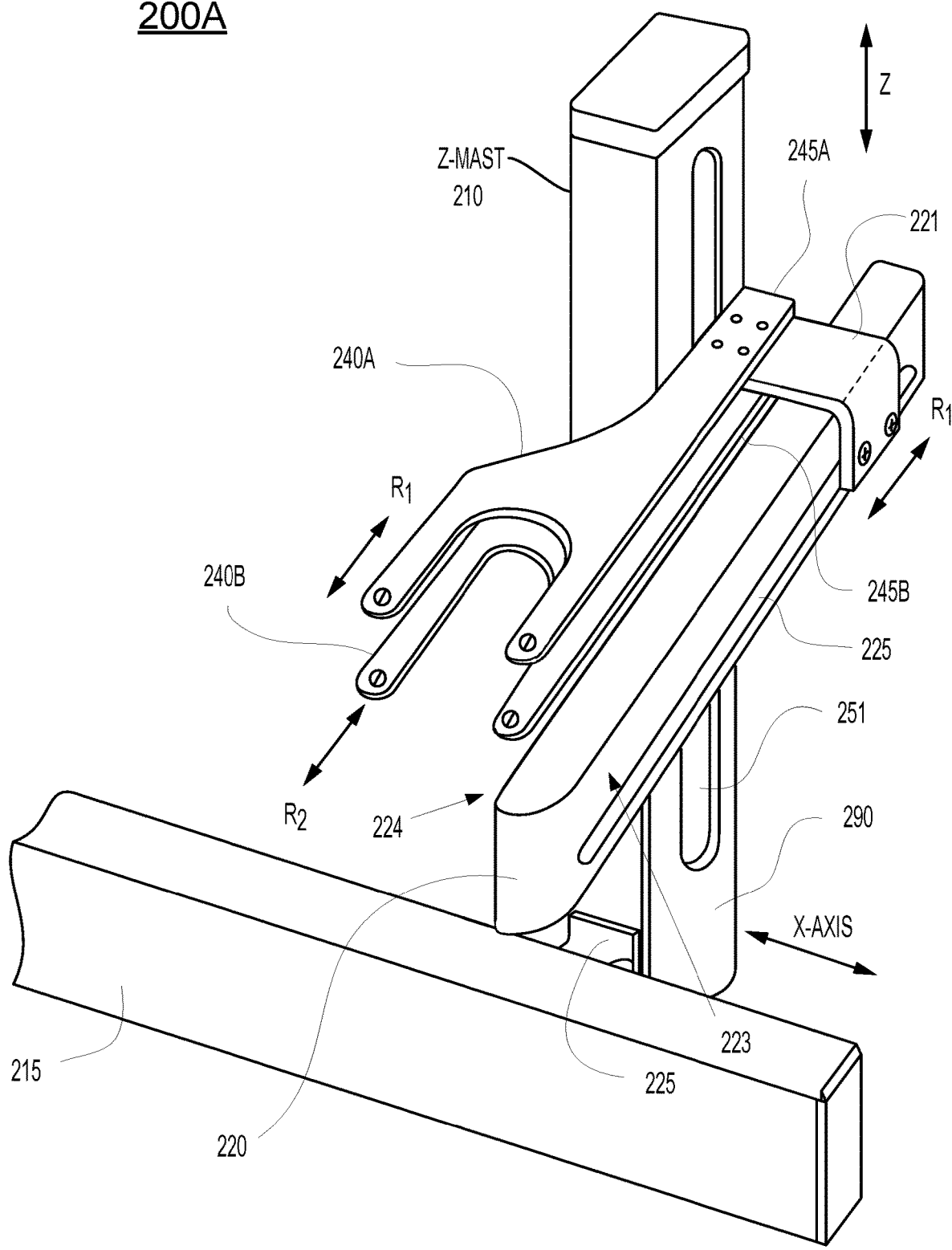
FIG. 2A illustrates a perspective view of an over/under linear axis robotic structure that is configured for rectilinear arm motions, wherein the robotic structure may be mounted to a track system, in accordance with one embodiment of the present disclosure.
Figure 2B:
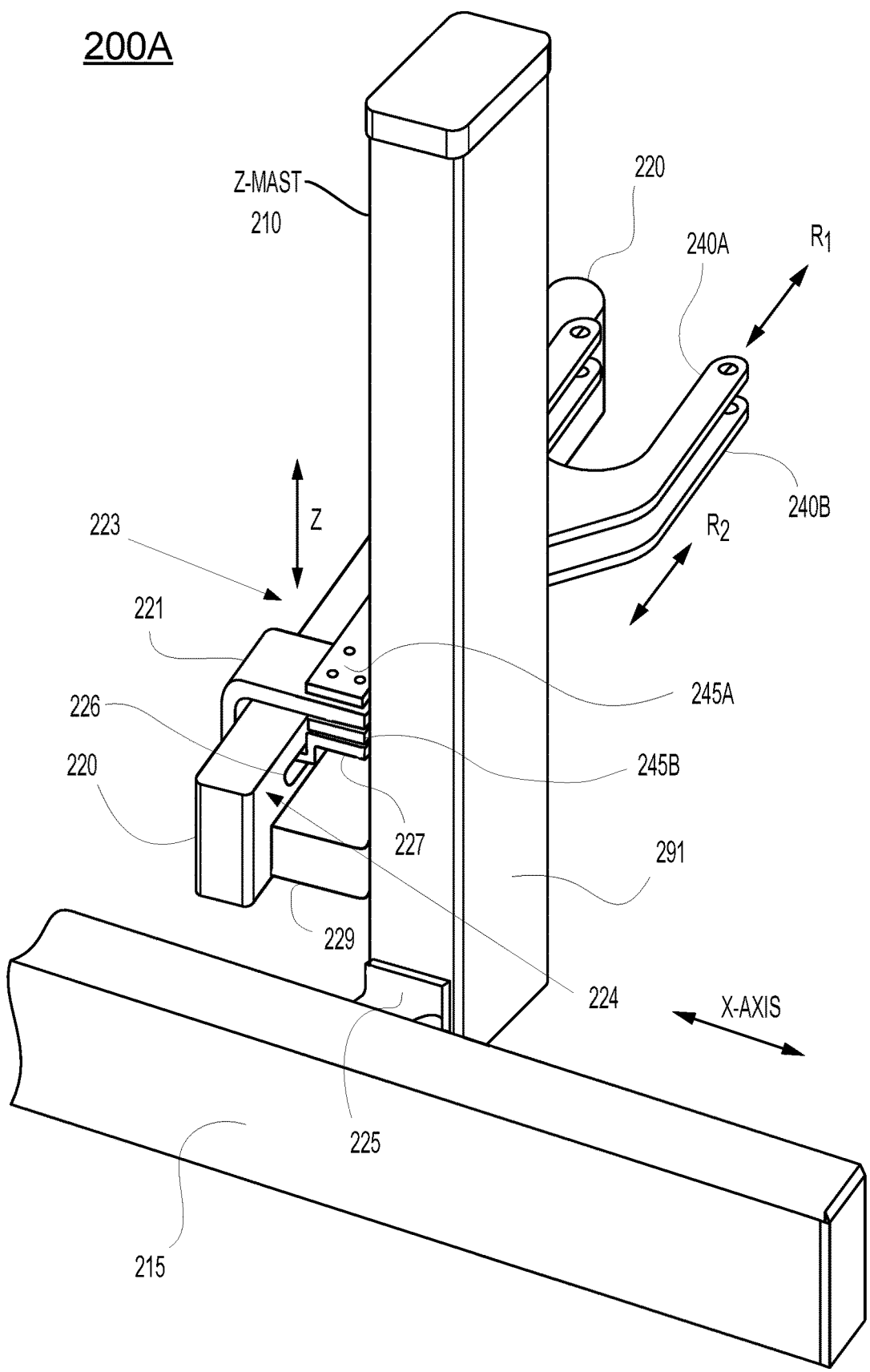
FIG. 2B illustrates a different perspective view of the over/under linear axis robotic structure of FIG. 2A that is configured for rectilinear arm motions, wherein the robotic structure may be mounted to a track system, in accordance with one embodiment of the present disclosure.

FIGS. 2A-2B illustrate perspective views of an over/under linear axis robotic structure 200A that is configured for rectilinear arm motions, in accordance with embodiments of the present disclosure. In particular, FIG. 2A illustrates a perspective view (e.g., taken from a first perspective in space) of the over/under linear axis robotic structure 200A that is configured for rectilinear arm motions, in accordance with one embodiment of the present disclosure. FIG. 2B illustrates a different perspective view (e.g., taken from a second perspective) of the over/under linear axis robotic structure of FIG. 2A that is configured for rectilinear arm motions, wherein the robotic structure may be mounted to a track system, in accordance with one embodiment of the present disclosure. For instance, in FIG. 2A the front side 290 of the Z-tower 210 is visible, wherein the front side 290 was hidden in FIG. 2B. In FIG. 2B, the back side 291 of the Z-tower 210 is visible, and the front side is hidden. Back side 291 may be opaque in one embodiment, which may be beneficial for keeping contaminants from exiting the robotic structure 200A. In particular, the robotic structure 200A includes a section arm 220, or arm support structure, wherein a linear drive configured within the section arm 200 enables rectilinear movement along the section arm.

In one embodiment, the robotic structure 200A is not coupled to a track system. In particular, the robotic structure 200A is fixedly attached to support 215 through bracket 225. Support 215 may be configured as a rigid platform that provides a rigid structure such that the various motions of the robotic structure 200A can be repeated with accuracy. For example, the Z-tower 210 of the robotic structure 200A may be fixedly attached to the support 215 through bracket 225. As such, no movement of the Z-mast 210 would be possible along the X-axis, such as the description provided in relation to FIG. 2D.

In another embodiment, the robotic structure 200A is configured for movement, in part, along the X-axis. In particular, support 215 may be configured with a drive (not shown) (e.g., belt system, linear drive, etc.). Bracket 225 is adapted to moveably interface with the drive to enable movement of the Z-mast 210 of the robotic structure 200A along the support 215. That is, the Z-mast is movable in the X-direction along the X-axis, at least for a section of the support 215. Though not shown in detail, the X-axis is known in the art and does not require further disclosure. For instance, the X-axis may define a direction of a section of a track, wherein the X-axis may define motion of the robotic system 200A in the X-direction within a horizontal plane.

The robotic structure 200A also includes a vertically oriented Z-tower 210 (also referred to as a Z-mast). As shown, Z-mast is fixedly attached to or moveably interfaced with structure 215 through bracket 225. The robotic structure 200A is configured for rectilinear arm motions along one or more defined lines in space, depending on the position and orientation of the Z-tower 210. In that manner, arm motions along the defined lines provide for retracting and extending out grippers 240A and 240B in order to pick-up and/or drop-off objects. For example, when the Z-tower 210 is fixed, the robotic structure 200A is configured for rectilinear arm motions along one or more defined lines that are fixed in space. When the Z-tower is configured for X-motion, the robotic structure 200A is configured for rectilinear arm motions along defined lines that may be further positioned according to X-motion and/or theta motion of the Z-tower 210.

A vertical drive (not shown) is configured within the Z-tower 210. A vertical drive mechanism is adapted to integrate with the vertical drive for linear movement along the Z-tower 210 along a Z-axis. Though not shown in detail, the Z-axis is known in the art and does not require further disclosure. For instance, the Z-axis may define linear motion of the section arm 220 along the Z-tower, or along a Z-direction. As shown, slot 251 located on the front side 290 of the Z-tower 210 allow for the linear drive mechanism (not shown) to integrate with the vertical drive (not shown) within the Z-tower 210. For example, the vertical drive may include a ball slide assembly, wherein the linear drive mechanism is adapted to attach to the ball slide assembly for movement along the Z-axis. In another example, the vertical drive may include a ball screw assembly. In one embodiment, the gear box 215 includes control and motor drive components to facilitate movement of the linear drive mechanism.

The robotic structure 200A includes a section arm 220, or arm support structure), that is adapted to attach to the vertical drive mechanism. As shown, the section arm 220 has a horizontal orientation, such that linear movement along the section arm is performed in a horizontal plane, and more particularly along one or more defined lines within the horizontal plane. In addition, because the section arm 220 is adaptively attached to the vertical drive mechanism, the section arm 220 is configured for linear movement along the Z-tower based on movement of the vertical drive mechanism.

Throughout the specification, the various motion drives for the rectilinear arm motions of the linear drive mechanisms and corresponding grippers along a linear axis, the vertical motion of the vertical drive in the Z-axis, and/or rotational drives for theta motion, as described further below, can utilize a variety of solutions. For example, ball slide assemblies and/or ball screw assemblies may be utilized to provide rectilinear and/or linear motion. Also, harmonic or planetary drives with either integrated motors or timing belt driven motors may be incorporated, in one embodiment. Alternately, direct-drive motors may be utilized to provide angular motion, in another embodiment. High resolution encoders/controllers can be employed with drive solutions in embodiments. As such, any mechanism or means may be used for controlling movement of the linear drive mechanism of a corresponding section arm 220. For example, other control mechanisms may include the previously described drives, a direct linear drive, chain drive, a radial drive, ball slide assembly, ball screw assembly, etc.

In addition, the robotic structure 200A includes at least one arm extension, each configured for linear movement along a corresponding Y-axis that is aligned along the section arm 220. For example, robotic structure 200A includes arm extension R1 and R2. Although robotic structure 200A as shown includes two arm extensions for the section arm 220, the number of arm extensions may vary from one to greater than one depending on the configuration of the section arm 220 or arm support structure. That is, the robotic structure 200A may be configured as having a single arm extension, or multiple arm extensions supported by one or more section arms (e.g., arm support structures).

Each arm extension includes a linear drive, linear drive mechanism, and gripper configuration. Each linear drive (not shown) is configured within the section arm 220. In one embodiment, the linear drive is a ball slide assembly. In particular, the corresponding linear drive mechanism (e.g., bracket) is adapted to integrate with the linear drive for linear movement along the section arm 220 along a corresponding Y-axis. In addition, a gripper is adapted to attach to the linear drive mechanism, wherein the gripper is adapted for linear movement along the corresponding Y-axis with movement of the linear drive mechanism. Each gripper is configured for linear motion along a corresponding Y-axis (e.g., defined through the center line Y of the end of the gripper holding an object). One or more control mechanisms may be implemented to provide independent control of each of the arm extensions, such that the movement of arm extension R1 is separately controlled from the movement of arm extension R2.

For example, arm extension R1 includes a first linear drive (not shown) configured within the section arm 220, and corresponding first linear drive mechanism 221 adapted to integrate with the first linear drive for linear movement along the section arm 220. For example, linear drive mechanism 221 is adapted to integrate with the first linear drive through the slot 225, wherein slot 225 is arranged horizontally along an outer face 223 of the first section arm 220. The outer face 223 faces outwards away from the Z-tower 210. Further, gripper 240A is adapted to attach to the first linear drive mechanism 221, and is further adapted for linear movement along the corresponding Y-axis with movement of the linear drive mechanism 221. That is, gripper 240A is configured for linear motion along a corresponding Y-axis (e.g., defined through the center line Y-1 of the end of the gripper 240A holding an object). As shown, an end 245A of gripper 240A is adapted to attach to the linear drive mechanism 221. In one embodiment, the end 245A is fixedly attached to the linear drive mechanism 221.

In addition, arm extension R2 includes a second linear drive (not shown) configured within the section arm 220, and corresponding linear drive mechanism 227 adapted to integrate with the second linear drive for linear movement along the section arm 220. For example, linear drive mechanism 227 is adapted to integrate with the second linear drive through the slot 226 (see FIG. 2B), wherein slot 226 is arranged horizontally along an inner face 224 of the first section arm 220. The inner face 224 faces inwards towards the Z-tower 210. Further, gripper 240B is adapted to attach to the second linear drive mechanism 227, and is further adapted for linear movement along the corresponding Y-axis with movement of the second linear drive mechanism 227. That is, gripper 240B is configured for linear motion along a corresponding Y-axis (e.g., defined through the center line Y-2 of the end of the gripper 240A holding an object). As shown, an end 245B of gripper 240B is adapted to attach to the linear drive mechanism 227. In one embodiment, the end 245B is fixedly attached to the second linear drive mechanism 227.

Each of the grippers 240A and 240B is adapted to interface with a corresponding object. The grippers 240A and 240B may be active or passive devices, such that they may actively engage with the corresponding object (e.g., vacuum), or may passively engage with the corresponding object (e.g., barriers). A discussion of gripper 240A is provided as being representative of any gripper used within robotic structures described throughout the specification. For example, in one implementation, gripper 240A is an end-effector that is configured for handling DUTs. In another implementation, the end-effector may be configured for handling substrates, or wafer substrates. In still another implementation, gripper 240A is configured for handling carriers, wherein the carrier may be used for transporting objects. For example, a carrier may be shaped as a basket into which objects may be placed, and out of which object may be removed. Purely for illustration, the carrier may be employed in a fulfillment center, or the carrier may be employed in a manufacturing setting to move components from one location to another, such as when building panel displays. For instance, gripper 240A may be adapted to handle or connect with a container having a receptacle area for holding one or more objects.

In embodiments, the robotic structures (such as robotic structure 200A) described throughout the specification are configured with sensing capabilities to perform various sensing operations. The sensing capabilities may be performed by any sensing means or elements, including implementing infrared sensing means or elements using infrared signals, implementing light sensing means or elements using visible or ultraviolet light signals, implementing ultrasonic sensing means or elements using ultrasonic signals, implementing mechanical sensing means or elements, etc. Various use cases are described below for implementing the sensing capabilities in one or more robotic structures described in the specification.

In one embodiment, grippers 240A and 240B are each configured with sensing capabilities to sense the presence or absence of objects (e.g., an element, substrate, wafer, DUT, etc.). When multiple grippers are employed, a magnitude of sensing means or elements are implemented, such as in a one-to-one relationship. In particular, the sensing capabilities may be utilized with support features on the grippers 240A and 240B (e.g., end-effectors) during automated transfer and retrieval of the objects. That is, the sensing capabilities are utilized to determine whether corresponding objects have been placed onto the grippers or removed from the grippers.

In another embodiment, sensing capabilities can be implemented to assess whether storage positions are empty or full. The sensing capabilities can be implemented within the storage component (e.g., front opening unified POD—FOUP) including the storage positions (e.g., storing objects in slots). In addition, the storage capabilities can be implemented within a component interfacing or engaging with the storage positions, such as grippers 240A and 240B. For example, instead of being directed to sense whether an object is being handled by gripper 240A, as the storage component is approached, the sensing capabilities of gripper 240A may be oriented to determine whether the storage component is empty or full. Further, the sensing capabilities can be implemented to provide feedback on positioning of the grippers 240A and 240B in relation to the storage component and/or storage positions within the storage component. For example, the feedback may be used to enable accurate positioning of the grippers 240A and 240B (e.g., end-effectors) or any other handling means.

In addition, each rectilinear element (e.g., arm extensions R1 and R2) may be configured with sensing capabilities to make various determinations. For example, sensing capabilities may be implemented to determine object thickness (e.g., when handled by gripper 240A, or during placement into a storage position of a storage component. Further, sensing capabilities may be implemented to determine planarity for the rectilinear element, such as determining whether an arm extension is properly positioned to engage with a storage position (e.g., slot) in a storage component (e.g., FOUP). Also, sensing capabilities may be implemented to determine theta orientation of the rectilinear element, such as determining whether an arm extension is angled at the proper theta positioned to enable interfacing with a storage position of a storage component. Furthermore, sensing capabilities may be implemented to determine angular tilt of the rectilinear element, such as determining whether the angular tilt of the arm extensions R1 and R2 and/or angular tilts of the grippers 240A and 240B are angled properly to enable interfacing with one or more storage positions of a storage component.

The robotic structure 200A is configured in an over and under linear axis configuration. In particular, the arm extension R1 (and more specifically the gripper 240A) is configured above the section arm 220, and the arm extension R2 (and more specifically the gripper 240B) is configured below the section arm 220. Other configurations are supported for providing one or more arm extensions, each of which is configured for rectilinear motion about the section arm, or corresponding arm support structure.

As shown, section arm 220 is configured to increase the load bearing capabilities in the Z-direction (e.g., forces on grippers, and held objects due to gravity), in one embodiment. For example, a cross-section of the arm section 220 exhibits a wider dimension in the load bearing direction (e.g., vertical or Z-direction), when compared to a horizontal dimension. This provides better stiffness of the section arm Si (e.g., without horizontal bending) to handle downward forces in the Z-direction.

Means for preventing contamination of the enclosed system within which the robotic structure 200A resides is provided in embodiments of the present disclosure. The contamination may originate through moving parts of the robotic structure 200A. For instance, micro-particulates may be generated by internal mechanisms of the robotic structure 200A. Control of the micro-particulates may be accomplished through sealing of rotary articulation joints. For example, protective covers may be provided over joints or pivot points allowing for movement of components. In addition, a lower internal atmospheric pressure may be provided at the articulation joints. Also, covers may be provided over slots 225, 226, and 251. For example, for the vertical motion of the Z-axis, the use of rolling "sealing tapes" or a lower atmospheric pressure inside the Z-tower 210, alone or in combination, may be implemented to assure required cleanliness during the Z-axis operation.

Figure 2C:
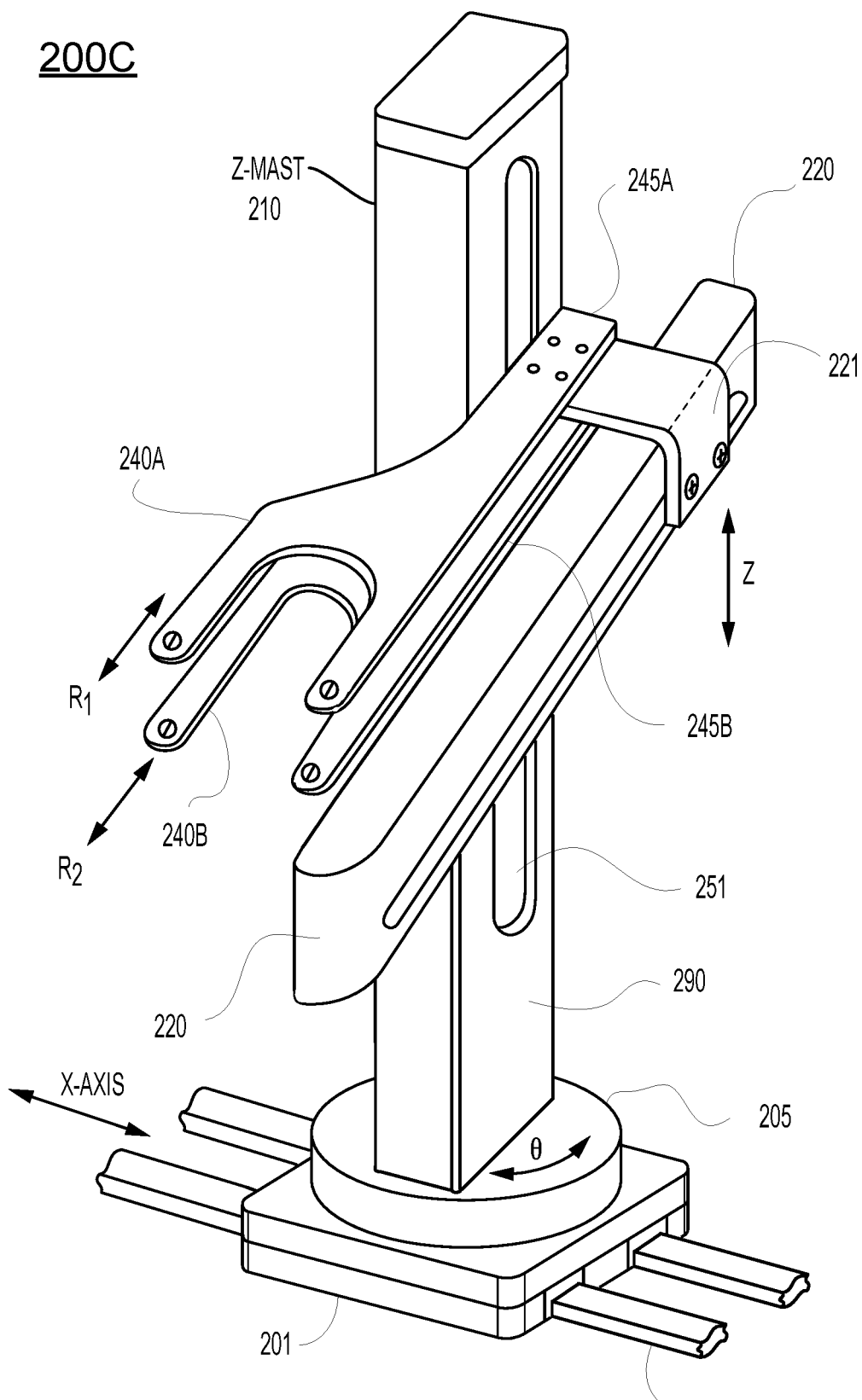
FIG. 2C illustrates a perspective view of an over/under linear axis robotic structure that is configured for rectilinear arm motions, wherein the robotic structure is configured for theta motion, and is mounted to a track system, in accordance with one embodiment of the present disclosure.

FIG. 2C illustrates a perspective view of an over and under linear axis robotic structure 200C that is configured for rectilinear arm motions, wherein the robotic structure is configured for theta motion, and is mounted to a track system, in accordance with one embodiment of the present disclosure. The robotic structure 200C is similarly configured as the robotic structure 200A of FIGS. 2A-2B, except that the robotic structure 200C is mounted to a platform 201 and track system 230. In addition, robotic structure 200C is further configured to provide theta ($\theta$) motion along a $\theta$ axis, one or more Y-motions corresponding to the motion of grippers of arm extensions, X-motion along a section of the track system 230, and Z-motion along a Z-axis. Though not shown in detail, the $\theta$-axis, the one or more Y-axis, Z-axis, and X-axis are known in the art and do not require further disclosure. For instance, the $\theta$-axis may have a particular orientation in space enabling positioning of the robotic structure 200C at a particular theta angle. In addition, the R-axis may define a R-distance for any particular theta angle. Further, the Z-axis defines motion of the section arm 220 in the Z-direction. Also, the X-axis may define a direction of a section of a track system 230, wherein the X-axis may define motion of the robotic system 200C in the X-direction within a horizontal plane.

In particular, the robotic structure 200C includes a platform 201 upon which additional components are added. Platform 201 provides a rigid structure such that the various motions of the robotic structure 200C can be repeated with accuracy. As shown, platform 201 is adapted to moveably interface with track system 230, such that the platform 201 is movable in the X-direction along the X-axis, at least for a section of the track system 230. For example, a linear drive is included in robotic structure 200C (e.g., within platform 201) to enable movement of the platform along the X-axis. As such, robotic structure 200C is also movable in the X-direction through the movement of platform 201.

In addition, a rotatable base 205 is rotatably mounted to the platform 201. That is, rotatable base 205 is adapted to rotate in theta about the platform 201. A rotational drive (not shown) may be included in the robotic structure 200A to enable theta movement. As previously described, the robotic structure 200C also includes a vertically oriented Z-tower 210 that is fixedly attached to the rotatable base 205. As such, the Z-tower 210 rotates with the rotatable base 205. In that manner, the robotic structure 200A can be oriented in any theta-direction for purposes of retracting and extending out the arms R1 and R2, such as to pick-up and/or drop-off objects, or for positioning when moving the robotic structure 200C along track system 230.

Figure 2D:
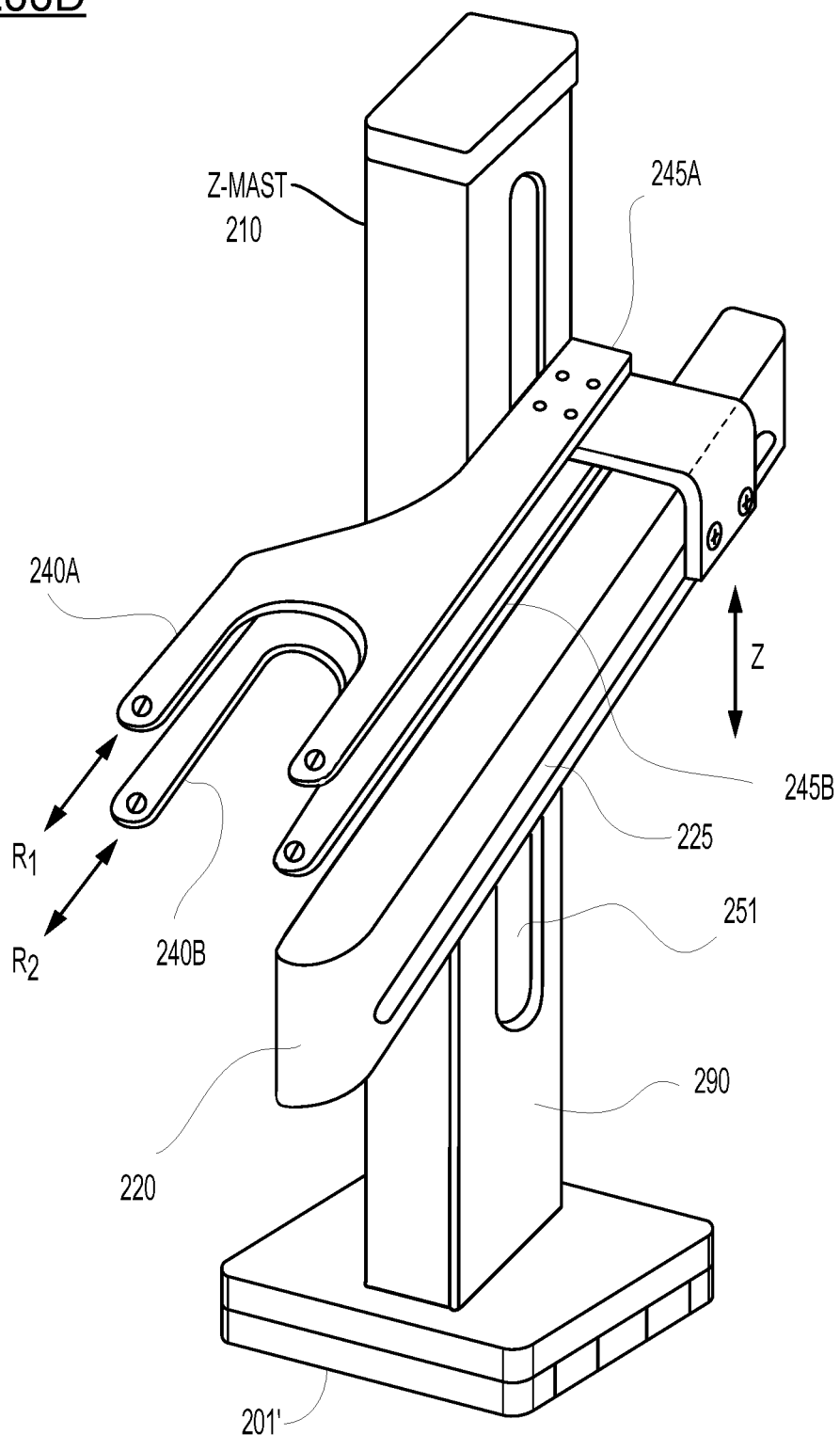
FIG. 2D illustrates a perspective view of an over/under linear axis robotic structure that is configured for rectilinear arm motions, wherein the robotic structure is mounted to a fixed platform such that the robotic structure extends upwards from the platform, in accordance with one embodiment of the present disclosure.

FIG. 2D illustrates a perspective view of an over and under linear axis robotic structure 200D that is configured for rectilinear arm motions, wherein the robotic structure is mounted to platform 201' such that the robotic structure extends upwards from the platform 201', in accordance with one embodiment of the present disclosure. The robotic structure 200C is similarly configured as the robotic structure 200A of FIGS. 2A-2B, except that the robotic structure 200D is mounted to the platform 201' that is fixed in space. As such, the robotic structure 200D is fixed to a particular location within a space. As shown, the robotic structure 200D provides for rectilinear motion without any theta motion (e.g., as provide through a rotatable base), in one embodiment. Other embodiments are well suited to configuring robotic structure 200D to provide theta (θ) motion along a θ axis, one or more Y-motions along one or more corresponding Y-axis, and Z-motion along a Z-axis, as previously described. In addition, in another embodiment, X-motion may optionally be provided through a track system.

Figure 2E:
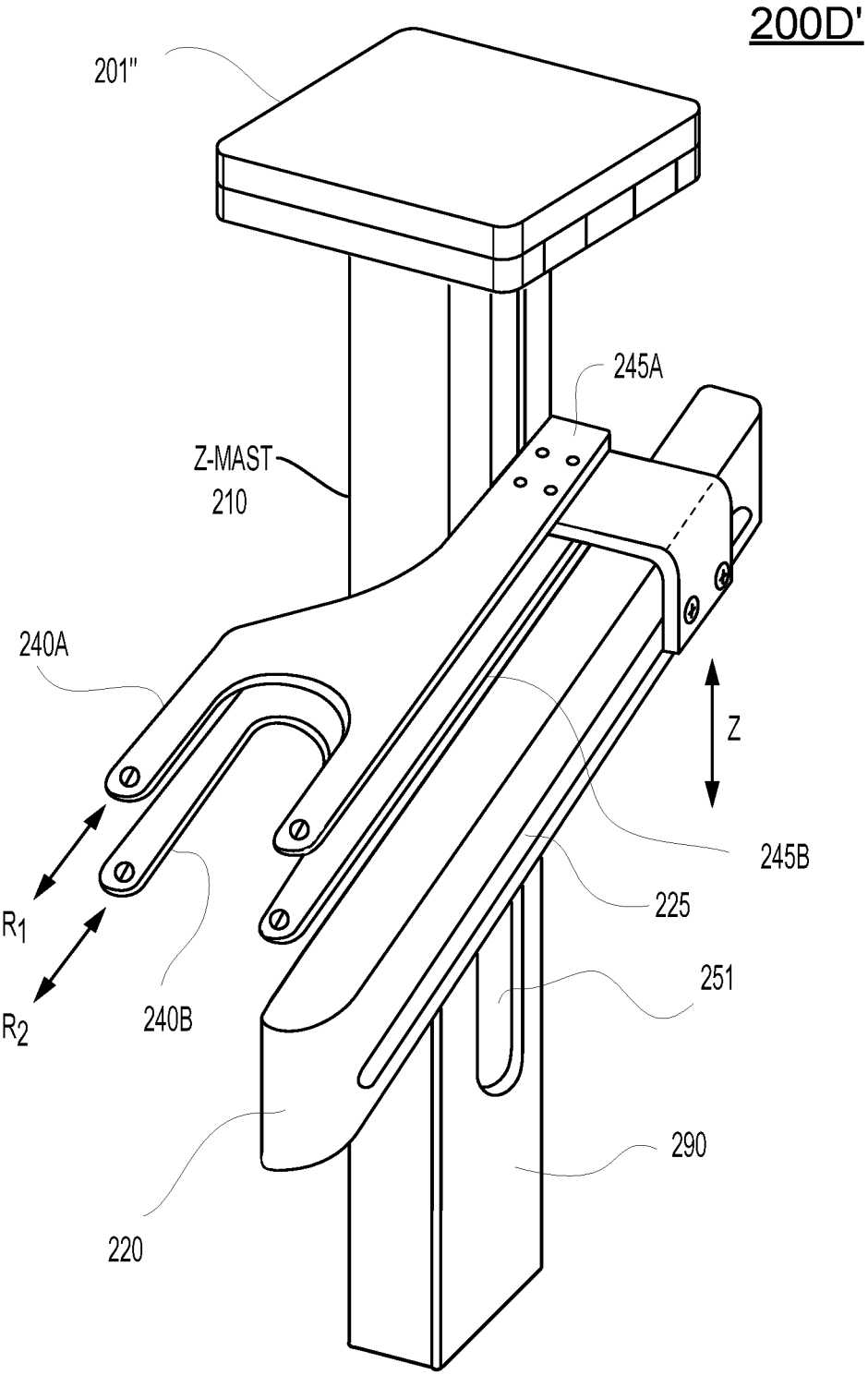
FIG. 2E illustrates a perspective view of an over/under linear axis robotic structure that is configured for rectilinear arm motions, wherein the robotic structure is mounted to a fixed platform such that the robotic structure extends downwards from the platform, in accordance with one embodiment of the present disclosure.

FIG. 2E illustrates a perspective view of an over/under linear axis robotic structure 200E that is configured for rectilinear arm motions, wherein the robotic structure is mounted to a platform 201" such that the robotic structure 200E extends downwards from the platform 201", in accordance with one embodiment of the present disclosure. The robotic structure 200C is similarly configured as the robotic structure 200A of FIGS. 2A-2B, except that the robotic structure 200E is mounted to the platform 201' that is fixed in space, such that the robotic structure 200 is suspended below platform 201' (e.g., configured within an overhead hoist transport system—OHT). As such, the robotic structure 200E is fixed to a particular location within a space. As shown, the robotic structure 200E provides for rectilinear motion without any theta motion (e.g., as provide through a rotatable base), in one embodiment. Other embodiments are well suited to configuring robotic structure 200E to provide theta (θ) motion along a θ axis, one or more Y-motions along one or more corresponding Y-axis, and Z-motion along a Z-axis, as previously described. In addition, in another embodiment, X-motion may optionally be provided through a track system, such as in an overhead transfer system used in some fulfillment centers.

Figure 2F:
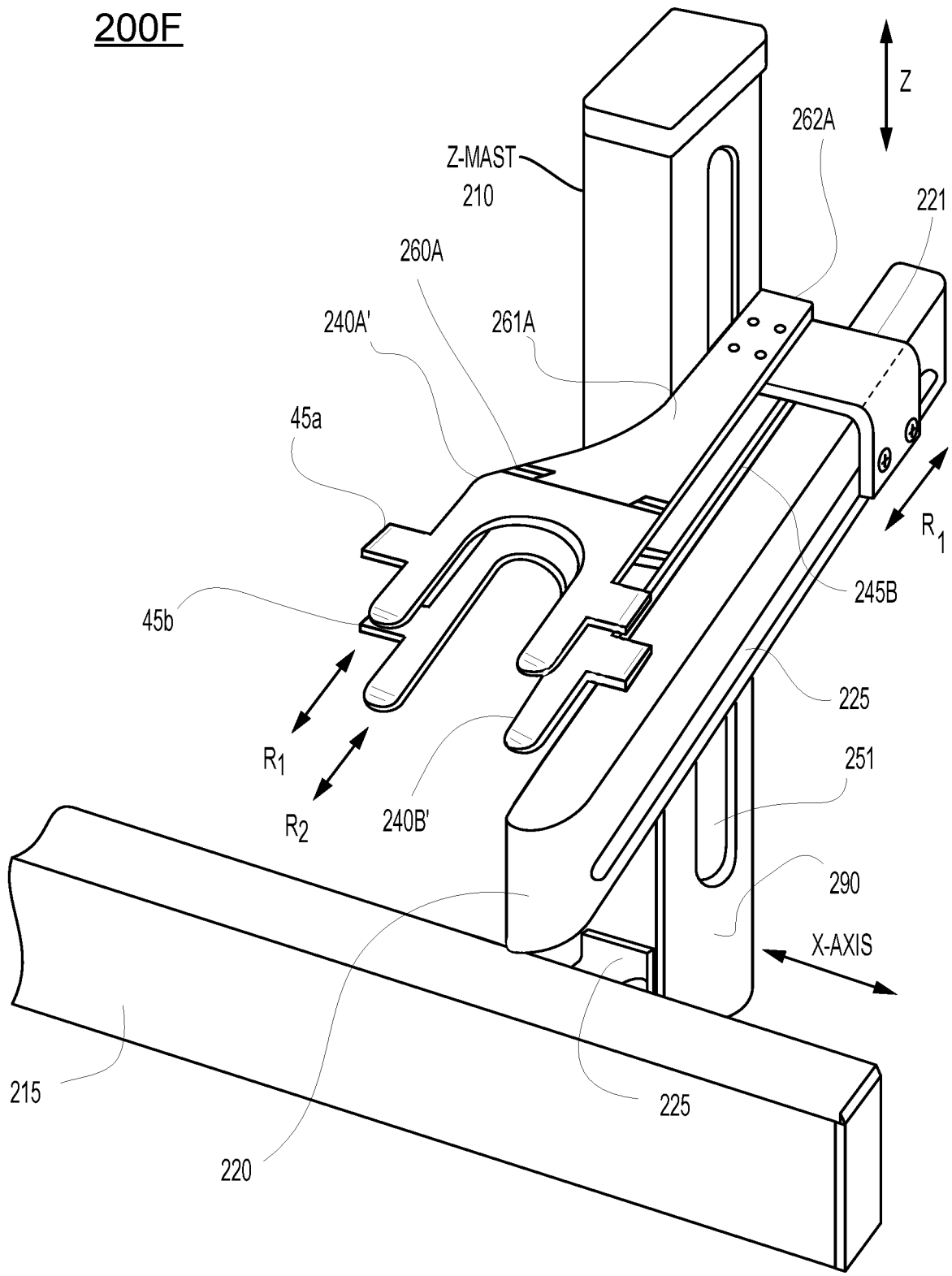
FIG. 2F illustrates a perspective view of the over/under linear axis robotic structure that is configured for rectilinear arm motions, and further illustrates a gripper of a transfer robot that is configured to interface with a carrier mechanism for holding a device or module (e.g., DUT), in accordance with one embodiment of the present disclosure.
Figure 2G:
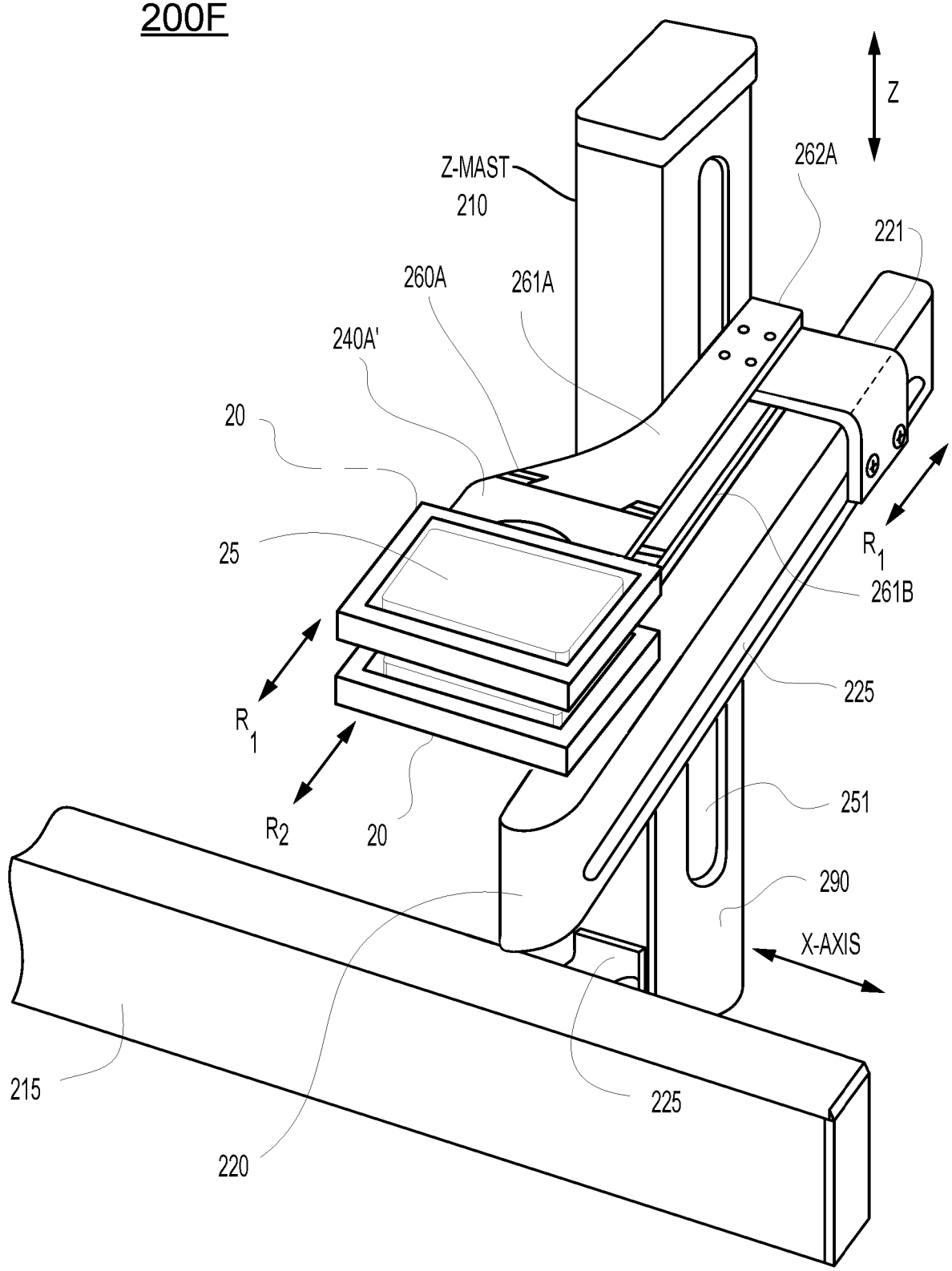
FIG. 2G illustrates a perspective view of the over/under linear axis robotic structure of FIG. 2F that is configured for rectilinear arm motions, and further illustrates a gripper of a transfer robot that is configured to attach to a carrier (e.g., tray) for holding and interfacing with a device (e.g., mobile phone), in accordance with one embodiment of the present disclosure.
Figure 2H:
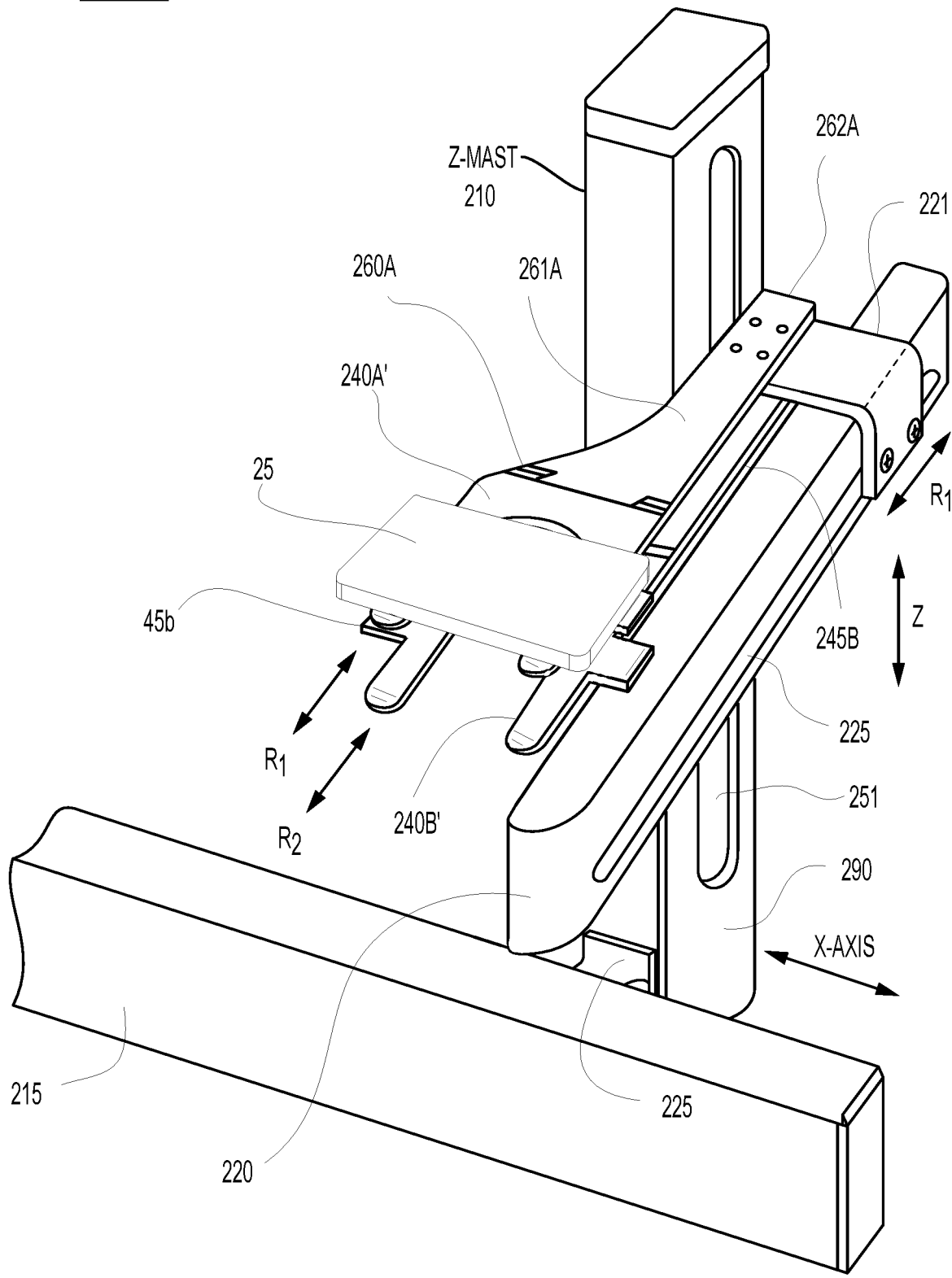
FIG. 2H illustrates a perspective view of the over/under linear axis robotic structure of FIG. 2F that is configured for rectilinear arm motions, and further illustrates a gripper of a transfer robot that is configured to attach directly to a substrate (e.g., mobile phone form factor) for purposes of transfer, in accordance with one embodiment of the present disclosure.

FIGS. 2F-H illustrates perspective views of a robotic structure 200F that is configured for rectilinear arm motions, and further illustrates a gripper of a transfer robot that is configured to interface with a carrier or tray portion or mechanism 20 for holding a device or module (e.g., DUT), in accordance with one embodiment of the present disclosure. In FIG. 2F, the grippers 240A' and 240B' are shown in isolation, whereas in FIG. 2G, the grippers 240A' and 240B' are shown interfacing with a carrier or tray 20.

Specifically, FIG. 2F illustrates a perspective view of the over and under linear axis robotic structure 200F that is configured for rectilinear arm motions, and further illustrates grippers 240A' and 240B' of a transfer robot that are configured as or configured to handle a carrier portion 20 for holding and/or interface with a substrate or module (e.g., DUT), in accordance with one embodiment of the present disclosure. As previously described, the robotic structure 200F provides Y-motion along one or more Y-axis, Z-motion along a Z-axis, and optionally X-motion along an X-axis. In addition, the robotic structure 200F may optionally be configured for theta (θ) motion along a θ-axis. Though not shown in detail, the θ-axis, the one or more Y-axis, Z-axis, and X-axis are known in the art and do not require further disclosure.

In particular, the robotic structure 200F is similar in structure to the robotic structure 200A of FIGS. 2A-2B, except that the grippers 240A' and 240B' are configured to interface with carriers 20 (not shown in FIG. 2F) instead of comprising or interfacing with substrate or wafer handlers. For example, grippers 240A' and 240B' are configured to interface with and/or handle a carrier portion 20, wherein the carrier portion 20 is configured to interface and handle a DUT 25. In addition, the grippers 240A' and 240B' each may be configured to attach and detach the carrier portion 20 so that the corresponding DUT 25 may be transported to another testing location (as previously described), while still held by the carrier portion 20. For example, gripper 240A' may include an interface 45a that is configured to mate with a receiver (not shown) located on the carrier tray 20.

In one embodiment, robotic structure 200F may optionally include a universal interface that is adapted to releasably attach to one or more types of grippers, wherein each gripper is uniquely adapted to interface with a corresponding object. For example, one gripper may be adapted to interface with an end-effector for handling wafer substrates. In another example, another gripper may be adapted to interface with a carrier for holding objects. As shown in FIG. 2F, universal interface 261A may be adapted to attach to the linear drive mechanism 221 through a first end 262A. Universal interface 261A may include a second end 260A that is adapted to releasably attach to one or more types of grippers. That is, universal interface 261A may be controlled to releasably attach to a selectable gripper. As shown, universal interface 261A is releasably attached to gripper 240A'. Though not shown, arm extension R2 may optionally include a universal interface 261B including a second end 260B (hidden) that is releasably attached to gripper 240B'. Further, one or more grippers may be arranged in a holding area, such that the universal interface 261A-261B may attach a selected gripper from the holding area, or may detach an attached gripper from the universal interface 261A-261B and place the detached gripper into the holding area. Sensors and ID tags may be employed for section to determine which gripper to attach to the universal interface.

FIG. 2G illustrates a perspective view of the over and under linear axis robotic structure 200F that is configured for rectilinear arm motions, and further illustrates a gripper of a transfer robot that is configured to attach to a carrier (e.g., tray) portion 20 for holding and interfacing with a device (e.g., mobile phone), in accordance with one embodiment of the present disclosure. In particular, grippers 240A' and 240B' are shown interfacing with corresponding carrier portions 20. For example, gripper 240A' is interfacing with a carrier portion 20, wherein the carrier portion 20 is handling a DUT 25. Carrier portions 20 may be configured to hold one or more DUTs, though one DUT is shown. As previously described, grippers 240A' may be configured to attach and detach the carrier portion 20. It is understood that in embodiments grippers (e.g., gripper 240A' and 240B') may be configured to be smaller or larger or of similar size than the object (e.g., carrier 20) being handled. For example, different grippers may be smaller than the substrate footprint, or extend beyond the substrate footprint, or may be of similar size with the substrate footprint when supporting substrate transfers.

FIG. 2H illustrates a perspective view of the over and under linear axis robotic structure 200F that is configured for rectilinear arm motions, and further illustrates a gripper of a transfer robot that is configured to attach directly to a substrate (e.g., mobile phone form factor) for purposes of transfer, in accordance with one embodiment of the present disclosure. In particular, grippers 240A' and 240B' of a transfer robot 200F are configured to attach directly to or interface with a substrate 25 (e.g., mobile phone form factor) for purposes of transfer, in accordance with one embodiment of the present disclosure. In particular, gripper 240A' is shown directly interfacing with substrate 25. As shown, the gripper 240A' is configured to removably attach to substrate 25. For example, ridges or other holding means on the gripper 240A' may be positioned to fixedly hold substrate 25 in place during transport. In addition, the ridges or other holding means are configured to release the substrate 25 upon demand (e.g., application of proper lifting force). It is understood that in embodiments grippers (e.g., gripper 240A' and 240B') may be configured to be smaller or larger or of similar size than the object (e.g., substrate 25) being handled. For example, different grippers may be smaller than the substrate footprint, or extend beyond the substrate footprint, or may be of similar size with the substrate footprint when supporting substrate transfers.

Figure 2I:
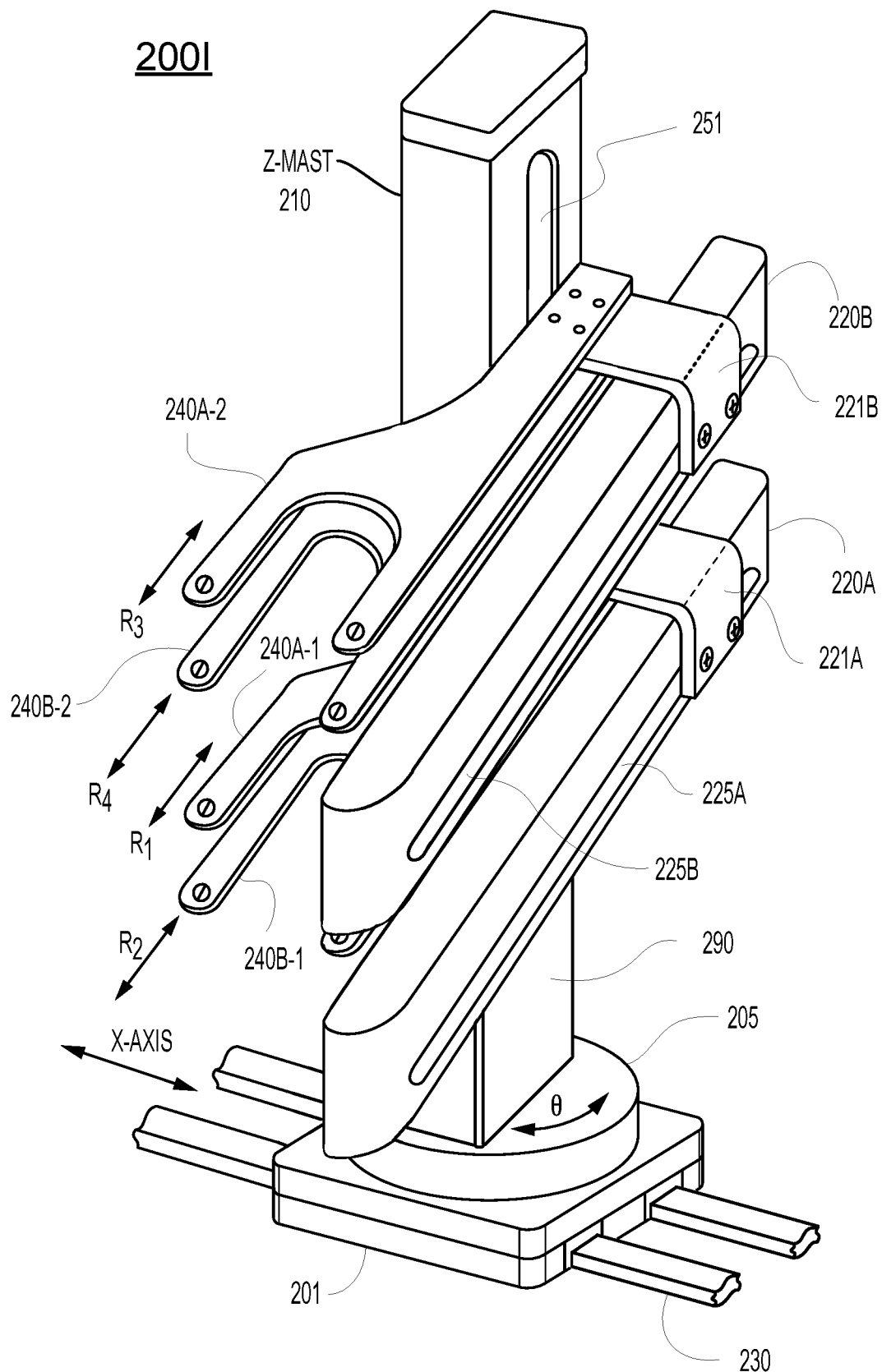
FIG. 2I illustrates a perspective view of an over/under linear axis robotic structure that is configured for rectilinear arm motions, wherein the number of arms and/or grippers may be scalable in the vertical direction while maintaining the footprint of the robotic structure, in accordance with one embodiment of the present disclosure.

FIG. 2I illustrates a perspective view of an over/under linear axis robotic structure 200I that is configured for rectilinear arm motions, wherein the number of arms and/or grippers may be scalable in the vertical direction (e.g., Z-direction) while maintaining the footprint of the robotic structure, in accordance with one embodiment of the present disclosure. As previously described, the robotic structure 200I provides Y-motion along one or more Y-axis, Z-motion along a Z-axis, optionally X-motion along an X-axis, and optionally theta (θ) motion along a θ-axis. Though not shown in detail, the θ-axis, the one or more Y-axis, Z-axis, and X-axis are known in the art and do not require further disclosure.

The robotic structure 200A also includes a vertically oriented Z-tower 21, as previously described. A vertical drive (not shown) is configured within the Z-tower 210. A vertical drive mechanism is adapted to integrate with the vertical drive for linear movement along the Z-tower 210 along a Z-axis. As shown, optionally, Z-tower 210 is fixedly attached to rotatable base 205 that provides theta (θ) motion along a θ-axis. The rotatable base 205 is rotatably attached to platform 201. A track system 230 is optionally interfaced with the platform 201.

The robotic structure 200I includes one or more section arms 220, each of which is adapted to attach to the vertical drive mechanism. As shown, robotic structure 200I includes section arm 220A and 220B. A general discussion of section arm 220A is provided and is representative of all section arms moveably attached to the vertical drive mechanism, and follows previous discussions of section arms and corresponding arm extensions. In particular, section arm 220A has a horizontal orientation, such that linear movement along the section arm is performed in a horizontal plane, and more particularly along one or more defined lines within the horizontal plane. In addition, because the section arm 220 is adaptively attached to the vertical drive mechanism, the section arm 220 is configured for linear movement along the Z-tower based on movement of the vertical drive mechanism.

In addition, the robotic structure 200I includes an over and under arm extension configuration. Each arm extension is configured for linear movement along a corresponding Y-axis that is aligned along the section arm 220A. For example, section arm 220A includes arm extension R1 and R2. Each arm extension includes a linear drive, linear drive mechanism, and gripper configuration, as previously described. For example, arm extension R1 includes a first linear drive (not shown) configured within the section arm 220A, and corresponding first linear drive mechanism 221A adapted to integrate with the first linear drive through slot 225A for linear movement along the section arm 220A. Further, gripper 240A-1 is adapted to attach to the linear drive mechanism 221A, and is further adapted for linear movement along the corresponding Y-axis (e.g., defined through the center line Y of the end of the gripper 240A-1 holding an object) with movement of the linear drive mechanism 221A. Also, arm extension R2 includes a second linear drive (not shown) configured within the section arm 220A, and corresponding second linear drive mechanism (not shown) adapted to integrate with the second linear drive through a corresponding slot (not shown) for linear movement along the section arm 220A. Further, gripper 240B-1 is adapted to attach to the corresponding linear drive mechanism, and is further adapted for linear movement along the corresponding Y-axis (e.g., defined through the center line Y of the end of the gripper 240B-1 holding an object) with movement of the corresponding linear drive mechanism.

Section arm 220B and its respective arm extensions are similarly configured as section arm 220A, such as each having a horizontal orientation. As previously introduced, section arm 220B is adapted to attach to the vertical drive mechanism in the Z-tower 210, and is configured for linear movement along the Z-tower with movement of the vertical drive mechanism. As shown, arm extension R3 includes a linear drive (not shown) configured within the section arm 220B, and corresponding linear drive mechanism 221B adapted to integrate with the linear drive through slot 225B for linear movement along the section arm 220B. Further, gripper 240A-2 is adapted to attach to the linear drive mechanism 221B, and is further adapted for linear movement along the corresponding Y-axis (e.g., defined through the center line Y of the end of the gripper 240A-2 holding an object) with movement of the linear drive mechanism 221B. Also, arm extension R4 includes a linear drive (not shown) configured within the section arm 220B, and corresponding linear drive mechanism (not shown) adapted to integrate with the linear drive through a corresponding slot (not shown) for linear movement along the section arm 220B. Further, gripper 240B-2 is adapted to attach to the corresponding linear drive mechanism, and is further adapted for linear movement along the corresponding Y-axis (e.g., defined through the center line Y of the end of the gripper 240B-2 holding an object) with movement of the corresponding linear drive mechanism.

One or more control mechanisms may be implemented to provide independent control of each of the arm extensions, such that the movement of arm extension R1 is separately controlled from the movement of arm extensions R2, R3, and R4. That is, independent control of R1, R2, R3, and R4 is provided.

As shown, the over and under configuration of section arm 220B is similar to that of section arm 220A, in one embodiment. That is, in section arm 220A, arm extension R1 is above arm extension R2, and in section arm 220B, arm extension R3 is above arm extension R4. However, in both section arms 220A and 220B, the arm extensions are above the body of the respective section arms. In another embodiment, the over and under configuration of section arm 220B is reversed to bring all of the section arms closer together. That is, the arm extensions R3 and R4 are configured below the body of section arm 220B.

Figure 3A:
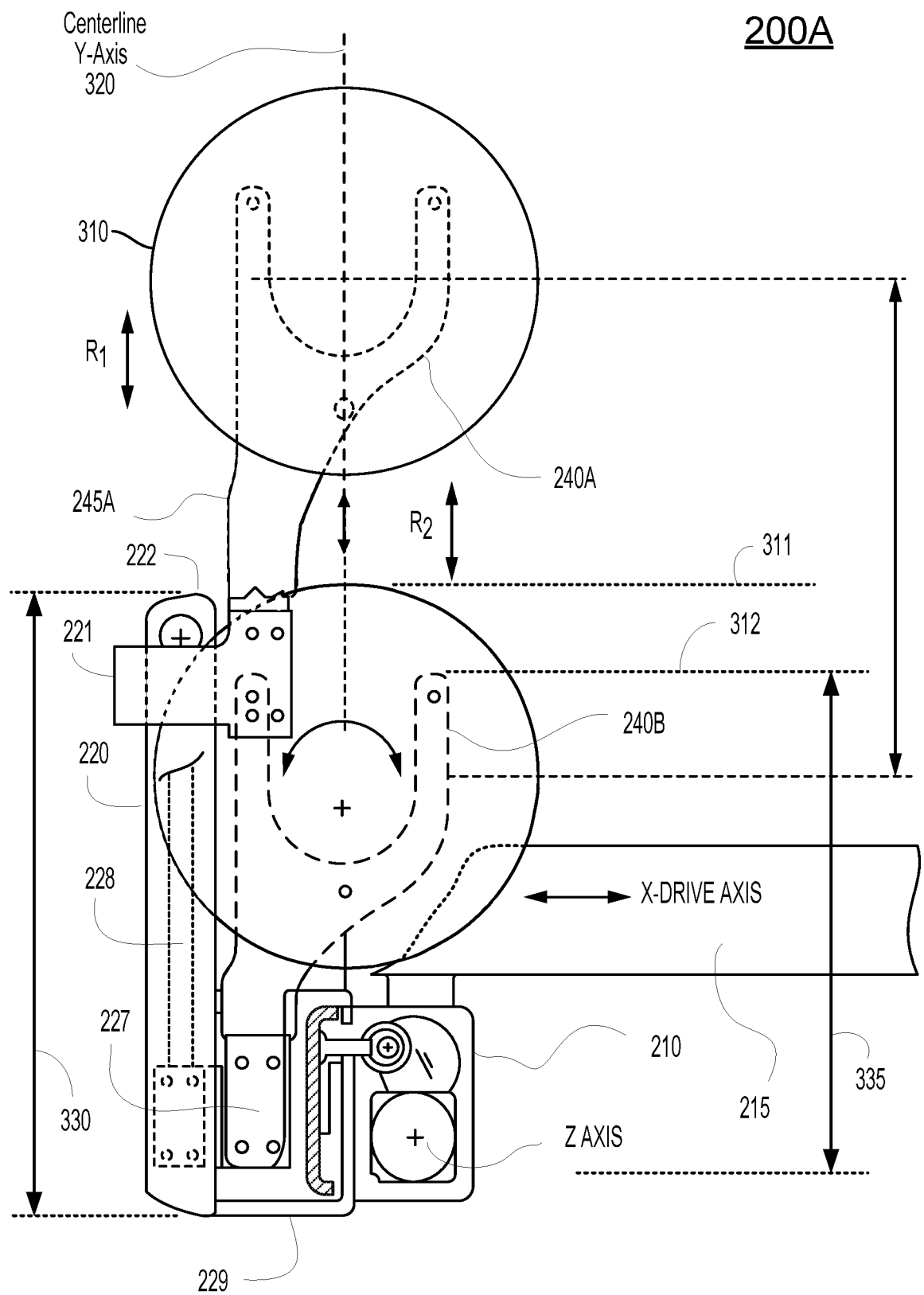
FIG. 3A is a top-view of an over/under linear axis robotic structure that is configured for rectilinear arm motions, wherein grippers of the robotic structure are configured for wafer handling, and wherein the arm support structure is slightly longer than the length of the gripper and bracket in combination, in accordance with one embodiment of the present disclosure.

FIG. 3A is a top-view of an over/under linear axis robotic structure 200A, previously introduced in FIGS. 2A-2B, that is configured for rectilinear arm motions, in accordance with one embodiment of the present disclosure. In particular, the rectilinear arm motions include the extension and retraction of the grippers 240A and 240B along with movement of corresponding arm extensions in corresponding Y-directions. The robotic structure 200A may provide one or more Y-motions about one or more Y-axis for each corresponding arm extension, and X-motion along an X-axis. Optionally, the robotic structure 200A may provide theta (θ) motion about a θ-axis (not shown). The one or more grippers 240A and 240B are configured for substrate or wafer handling, though robotic structures may include any type of gripper configured for handling various types of modules and/or devices. As shown, grippers 240A and 240B are configured for wafer 310 handling.

As previously described robotic structure 200A a vertically oriented Z-tower 210. Z-tower may be configured to include a vertical drive, Z-linear guides (e.g., ball slide assemblies), Z-motors, ball screw assemblies, etc. configured for Z-motion along a Z-axis. Section arm 220 is adapted to attach to the Z-tower 210 through the vertical drive mechanism 229, such that section arm 220 is adapted for vertical movement with the vertical drive along the Z-axis.

The robotic structure 200A includes arm extensions including one or more grippers 240A and 240B adapted for linear or rectilinear movement along arm section 220. Each arm extension includes a linear drive, linear drive mechanism, and gripper configuration, as previously described. For example, a first arm extension R1 includes a linear drive (not shown) configured within the section arm 220, linear drive mechanism 221 adapted to interface with the linear drive, and gripper 240A. In addition, a second arm extension R2 includes a linear drive 228, linear drive mechanism 227 that is adapted to interface with the linear drive 228 (e.g., through slot 226), and gripper 240B. For example, linear drive mechanism 227 may be adapted to attach to carriage 229 of a linear ball slide assembly of the linear drive 228, such that movement of the carriage 229 translates to movement gripper 240B through movement of the linear drive mechanism 227.

Each of the arm extensions R1 and R2 are adapted to move along a corresponding Y-axis. Because they are aligned, such as through grippers 240A and 240B, the movements of arm extensions R1 and R2 are aligned with the centerline or Y-axis 320 that runs through the center of the grippers 240A and 240B. In particular, the Y-motion of arm extension R1 and gripper 240A, and the Y-motion of arm extension R2 and gripper 240B are both aligned with centerline 320. However, the Y-motion of arm extension R1 is in a different horizontal plane than the Y-motion of m extension R2. That is, with the over and under configuration of the arm extensions of the robotic structure 220A, the Y-motion of arm extension R1 and gripper 240A is above the Y-motion of arm extension R2 and gripper 240B. As such, gripper 240A is over gripper 240B. In other embodiments, the Y-motions of the arm extensions R1 and R2 may not be aligned (e.g., each aligned with the centerline 320).

As shown, the length 330 of section arm 220 is slightly longer than the length 335 of the gripper and bracket in combination, in accordance with one embodiment of the present disclosure. In that manner, a front edge of a substrate (e.g., wafer) or a DUT being handled by a corresponding gripper would extend just beyond the end of the section arm 220 when fully retracted. These dimensions may prevent interference between the arm section 220 and the area in which substrate or DUT transfer takes place. For example, the length 330 of section arm 220 is slightly longer than the length 335 of the combination of the gripper 240B and a corresponding linear drive mechanism 227 (e.g., bracket), such that when the gripper 240B is fully retracted, its leading edge 312 is within the dimensions of the length 330 of the section arm 220. The length of section arm 330 is variable in different embodiments and can be even longer or shorter than that shown in FIG. 3A.

In FIG. 3A and in other figures throughout the specification, the substrate 310 is shown having a size (e.g., diameter) that is larger than the footprint of the gripper 240A. That is, the width of the gripper 240A (e.g., dimension between the extensions of the end-effector) may be smaller than the diameter of the substrate 310. However, it is understood that the size of substrate 310 or of any other object that is being handled by gripper 240A (e.g., substrate, DUT, device, etc.) is variable. As such, the object, being handled by the corresponding gripper, may be smaller or larger than or of equal size as the corresponding gripper. That is, different grippers may be configured to be smaller or larger or of similar size than the object being handled. For example, different grippers may be smaller than the substrate footprint, or extend beyond the substrate footprint, or may be of similar size with the substrate footprint when supporting substrate transfers.

Figure 3B:
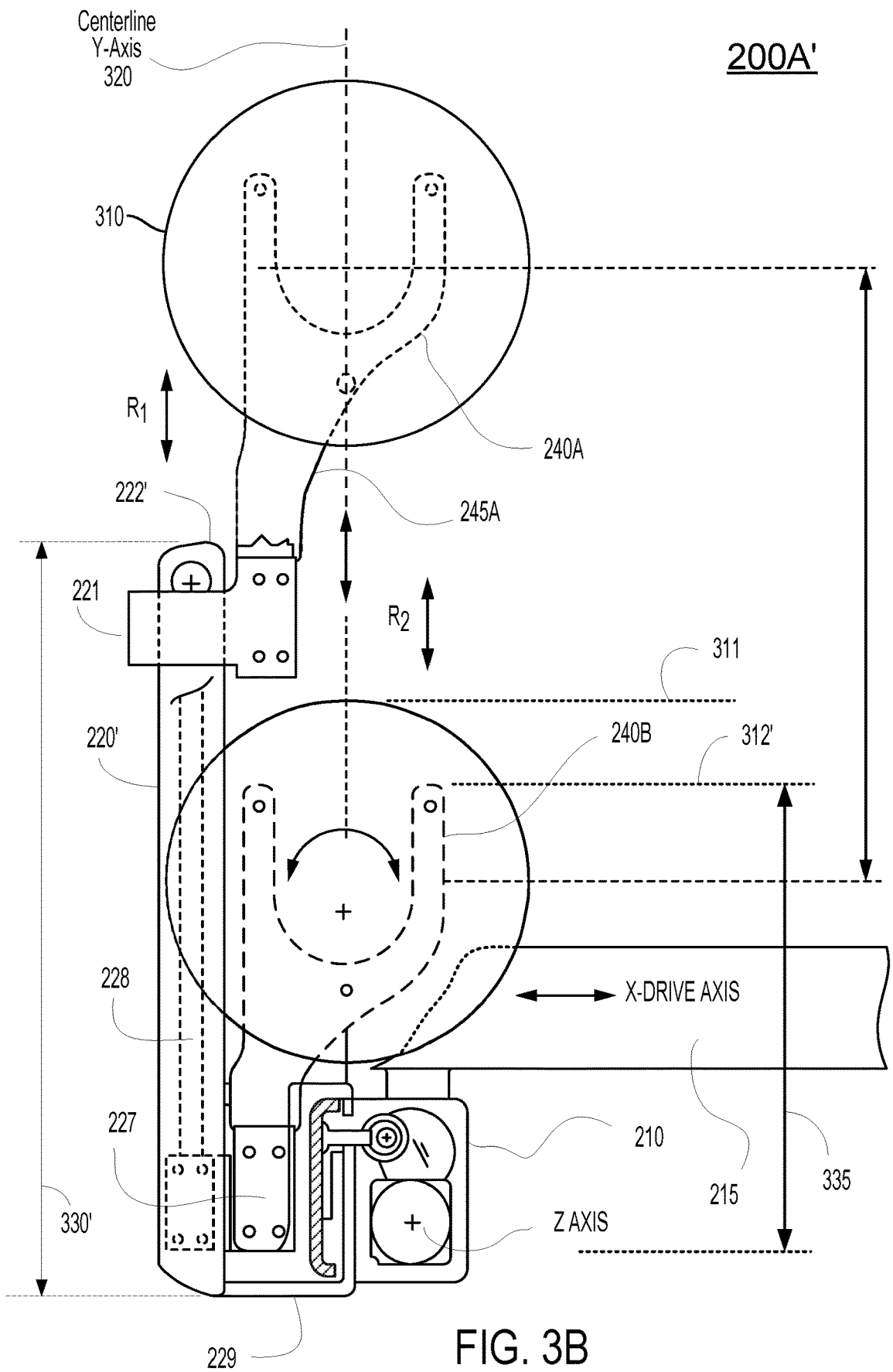
FIG. 3B is a top-view of an over/under linear axis robotic structure that is configured for rectilinear arm motions, wherein grippers of the robotic structure are configured for wafer handling, and wherein the arm support structure is considerably longer than the length of the gripper and bracket in combination, in accordance with one embodiment of the present disclosure.

FIG. 3B is a top-view of an over and under linear axis robotic structure 200A' that is configured for rectilinear arm motions, wherein grippers of the robotic structure are configured for substrate handling, and wherein the arm support structure is considerably longer than the length of the gripper and bracket in combination, in accordance with one embodiment of the present disclosure. Robotic structure 200A' is similarly configured as robotic structure 200A of FIGS. 2A-2B and 3A, except that the length 330' of section arm 220' is longer than the length 335 of the gripper and bracket in combination, in accordance with one embodiment of the present disclosure. As previously described, the length of section arm 220' is variable in embodiments, and as shown in FIG. 3B, the length 330' can be longer than that shown in FIG. 3A. In that manner, the end 222' of the section arm 220' extends beyond a front edge 311 of a substrate 310

(e.g., wafer) or a DUT being handled by a corresponding gripper (e.g., gripper 240B) when fully retracted, whereas in FIG. 3A, the end 222 of section arm 220 does not extend beyond the front edge 311 of substrate 310. For example, in FIG. 3B the length 330' of section arm 220' is longer than the length 335 of the combination of the gripper 240B and a corresponding linear drive mechanism 227 (e.g., bracket), such that when the gripper 240B is fully retracted, its leading edge 312 is within the dimensions of the length 330' of the section arm 220.

Figure 3C:
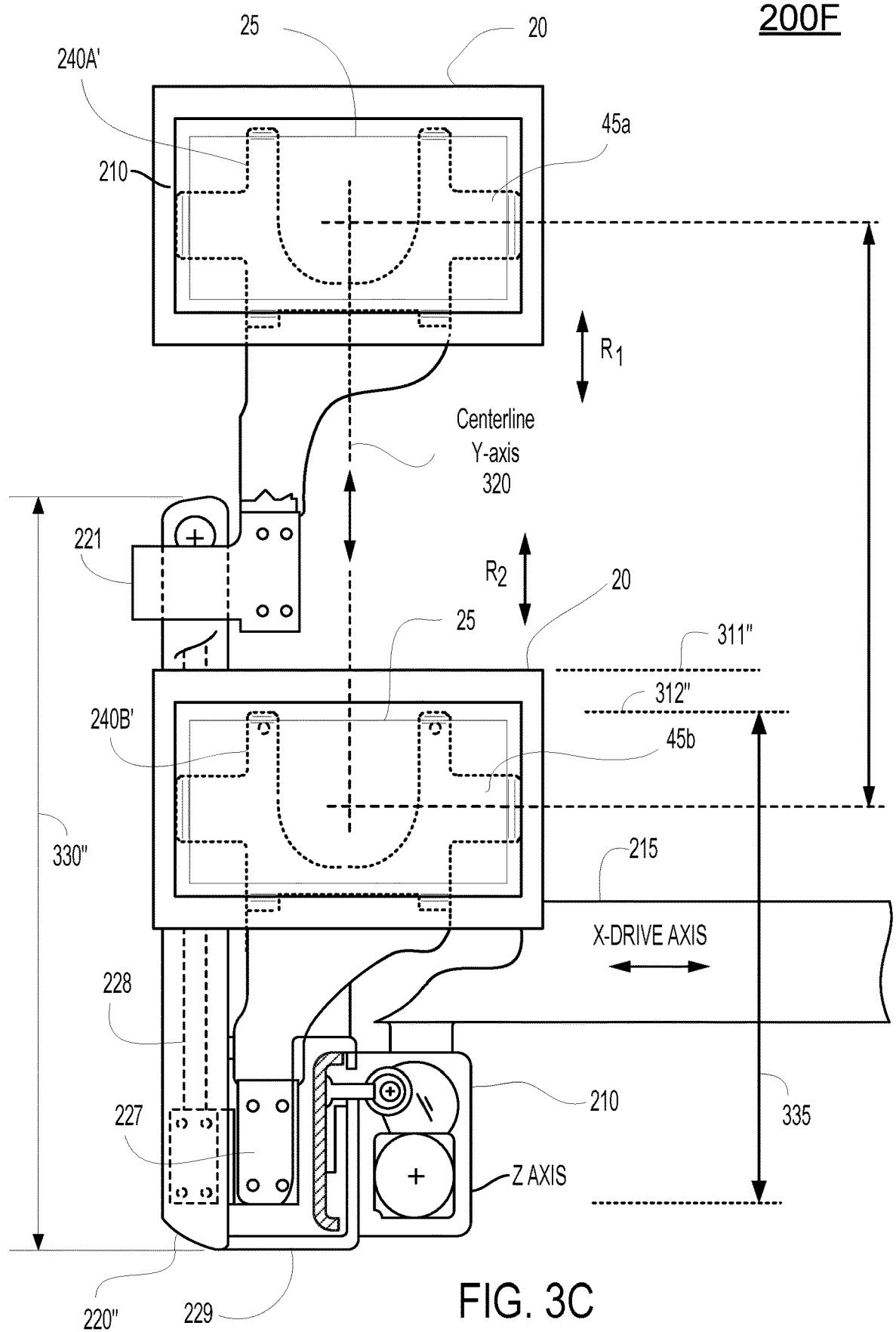
FIG. 3C is a top-view of an over/under linear axis robotic structure that is configured for rectilinear arm motions, wherein grippers of the robotic structure are configured for carrying devices, such as a device under test, in accordance with one embodiment of the present disclosure.

FIG. 3C is a top-view of an over and under linear axis robotic structure 200F (previously introduced in FIG. 2F) that is configured for rectilinear arm motions, wherein grippers of the robotic structure are configured for carrying devices, such as a device under test, in accordance with one embodiment of the present disclosure. Specifically, grippers 240A' and 240B' of the robotic structure 200F are configured for interfacing with carrier portions 20 that are each configured for handling substrates, modules, such as a DUT, in accordance with one embodiment of the present disclosure. As previously described in relation to FIG. 2F, robotic structure 200F is similarly configured as the robotic structure 200A of FIGS. 2A-2B, except that the grippers 240A' and 240B' are configured as DUT handlers instead of wafer handlers. As shown, gripper 240A' includes an interface 45a that is configured to mate with a receiver (not shown) located on the carrier portion 20. Also, gripper 240B' includes interface 45b that is configured to mate with a receiver (not shown) located on the carrier portion 20. For example, carrier portions 20 are configured to interface with and handle (e.g., support) a DUT 25, such as a mobile phone. In addition, the grippers 240A' and 240B' each may be configured to attach and detach the carrier portion 20 so that the corresponding DUT may be transported to another testing location (as previously described), while still held by the test carrier 20.

In addition, robotic structure 200F is similarly configured as robotic structure 200A' of FIG. 3A in that the length 330" of section arm 220" is longer than the length 335 of the gripper and bracket in combination, in accordance with one embodiment of the present disclosure. In that manner, the end 222" of the section arm 220" extends beyond a front edge 311" of a carrier portion 20 or DUT being handled by a corresponding gripper (e.g., gripper 240B') when fully retracted. That is, length 330" of section arm 220" is longer than the length 335 of the combination of the gripper 240B' and a corresponding linear drive mechanism 227 (e.g., bracket), such that when the gripper 240B' is fully retracted, its leading edge 312" is within the dimensions of the length 330" of the section arm 220".

Figure 3D:
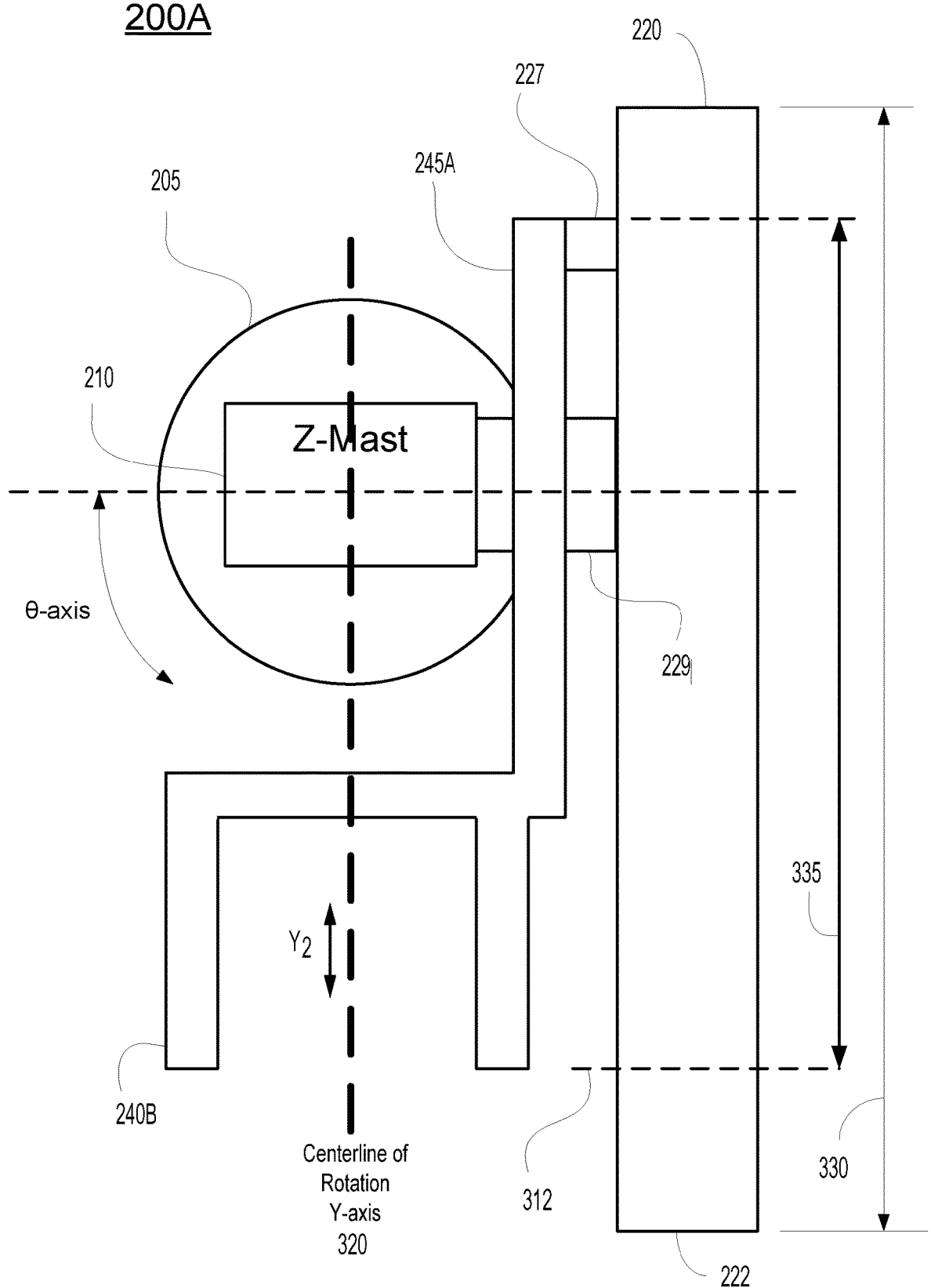
FIG. 3D is a top view of an over/under linear axis robotic structure that is configured for rectilinear arm motions, wherein grippers of the robotic structure are configured for carrying objects, and wherein the center line of the movement of the gripper and of the object is coincident with the robot rotation, in accordance with one embodiment of the present disclosure.

FIG. 3D is a top view of an over and under linear axis robotic structure 200A that is configured for rectilinear arm motions, wherein grippers of the robotic structure 200A are configured for carrying objects, and wherein the center line of the movement of the gripper and of the object is coincident with the robot rotation, in accordance with one embodiment of the present disclosure.

In particular, robotic structure 200A includes a platform 201 (not shown) and a rotatable base 205 that is rotatably mounted to the platform 201. The rotatable base 205 is adapted to rotate in theta about the platform. In that manner, the robotic structure 200A provides theta (θ) motion abut a θ-axis and Z-motion about a Z-axis. Specifically, a vertically oriented Z-tower 210 is fixedly attached to the rotatable base 205. As such, the Z-tower 210 rotates with the rotatable base 205 about the θ-axis. In that manner, the robotic structure 200A can be oriented in any theta-direction for purposes of retracting and extending out the gripper 240B of arm extension R2, such as to pick-up and/or drop-off objects, or for positioning when moving the robotic structure 200A along a track system (not shown). Arm extension R1 is not shown in FIG. 3D. Z-tower 210 may be configured to include a vertical drive, Z-linear guides (e.g., ball slide assemblies), $Z_1$ and $Z_2$ motors, ball screw assemblies, and theta bearings.

Also, the length 330 of section arm 220 is slightly longer than the length 335 of the gripper 240B and linear drive mechanism 227 (e.g., bracket) in combination, in accordance with one embodiment of the present disclosure. In that manner, a front edge (not shown) of a substrate (e.g., wafer) or a DUT being handled by a corresponding gripper 240B would extend just beyond the end 222 of the section arm 220 when fully retracted. Similarly, the length 330 of section arm 220 is longer than the length 335 of the combination of the gripper 240B and a corresponding linear drive mechanism 227 (e.g., bracket), such that when the gripper 240B is fully retracted, its leading edge 312 does not extend beyond the end 222 of the section arm 220.

Figure 4A:
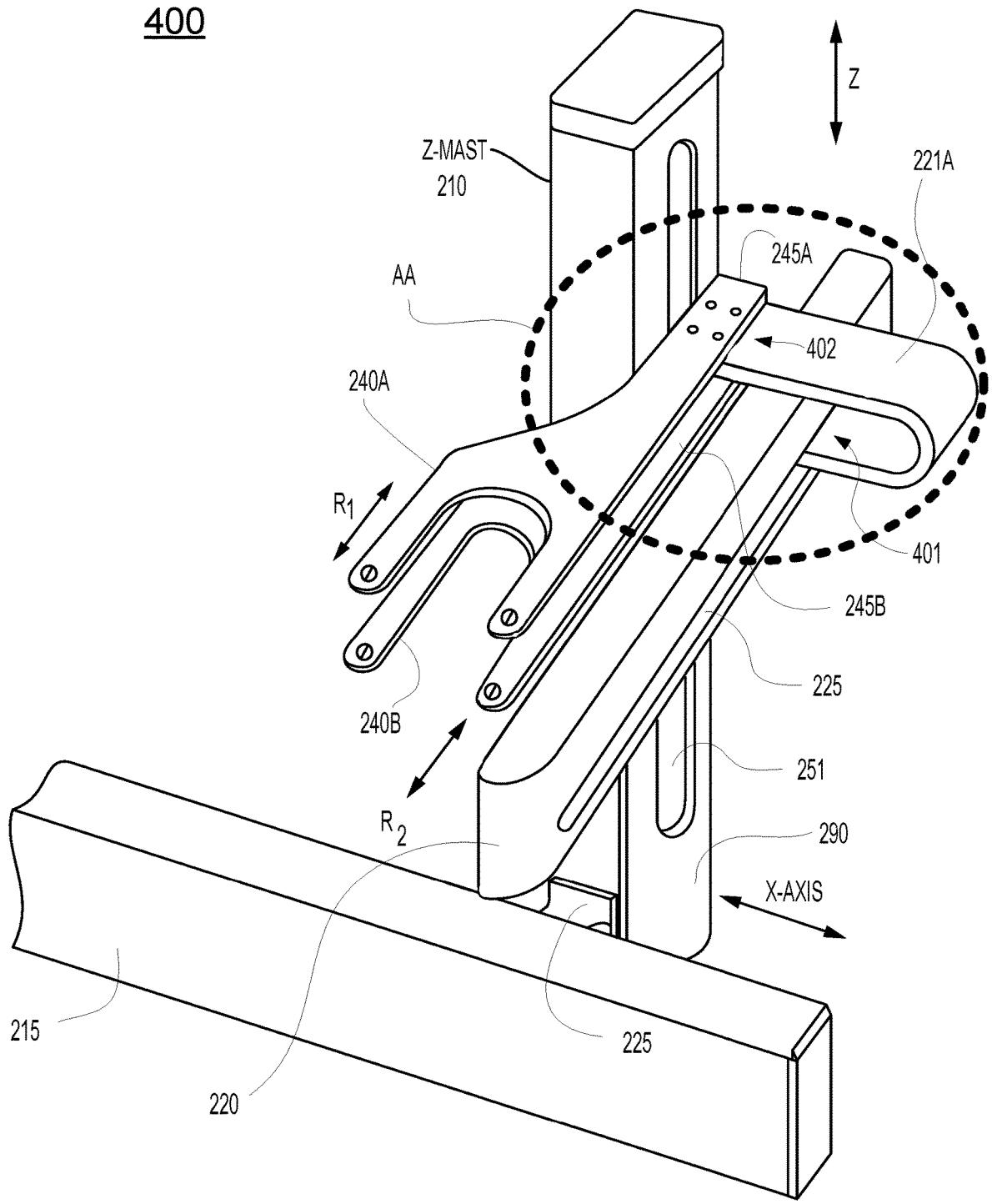
FIG. 4A illustrates a perspective view of an over/under linear axis robotic structure that is configured for rectilinear arm motions, wherein the robotic structure may be mounted to a track system, and wherein a linear drive mechanism (e.g., outrigger extension bracket) adapted to attach to a first gripper includes an outrigger section configured for increasing a clearance space such that that the linear drive mechanism does not interfere with an object placed on a second gripper, in accordance with one embodiment of the present disclosure.

FIG. 4A illustrates a perspective view of an over and under linear axis robotic structure 400 that is configured for rectilinear arm motions, and includes an outrigger extension bracket 221A configured for increasing a clearance space such that that the linear drive mechanism does not interfere with an object placed on a second gripper, in accordance with one embodiment of the present disclosure. The rectilinear arm motions include the extension and retraction of the grippers 240A and 240B along with movement of corresponding arm extensions in corresponding Y-directions. The robotic structure 400 is similarly configured as the robotic structure 200A of FIGS. 2A-2B, except that the linear drive mechanism 221A includes an extension bracket configured with a first end 401 to integrate with and/or adaptive attach to the first linear drive through slot 225, and a second end 402 adapted to attach to the end 245A of gripper 240A.

As shown, the linear drive of the arm extension R1 is configured below the linear drive of the arm extension R2. That is, the linear drive of arm extension R2 is above the linear drive of the arm extension R1 in the section arm 220, such that the gripper 240B is below the gripper 240A.

More particularly, the outrigger extension bracket 221A is configured with an outrigger section that is adapted to increase a clearance space horizontally located above the gripper 240B of the arm extension R2, as highlighted in dotted circle AA. In that manner, the outrigger extension bracket 221A does not interfere with a substrate that is placed on the gripper 240 that is of sufficient size and dimension to occupy the clearance space, as is further shown in FIG. 4B, described below.

Figure 4B:
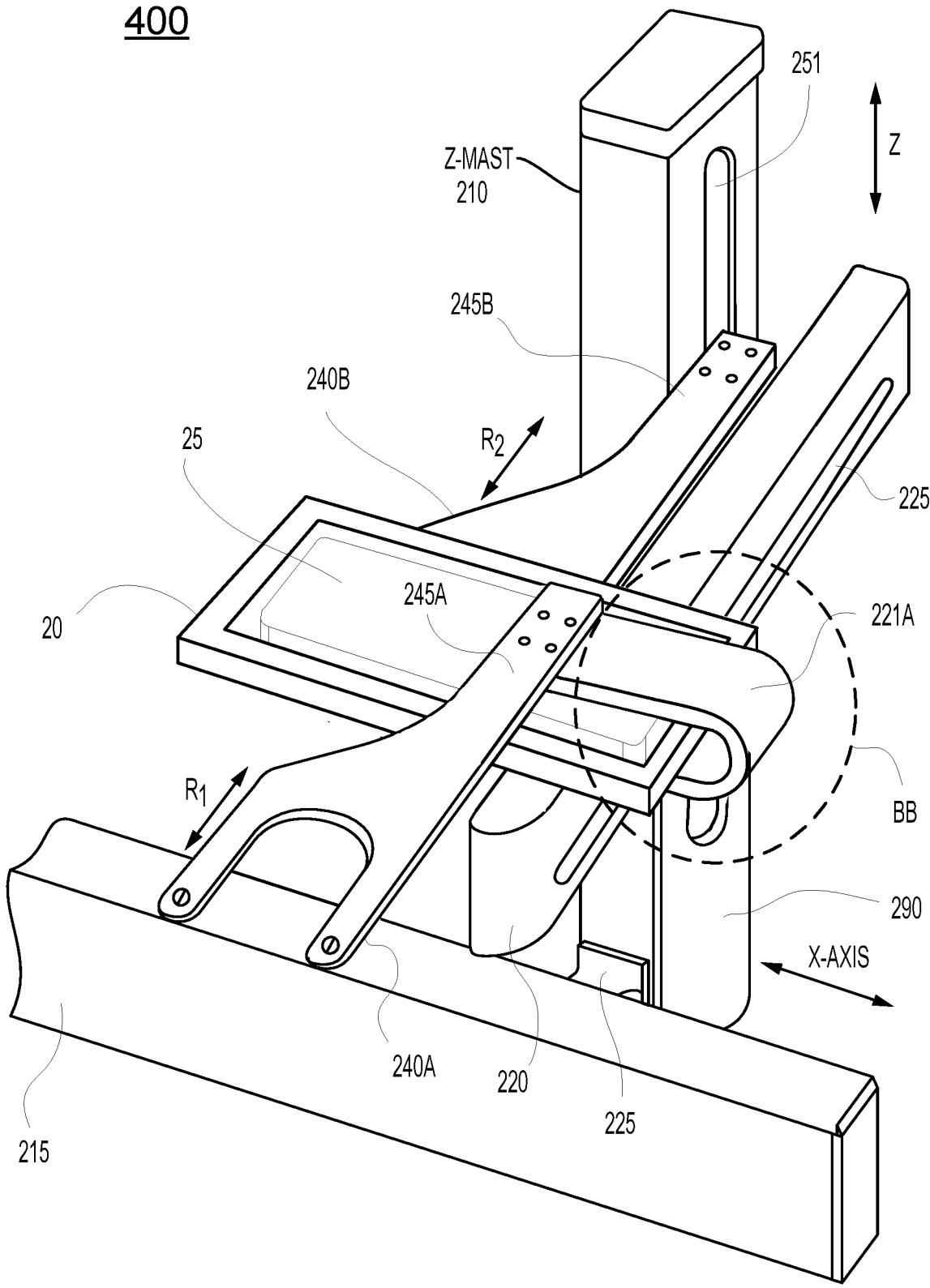
FIG. 4B illustrates a perspective view of the over/under linear axis robotic structure of FIG. 4A that is configured for rectilinear arm motions showing the movement of the first gripper, such that the linear drive mechanism does not interfere with an object placed on a second gripper, in accordance with one embodiment of the present disclosure.

FIG. 4B illustrates a perspective view of the over and under linear axis robotic structure 400 introduced in FIG. 4A that is configured for rectilinear arm motions, in accordance with one embodiment of the present disclosure. The robotic structure 400 in FIG. 4B illustrates the linear movement of the gripper 240A, such that the outrigger extension bracket 221A (i.e., the linear drive mechanism) does not interfere with the carrier portion 20 and substrate 25 that are placed on and being handled by the gripper 240B, in accordance with one embodiment of the present disclosure, as highlighted in dotted circle BB. That is, as arm extension R1 moves to a fully extended position, the outrigger extension bracket 221A of arm extension R1 is of sufficient dimension to clear the carrier portion 20 handled by gripper 240B of arm extension R2. As shown, arm extension R2 is in a fully retracted position.

FIGS. 5A-5D are illustrations of perspective views of the over and under linear axis robotic structure 200A' that is configured for rectilinear arm motions, in accordance with embodiments of the present disclosure. Optionally, the robotic structure 200A' of FIGS. 5A-4D may support a track system integration, as previously described. The perspective views of FIGS. 5A-5D are taken from a first vantage point in space having an unobstructed view of the back side 291 of the robotic structure 200A'. In the over and under configuration, the gripper 240A for arm extensions R1 is above the gripper 240B for arm extension R2, though their orientations may be reversed.

In addition, as previously discussed in FIG. 3B, the length 330' of section arm 220' is longer than the length 335 of the corresponding gripper and linear drive mechanism in combination, in accordance with one embodiment of the present disclosure. For example, the length of section arm 220' is longer than the length of the gripper 240A and linear drive mechanism 221 in combination. Also, the length of section arm 220' is longer than the length of the gripper 240B and linear drive mechanism 227 in combination.

More particularly, FIGS. 5A-5D show varying positions of the arm extensions R1 and R2 of the robotic structure 200A' including full extension and full retraction. In FIGS. 5A-5D, the arm extensions R1 and R2 are shown extending and retracting for purposes of extracting, transporting, and placing substrates, modules, DUTs throughout testing stations of a testing system, during testing and/or assembly processes. In some embodiments, full retraction of at least one of the arm extensions R1 and R2 is possible, wherein a corresponding gripper(s) (e.g., end-effector) is configured to allow for full retraction. FIGS. 5A-5D are purely for illustration purposes, as many different configurations for arm extensions R1 and R2 of the robotic structure 200A' not shown are supported. For example, though not shown, the arm extensions R1 and R2 may each be placed in various extension, such as half or quarter extension. In some embodiments, full extension of at least one of the arm extensions R1 and R2 is possible, wherein a corresponding gripper(s) (e.g., end-effector) is configured to allow for full extension (e.g., to pick up or drop off objects). Further, though not shown in FIGS. 5A-5D, arm extensions R1 and R2 may be vertically moved along the Z-axis, wherein each of the arm extensions R1 and R2 have additional rectilinear arm motions, as previously described.

The robotic structures of FIGS. 5A-5D and throughout this specification are configured for handling various objects and/or devices, in accordance with embodiments of the present disclosure. For instance, in some embodiments, robotic structures 200A' of FIGS. 5A-5D are configured for handling wafers and/or substrates 310, wherein the robotic structure includes grippers configured with and/or interfacing with end effectors. Other embodiments disclose robotic structures (e.g., 200F) that are configured for handling devices, modules, and/or DUTs, wherein the robotic structure includes grippers configured with and/or interfacing with carrier portions (e.g., carriers and/or trays). As previously described, other embodiments disclose the use of other types of grippers configured for handling any of a variety of objects, carriers, trays, DUTs, etc.

Figure 5A:
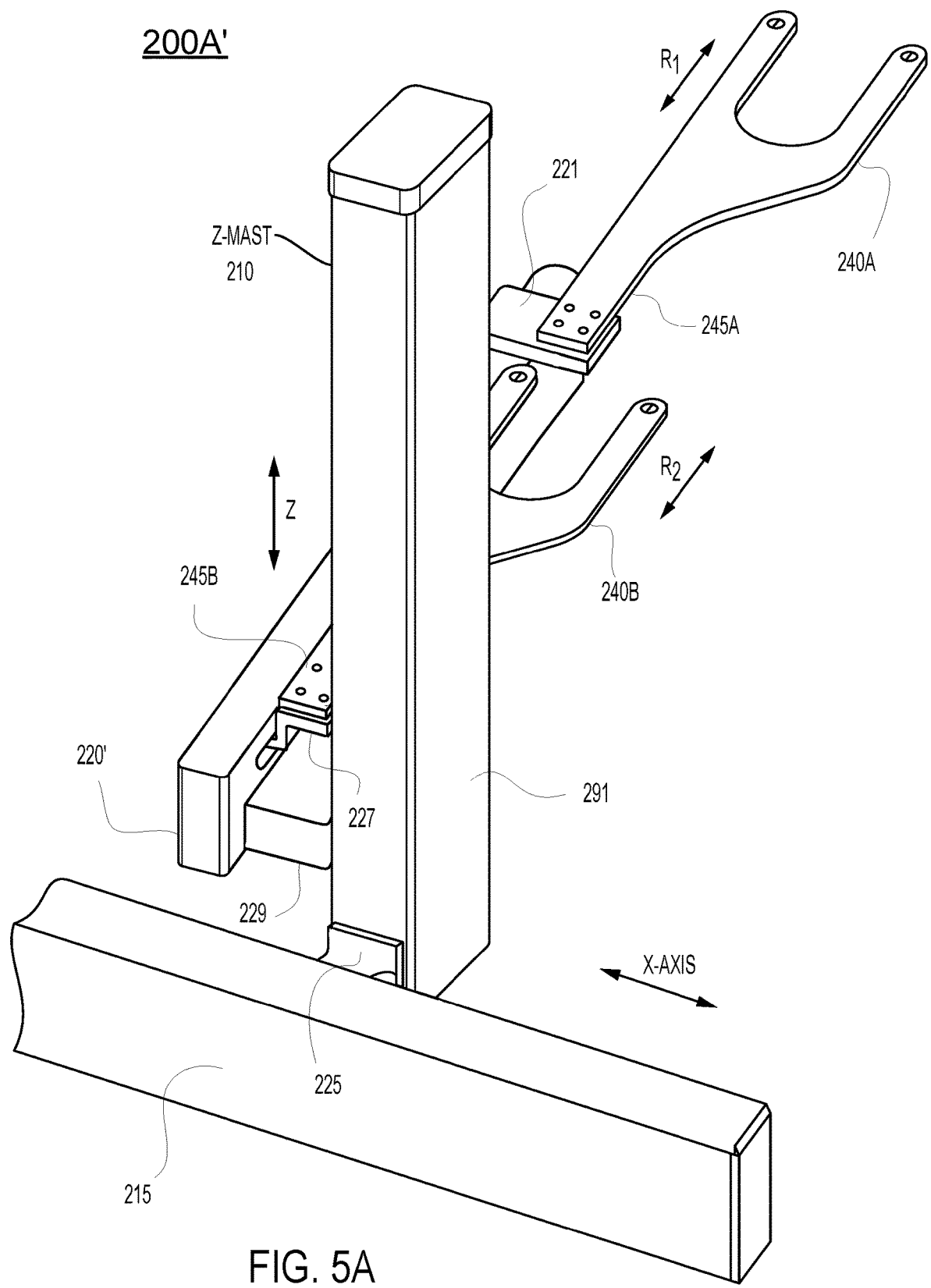
FIGS. 5A-5D are illustrations of perspective views of an over/under linear axis robotic structure that is configured for rectilinear arm motions, wherein the perspective views show independent control of the movement of the various grippers attached to the arm support section, and show varying positions of the grippers including full extension, and full retraction, in accordance with embodiments of the present disclosure.
Figure 5B:
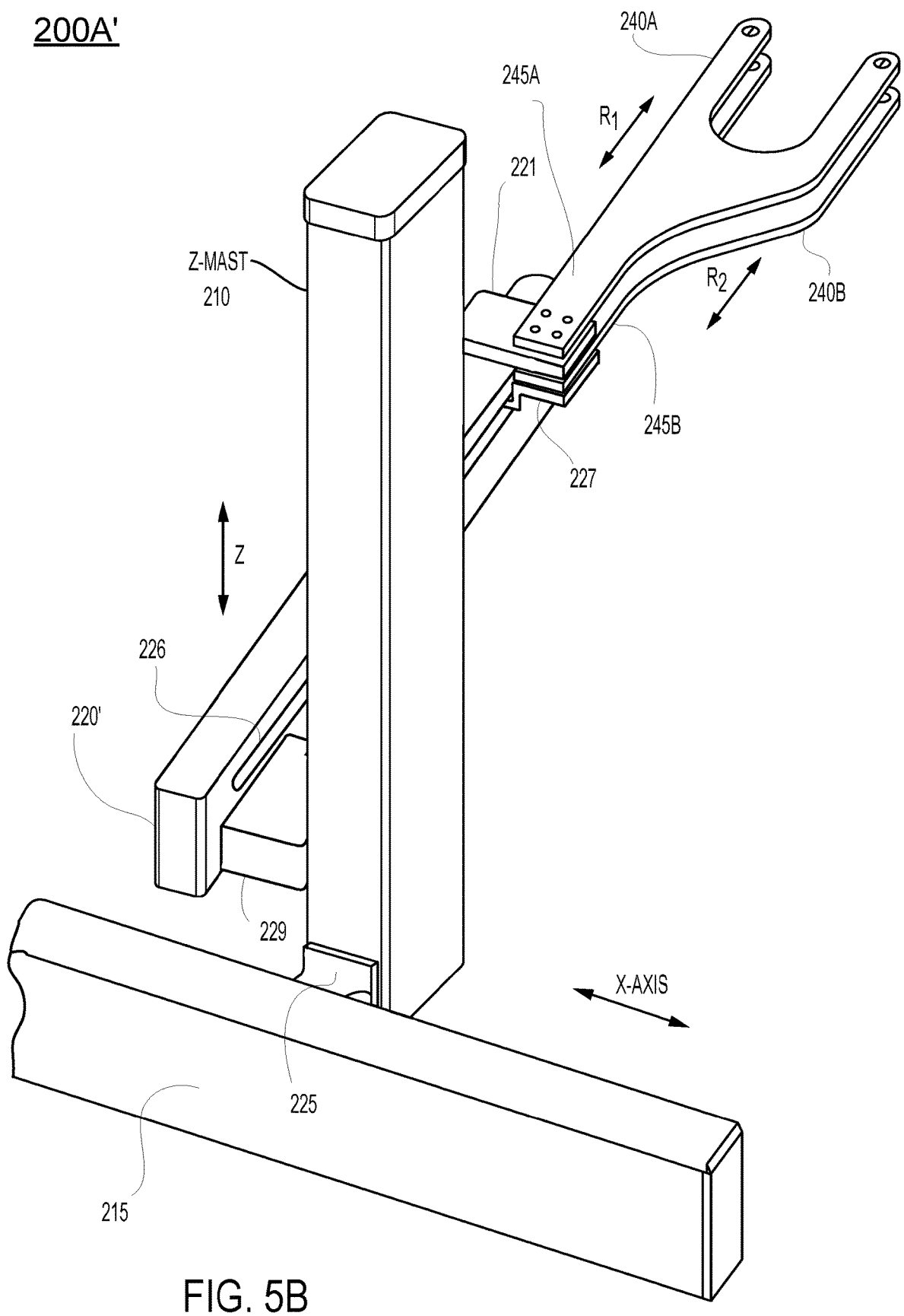
Figure 5C:
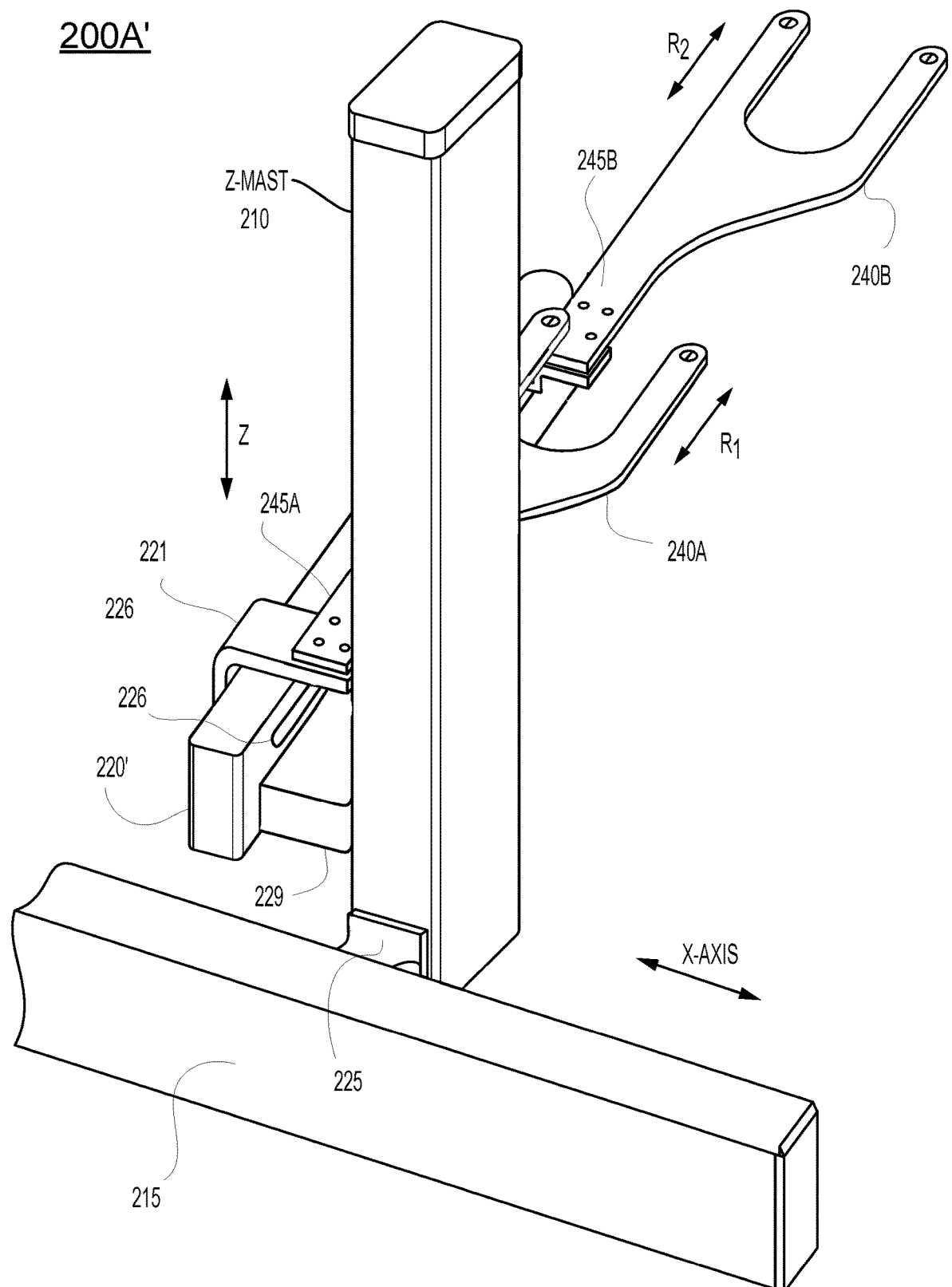

In particular, FIGS. 5A-5D show the movement of each of arm extensions R1 and R2 from full retraction to full extension, such as when picking up a wafer from a tool system. In FIGS. 5A-5C, the grippers 240A and 240B of arm extensions R1 and R2 are not handling a substrate 310 or DUT. In one case, gripper 240B may be configured as an end-effector when handling substrates and/or wafers.

In the sequence of movements for both arm extensions R1 and R2, in FIG. 5A arm extension R1 is fully extended, such that gripper 240A extends beyond the section arm 220'. Also, arm extension R2 is fully retracted, such that gripper 240B does not extend beyond the section arm 220', such that the length of gripper 240B and the corresponding linear drive mechanism 227 is fully defined within the dimensions of the length of the section arm 220'. In FIG. 5B, the gripper 240B of arm extension R2 has moved to a fully extended position, and gripper 240B is not handling a wafer. Further, arm extension R1 is also in a fully extended position, and gripper 240A is not handling a wafer.

Figure 5D:
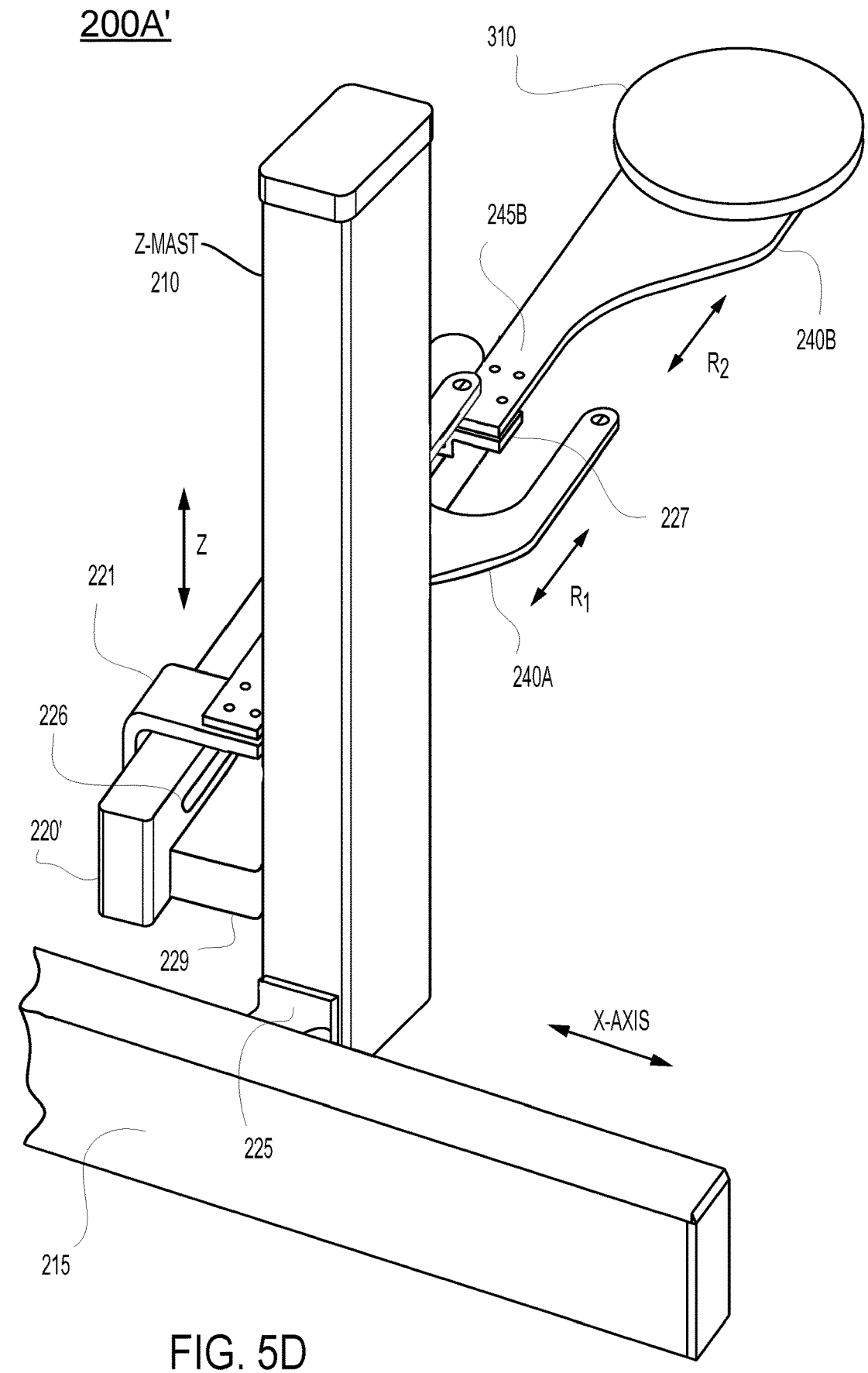

In FIG. 5C, the arm extension R1 has moved to a fully retracted position, and gripper 240A is not handling a wafer. Further, arm extension R2 remains in a fully extended position, wherein gripper 240B is not handling a wafer. In FIG. 5D, with the same arm extension configuration as shown in FIG. 5C, arm extension R1 is in a fully retracted position, and arm extension R2 is fully extended. Further, in FIG. 5C, arm extension R2 is shown after picking up a substrate 310. The same or different movements (e.g., moving from full extraction to full retraction) may be performed to extract the wafer 310 for purposes of transport using arm extension R2, such as when moving arm extensions to pick up substrates from a testing station or loader.

In FIG. 5D and in other figures throughout the specification, the substrate 310 is shown having the same diameter as the gripper 240B. It is understood that the size of substrate 310 or of any other object that is being handled by gripper 240B (e.g., substrate, DUT, device, etc.) is variable. As such, the object, being handled by the corresponding gripper, may be smaller or larger than or of equal size as the corresponding gripper. That is, different grippers may be configured to be smaller or larger than the object being handled. For example, different grippers may be smaller than the substrate footprint or extend beyond the substrate footprint when supporting substrate transfers.

FIGS. 6A-6H illustrate the use of a robotic structure 200A, introduced in FIGS. 2A-2B, within a loader 40 of a testing system, wherein the robotic structure 200A is configured for transporting substrates, modules, DUTs from an open or sealable multi-device carrier 665 to other testing and/or manufacturing stations, in accordance with embodiments of the present disclosure. In particular, the loader 40 may include one or more load ports 660 for receiving a multi-device carrier 665 configured for transporting carriers or trays 20 holding DUTs 25. The load ports 660 are configured as a standard interface between the multi-device carrier 665 and the robotic structure 200A. For example, the load ports 660 are configured to present carriers and/or trays 20 to the robotic structure 200A within the loader 40, wherein the robotic structure is configured to move DUTs handled by carriers and/or trays 20 to a corresponding testing station (not shown).

The multi-device carrier 665 may include a handle (not shown) that is configured to mate with a transport system (e.g., an overhead hoist transfer (OHT) system that is configured to move the multi-device carrier 665 from testing station to testing station via corresponding loaders 40. The carrier 665 includes a pod shell and a pod door, wherein the pod door engages with a port door of the load port 660 before the pod door is removed from the shell to enable access to the cassette 620 located within the carrier 660. The cassette 620 includes one or more closely spaced slots 621 (e.g., 621A-621N), wherein each slot 621 is configured for holding a smaller carrier or tray 20. A cassette 620 may have any number of slots 621.

The loader includes a mounting surface 610 that is configured for supporting a multi-device carrier 665. A locking assembly 605 is attached to the mounting surface, wherein the locking assembly 605 is configured to lock the multi-device carrier 665 into place on the mounting surface 610. Once locked, the multi-device carrier 665 is properly docked to the load port 160, and the pod door may be opened. In that manner, the robotic structure 200A is able to enter the multi-device carrier 665 for DUT (e.g., via carrier portion 20) extraction and/or placement, and transport of the DUT via carrier or tray 20 into the interior of the loader 40. Further transport may be enabled to move the DUTs 25 via carriers or trays 20 to and from a connected testing station (not shown). In addition, robotic structure 200A may be interfaced or integrated with a track system 230 to enable movement within the loader 40, such as when the loader 40 supports multiple load ports.

The robotic structure 200A located inside the loader 40 is configured as a dual arm extension structure (e.g., in an over and under configuration), but may be configured to have one or more arm extensions. As shown, robotic structure 200A includes arm extensions R1 and R2, wherein arm extension R1 includes a gripper 240A configured for handling DUTs (e.g., carrier portions 20). Also, robotic structure 200A includes arm extension R2 that includes a gripper 240B configured for handling DUTs. In one embodiment, grippers 240A and 240B may be configured for handling wafers, as previously described.

Figure 6A:
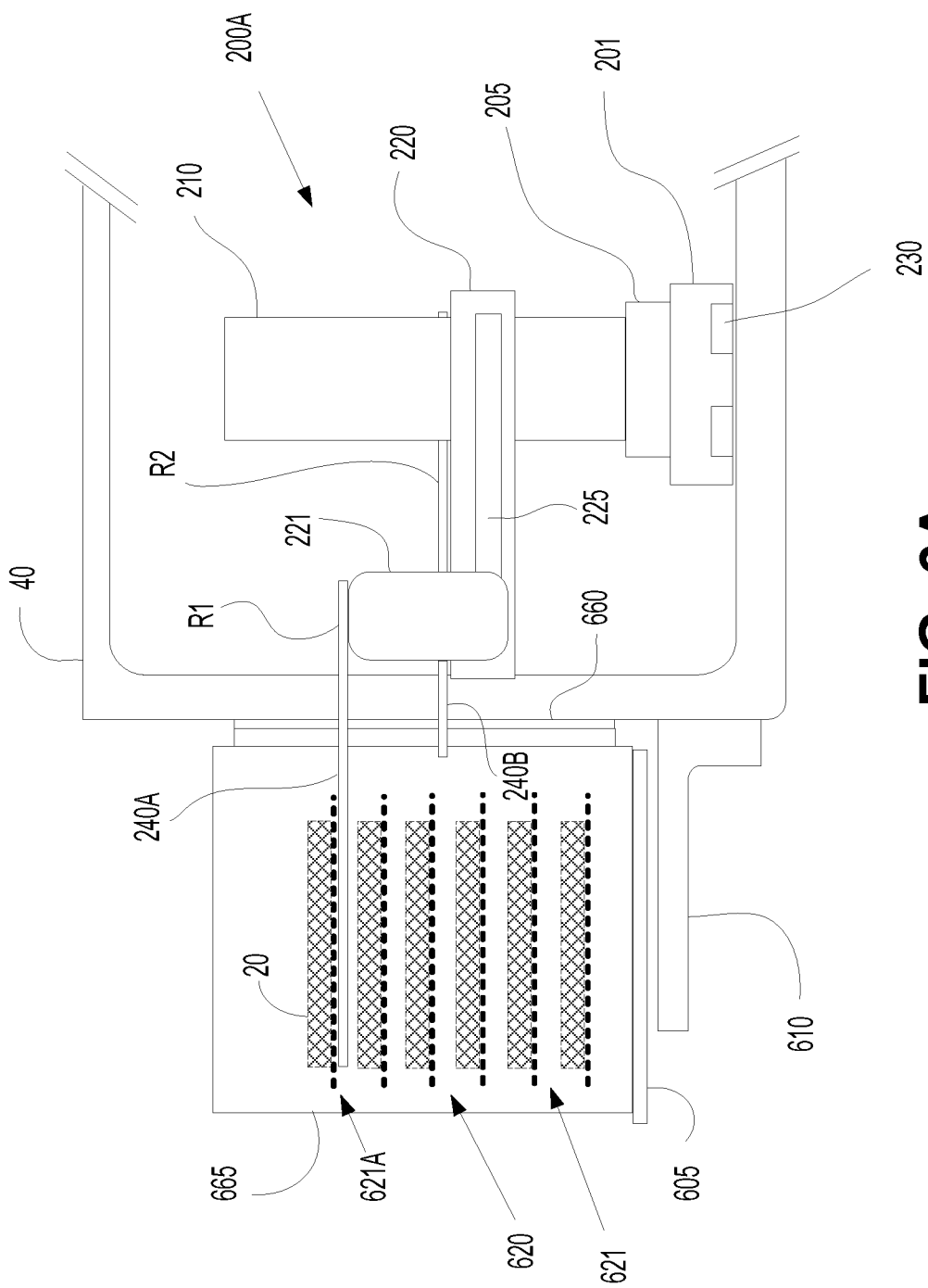
FIGS. 6A-6H illustrate the use of an over/under linear axis robotic structure within a loader of a testing system, wherein the robotic structure is configured for rectilinear arm motions, wherein the robotic structure is configured for transporting DUTs from a multi-device carrier to one or more testing stations, in accordance with embodiments of the present disclosure.
Figure 6B:
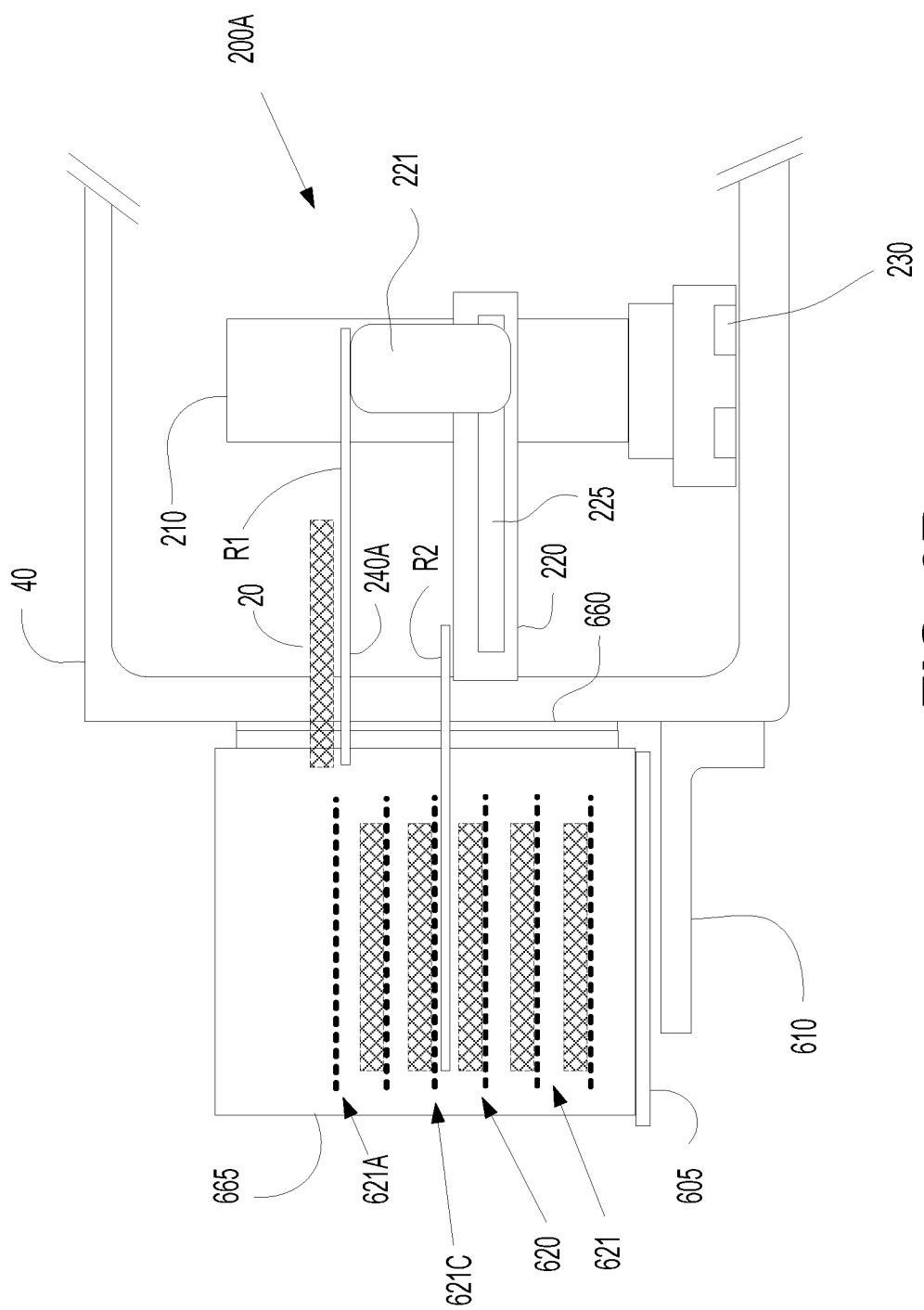
Figure 6C:
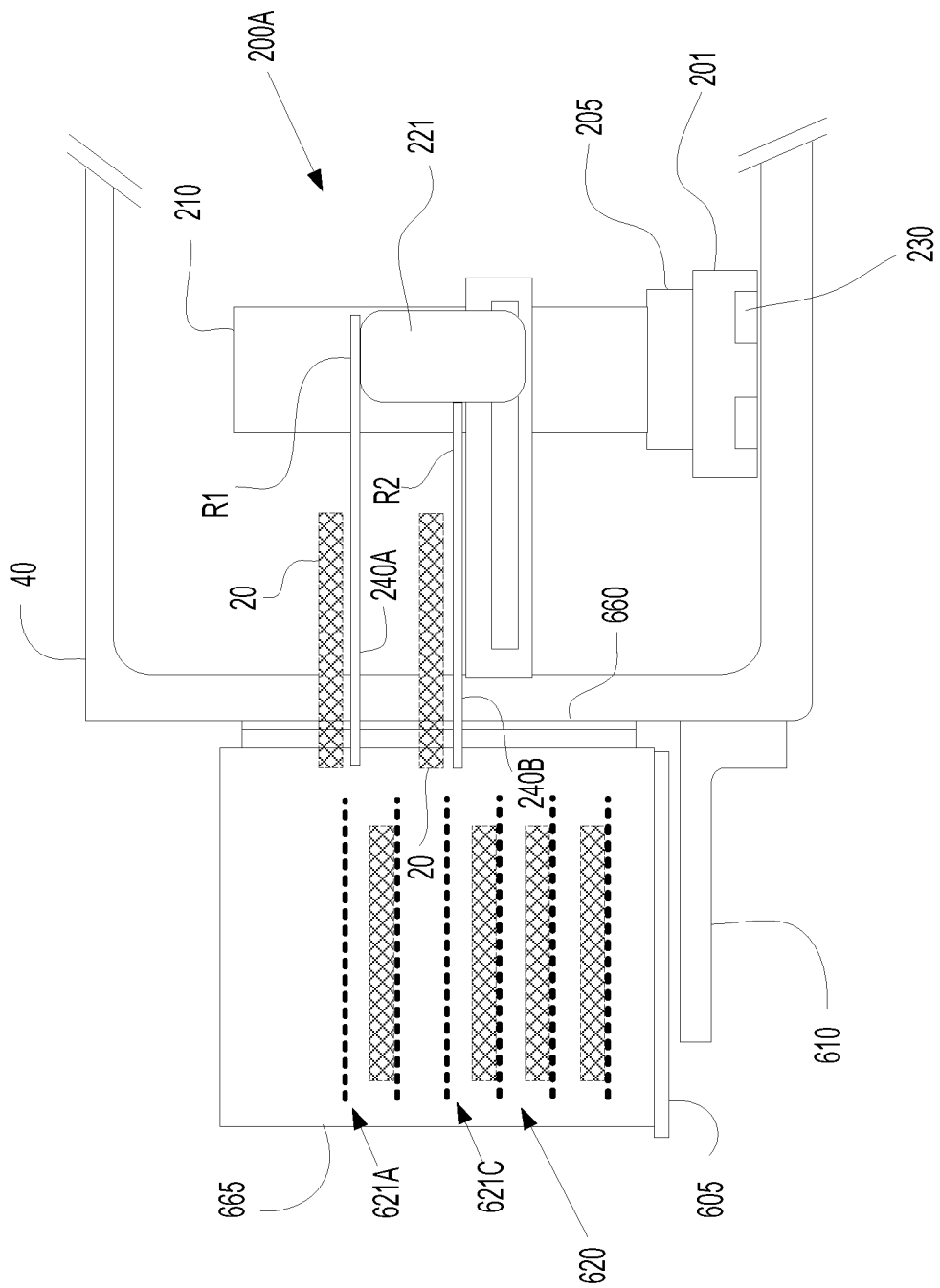

In FIGS. 6A-6C, arm extensions R1 and R2 are coordinated to pick up carriers or trays 20 handling DUTs in slots 621A and 621C in sequential fashion from non-adjacent slots. For example, first arm extension R1 picks up a carrier or tray 20 from slot 621A and moves out of the multi-device carrier 665, and then arm extension R2 moves into the multi-device carrier 665 to remove a carrier or tray 20 from slot 621C, wherein slots 621A and 621C are not adjacent (e.g., slot 621B is between slots 621A and 621C).

In FIG. 6A, arm extension R1 is positioned to enter multi-device carrier 665 and access slot 621A for purposes of DUT extraction through a corresponding carrier or tray 20. Movement of the gripper 240A of arm extension R1 to engage with a carrier or tray 20 in a slot is well known and needs no further discussion. As shown, arm extension R2 is positioned so as to not interfere with arm extension R1 and may be in a retracted position.

In FIG. 6B, arm extension R1 has picked up a carrier portion 20 and is moving out of the multi-device carrier 665 and into the interior of the loader 40 of a testing system. In addition, arm extension R2 is positioned to enter multi-device carrier 665 and access another slot (e.g., slot 621C) for purposes of DUT extraction. In FIG. 6C, arm extension R2 has picked up a carrier portion 20 and is moving out of the multi-device carrier 665 and into the interior of the loader 40 of a testing system, such that both arm extensions have moved out of the multi-device carrier 665. Movement of gripper 240A or 240B of arm extension R1 or R2 to engage with a carrier portion 20 in a slot is well known and needs no further discussion. As shown, carriers or trays 20 are absent from slots 621A and 621C.

Figure 6D:
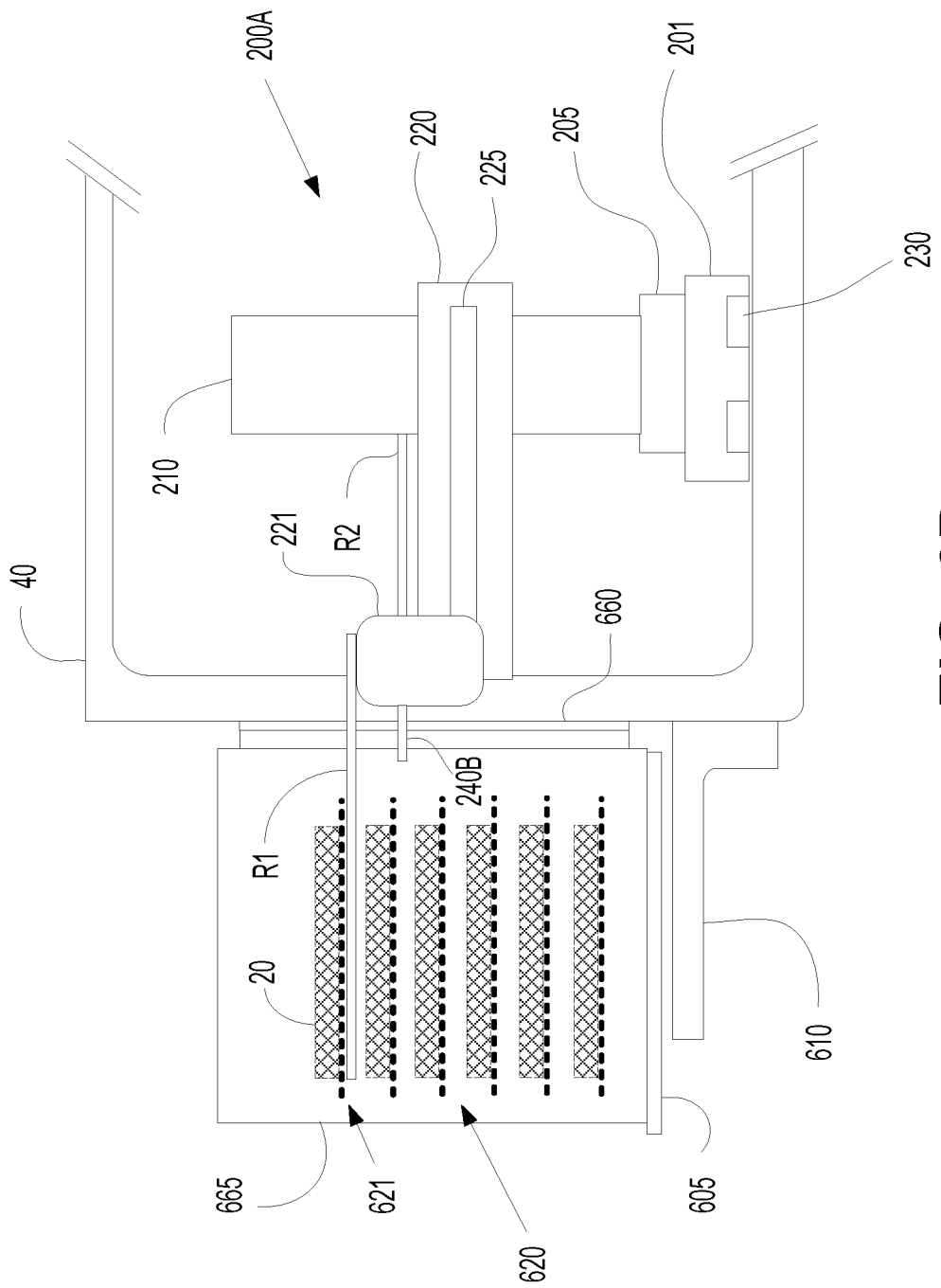
Figure 6E:
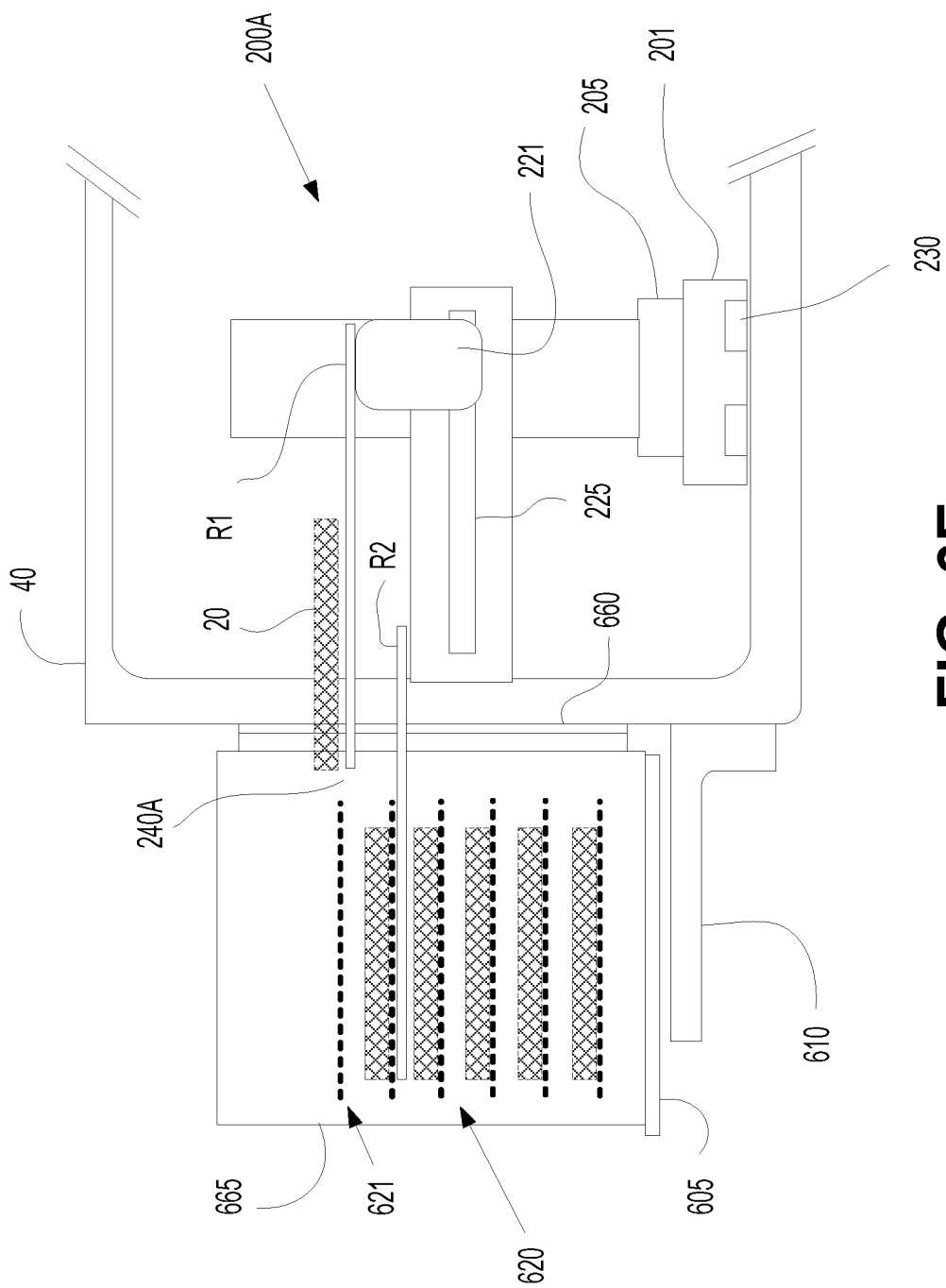
Figure 6F:
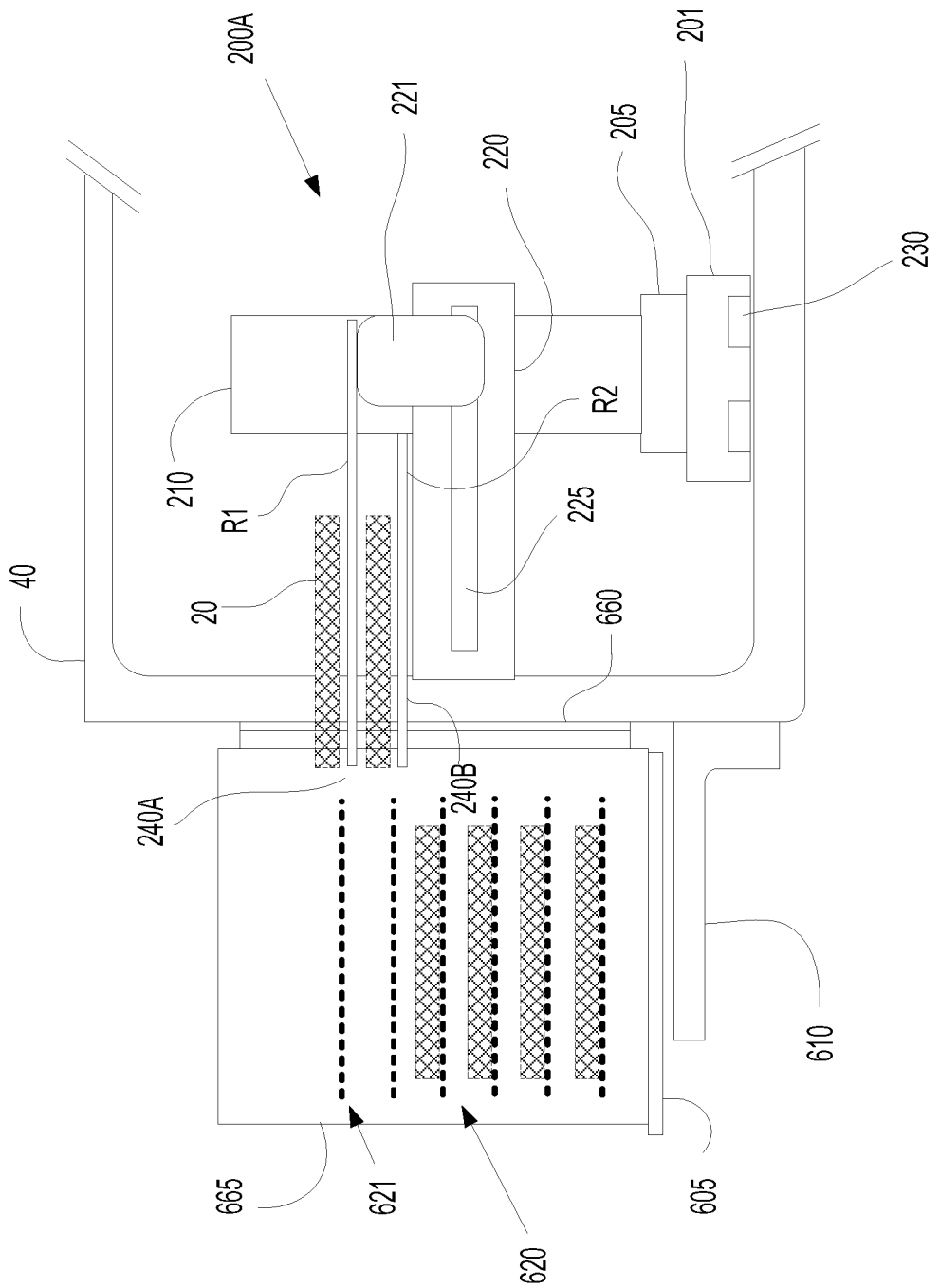

In FIGS. 6D-6F, arm extensions R1 and R2 are coordinated to simultaneously pick up carriers or trays 20 inside multi-device carrier 665 in sequential fashion from adjacent slots. For example, first arm extension R1 picks up a carrier or tray 20 from slot 621A and moves out of the multi-device carrier 665, and then arm extension R2 moves into the multi-device carrier 665 to remove a carrier or tray 20 from slot 621B, wherein slots 621A and 621B are adjacent.

In FIG. 6D, arm extension R1 is positioned to enter multi-device carrier 665 and access slot 621A for purposes of DUT extraction through a corresponding carrier or tray 20. As shown, arm extension R2 is positioned so as to not interfere with arm extension R1 and may be in a retracted position.

In FIG. 6E, arm extension R1 has picked up a carrier portion 20 and is moving out of the multi-device carrier 665 and into the interior of the loader 40 of a testing system. In addition, arm extension R2 is positioned to enter multi-device carrier 665 and access another slot (e.g., slot 621B) for purposes of DUT extraction. In FIG. 6E, arm extension R2 has picked up a carrier portion 20 and is moving out of the multi-device carrier 665 and into the interior of the loader 40 of a testing system, such that both arm extensions R1 and R2 have moved out of the multi-device carrier 665. In FIG. 6F, arm extensions R1 and R2 have moved out of multi-device carrier 665 and into the interior of the loader 40. That is, both arm extensions R1 and R2 are fully retracted. As shown, carriers or trays 20 are absent from slots 621A and 621B.

In addition, other arm extension movements are possible. For example, arm extensions R1 and R2 may simultaneously enter multi-device carrier 665 and pick up carriers or trays 20 in slots 621A and 621B. Thereafter, the arm extensions R1 and R2 may simultaneously exit multi-device carrier 665 and move out of multi-device carrier 665 and into the interior of the loader 40.

Figure 6G:
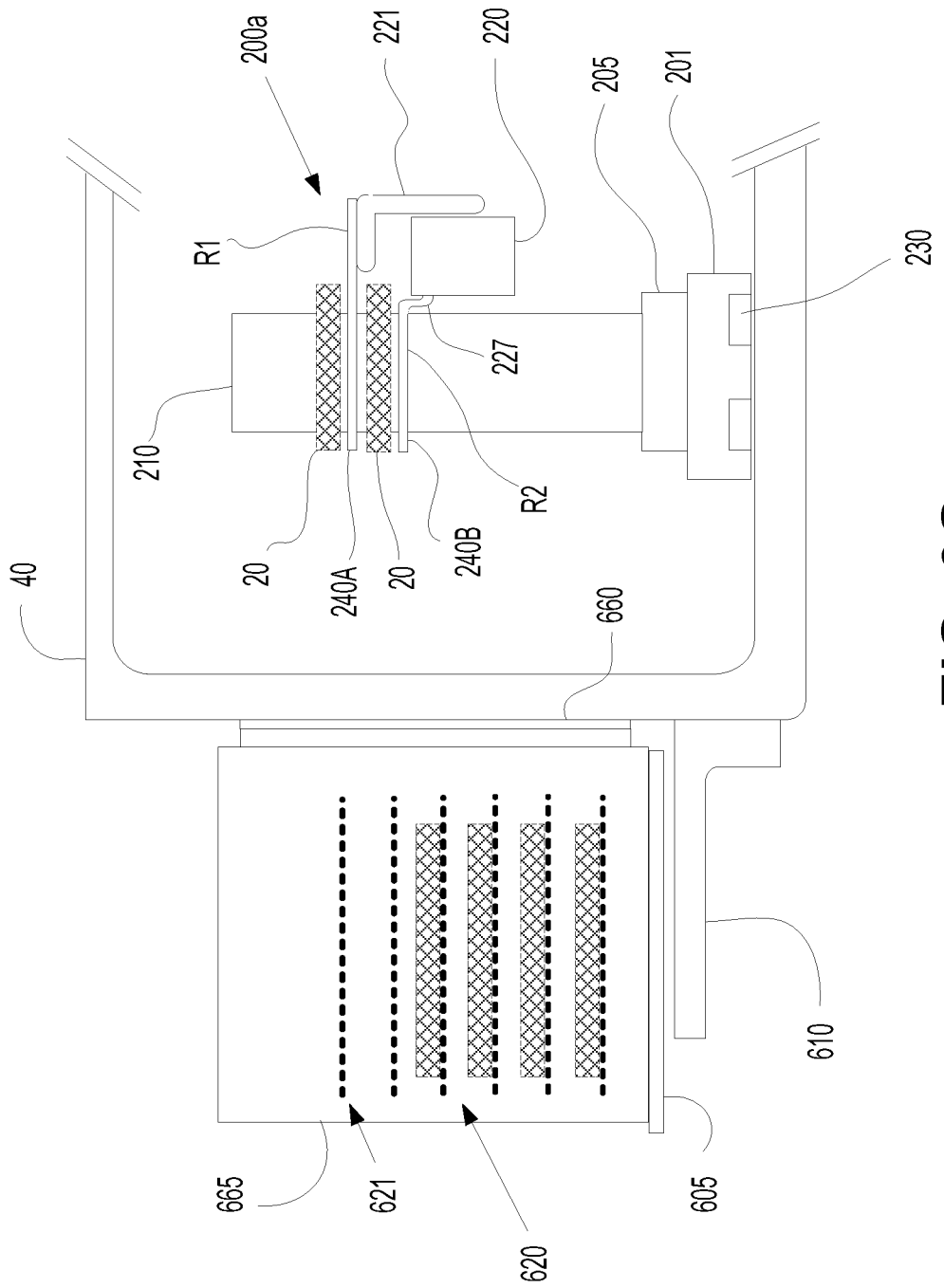
Figure 6H:
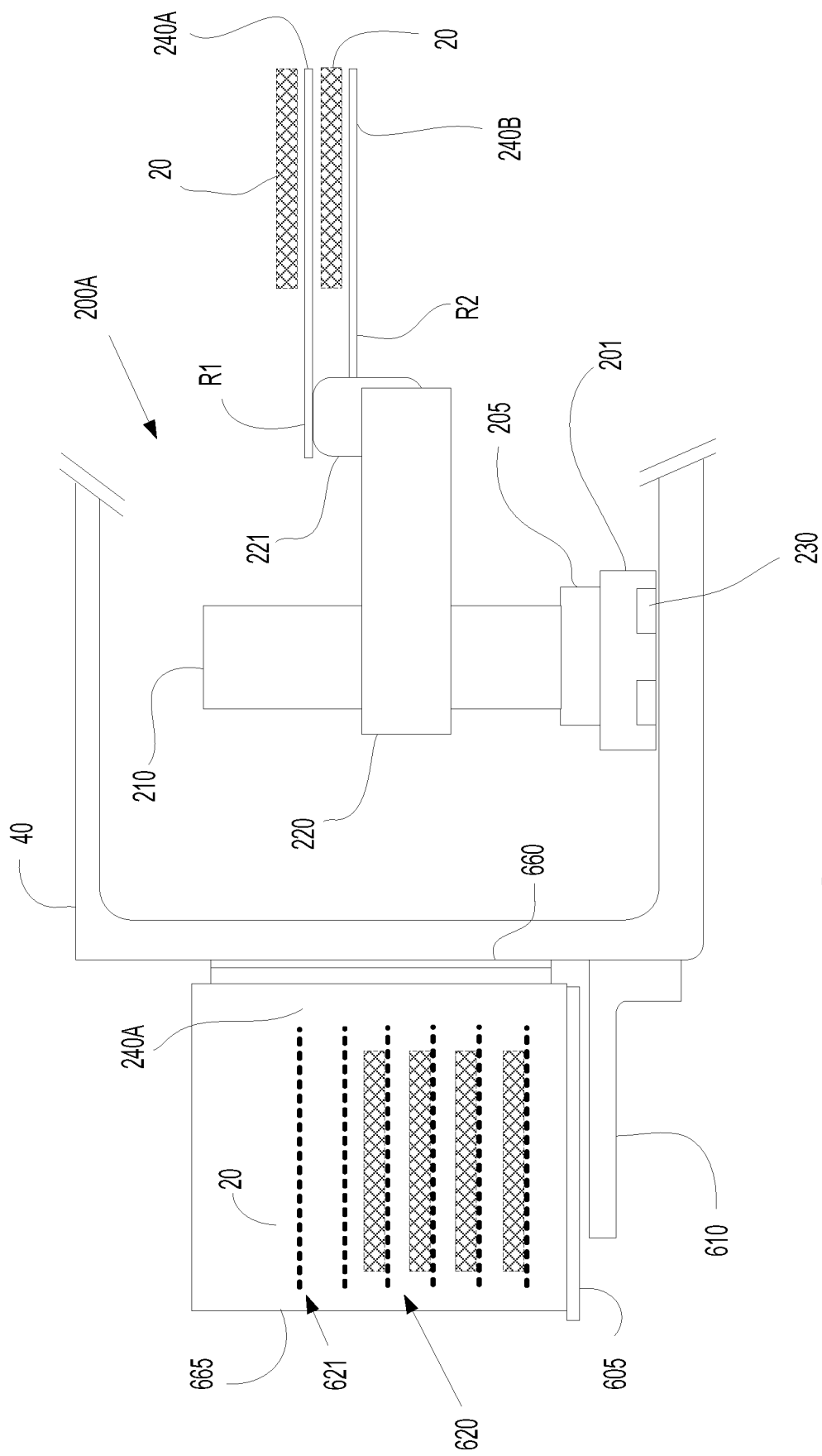

FIGS. 6G and 6H illustrate the movement of robotic structure 200A (e.g., rotation) within the loader 40 for purposes of moving wafers to and from a testing station (not shown). In particular, FIG. 6G shows a head-on view of the robotic structure 200A, wherein both arm extensions R1 and R2 are handling carriers or trays 20, and may be moving along the track system 230. Gripper 240A of arm extension R1 is located above gripper 240B of arm extension R2. After further rotation of the robotic structure 200A within the loader 40, FIG. 6H shows arm extensions R1 and R2 in an orientation such that at full or partial extension, arm extensions R1 and R2 may enter into a connected testing station (not shown).

FIGS. 7A-7D illustrate perspective views of an over and under linear axis robotic structure 700 having multiple linear drives and linear drive mechanisms adapted for independent linear movement of each of a plurality of grippers, in accordance with one embodiment of the present disclosure. The perspective views of FIGS. 7A-7D are taken from a first vantage point in space having an unobstructed view of the front side 790 of the robotic structure 700. The robotic structure 700 includes one or more arm extension including grippers that are configured for handling various objects and/or devices. Each of the arm extensions and grippers are independently controlled with regards to linear movement and for handling. Further, the same footprint of the robotic structure 700 can support any number of arm extensions 1-N. In that manner, the number of objects being handled by the robotic structure 700 can be increased significantly without affecting the horizontal footprint required by the robotic structure within the overall system (e.g., testing, fabrication, transporting, etc.). Previously, an increase in the horizontal footprint was required in order to increase the number of objects and/or devices being handled in order to accommodate the additional traditional robotic systems (each requiring its own horizontal footprint) necessary to support the increase in the number of objects and/or devices. In many cases, an increase in the horizontal footprint for the robotic systems cannot be made without significant cost and/or an increase in the size of the overall system. sometimes, no additional space can be made, and as such, the number of objects and/or devices being handled cannot be increased. On the other hand, with embodiments of the present disclosure, no increase in the horizontal footprint is required to increase the number of objects and/or devices being handled.

The robotic structure 700 also includes a vertically oriented Z-tower 210 (also referred to as a Z-mast). As shown, Z-tower may be fixedly attached to or moveably interfaced with structure 215 (e.g., through bracket or other connection means). The robotic structure 700 is configured for rectilinear arm motions along one or more defined lines in space, depending on the position and orientation of the Z-tower 210. For example, the robotic structure 700 is configured for retracting and extending out one or more grippers of corresponding arm extensions, in order to pick-up and/or drop-off objects along the one or more defined lines.

As introduced, the robotic structure 700 may be configured for movement, in part, along the X-axis, in accordance with one embodiment of the present disclosure. In particular, support 215 may be configured with a drive (not shown) (e.g., belt system, linear drive, etc.). For example, a bracket (not shown) or other connector may be adapted to moveably interface with the drive to enable movement of the Z-tower 210 of the robotic structure 700 along the support 215. That is, the Z-tower 210 is movable in the X-direction along the X-axis, at least for a section of the support 215. Though not shown in detail, the X-axis is known in the art and does not require further disclosure. For instance, the X-axis may define a direction of a section of a track, wherein the X-axis may define motion of the robotic system 700 in the X-direction within a horizontal plane.

Also, the robotic structure 700 may not be coupled to a track system. For example, the robotic structure 700 may be fixedly attached to support 215 (e.g., through a bracket). Support 215 may be configured as a rigid platform that provides a rigid structure such that the various motions of the robotic structure 700 can be repeated with accuracy. When the Z-tower 210 of the robotic structure 200A is fixedly attached to the support 215, no movement of the Z-mast 210 is possible along the X-axis.

A vertical drive (not shown) is configured within the Z-tower 210. A vertical drive mechanism is adapted to integrate with the vertical drive for linear movement along the Z-tower 210 along a Z-axis. Though not shown in detail, the Z-axis is known in the art and does not require further disclosure. For instance, the Z-axis may define linear motion of the section arm 220 along the Z-tower, or along a Z-direction. As shown, slot 251 located on the front side 290 of the Z-tower 210 allow for a vertical drive mechanism (not shown) to integrate with the vertical drive (not shown) within the Z-tower 210. For example, the vertical drive may include a ball slide assembly, wherein the vertical drive mechanism is adapted to attach to the ball slide assembly for movement along the Z-axis. In another example, the vertical drive may include a ball screw assembly.

The robotic structure 700 includes an arm support structure 720 adapted to attach to the vertical drive mechanism. In that manner, the arm support structure 720 is configured for linear movement along the Z-tower with movement of the vertical drive mechanism.

The robotic structure 700 includes one or more arm extensions R1-RN, wherein each arm extension includes at least a linear drive, a linear drive mechanism, and a gripper. The arm extensions are configured for handling various objects and/or devices. For instance, in some embodiments, robotic structures 700 of FIGS. 7A-7D are configured for handling wafers and/or substrates 310, wherein the robotic structure 700 includes grippers configured with and/or interfacing with end effectors. In other embodiments, robotic structure 700 is configured for handling devices, modules, and/or DUTs, wherein the robotic structure includes grippers configured with and/or interfacing with carrier portions (e.g., carriers and/or trays). Still other embodiments of robotic structure 700 disclose the use of other types of grippers configured for handling any of a variety of objects, carriers, trays, DUTs, etc.

For the arm extensions, a plurality of linear drives (not shown) are configured within the arm support structure 720. For example, the linear drive may be implemented through corresponding ball slide assemblies to provide rectilinear motion. In addition, a plurality of slots 725 (e.g., including slots 725A-725E) are arranged within an outward face 790 of the arm support structure 720. For example, each of slots 725A-725E is arranged horizontally within the outward face 790. Further, a plurality of linear drive mechanisms is provided, wherein each linear drive mechanism is adapted to integrate with a corresponding linear drive through a corresponding slot for linear movement along a corresponding Y-axis. For example, a linear drive mechanism may be adapted to attach to a carriage of a corresponding ball slide assembly through a corresponding slot for linear movement along a corresponding Y-axis. The robotic structure includes a plurality of grippers, each gripper being adapted to attach to a corresponding linear drive mechanism. As such, each gripper is adapted for linear movement along a corresponding Y-axis with movement of the corresponding linear drive mechanism.

As shown, the robotic structure 700 includes five arm extensions R1 through R5. For example, arm extension R1 includes a gripper 740A that is adapted to attach to a corresponding linear drive mechanism (not shown), wherein the linear drive mechanism is further adapted to attach to integrate with a corresponding linear drive (not shown) through slot 725A for linear movement along a corresponding $Y_1$-axis. Also, arm extension R2 includes a gripper 740B that is adapted to attach to a corresponding linear drive mechanism (not shown), wherein the linear drive mechanism is further adapted to attach to integrate with a corresponding linear drive (not shown) through slot 725B for linear movement along a corresponding $Y_2$-axis. Further, arm extension R3 includes a gripper 740C that is adapted to attach to a corresponding linear drive mechanism (not shown), wherein the linear drive mechanism is further adapted to attach to integrate with a corresponding linear drive (not shown) through slot 725C for linear movement along a corresponding $Y_3$-axis. Also, arm extension R4 includes a gripper 740D that is adapted to attach to a corresponding linear drive mechanism (not shown), wherein the linear drive mechanism is further adapted to attach to integrate with a corresponding linear drive (not shown) through slot 725D for linear movement along a corresponding $Y_4$-axis. Further, arm extension R5 includes a gripper 740E that is adapted to attach to a corresponding linear drive mechanism (not shown), wherein the linear drive mechanism is further adapted to attach to integrate with a corresponding linear drive (not shown) through slot 725E for linear movement along a corresponding $Y_5$-axis. In one embodiment, the one or more $Y_1$ through $Y_5$ axis may be aligned in the vertical direction.

The spacing between the adjacent arm extensions can be preselected. In one embodiment, the spacing between pairs of adjacent arm extensions are uniform. In another embodiment, the spacing between pairs of adjacent arm extensions are non-uniform. For example, one pair of adjacent arm extensions may be configured with a spacing to provide for access to adjacent access slots (e.g., slots 621) of a multi-device carrier (e.g., carrier 665). In that manner, when extending all five arm extensions R1-R5 of the robotic structure 700 into a multi-device carrier, 5 adjacent slots are accessed, such as to pick up substrates contained therein. A sequence of movements of the arm extensions R1-R5 may be repeated 5 times for a carrier having 25 access slots to remove substrates in the multi-device carrier. Another pair of adjacent arm extensions may be configured with a spacing to provide for access to non-adjacent access slots of the carrier (e.g., skipping one or more access slots). In one embodiment, the spacing between a pair of adjacent arm extensions may be further controllable. For example, the arm support structure 720 may include an accordion like section that is expandable and retractable to increase or decrease the spacing between pairs of adjacent arm extensions. In one embodiment, the robotic structure 700 is sized so that the one or more arm extensions can simultaneously interface with access slots in a front opening unified pad (FOUP) as the multi-device carrier.

Further, each of the arm extensions can be independently controlled for purposes of extracting, transporting, and placing substrates, modules, DUTs throughout testing stations of a testing system, during testing and/or assembly processes. A single controller or multiple controllers may be configured for controlling movement of each of the plurality of linear drives of corresponding arm extensions. In that manner, various indexing of access slots of a multi-device carrier may be interfaced by one or more arm extensions (e.g., grippers) depending on the orientation of the arm support structure 720, and the positioning of the arm extensions R1 through R5.

For example, FIGS. 7A-7D show varying positions of the arm extensions R1-R5 of the robotic structure 700 including full extension and full retraction. In FIGS. 7A-7D, the arm extensions R1 through R5 are shown extending and retracting for purposes of extracting, transporting, and placing substrates, modules, DUTs throughout testing stations of a testing system, during testing and/or assembly processes. In some embodiments, full retraction of at least one of the arm extensions R1 through R5 is possible, wherein a corresponding gripper(s) (e.g., end-effector) is configured to allow for full retraction. FIGS. 7A-7D are provided purely for illustration purposes, as many different configurations for arm extensions R1 through R52 of the robotic structure 700 not shown are supported. For example, though not shown, the arm extensions R1 through R5 may each be placed in various degrees of extension, such as half or quarter extension. In some embodiments, full extension of at least one of the arm extensions R1 through R5 is possible, wherein a corresponding gripper(s) (e.g., end-effector) is configured to allow for full extension (e.g., to pick up or drop off objects). Further, though not shown in FIGS. 5A-5D, arm extensions R1 and R2 may be vertically moved along the Z-axis, wherein each of the arm extensions R1 and R2 have additional rectilinear arm motions, as previously described.

Figure 7A:
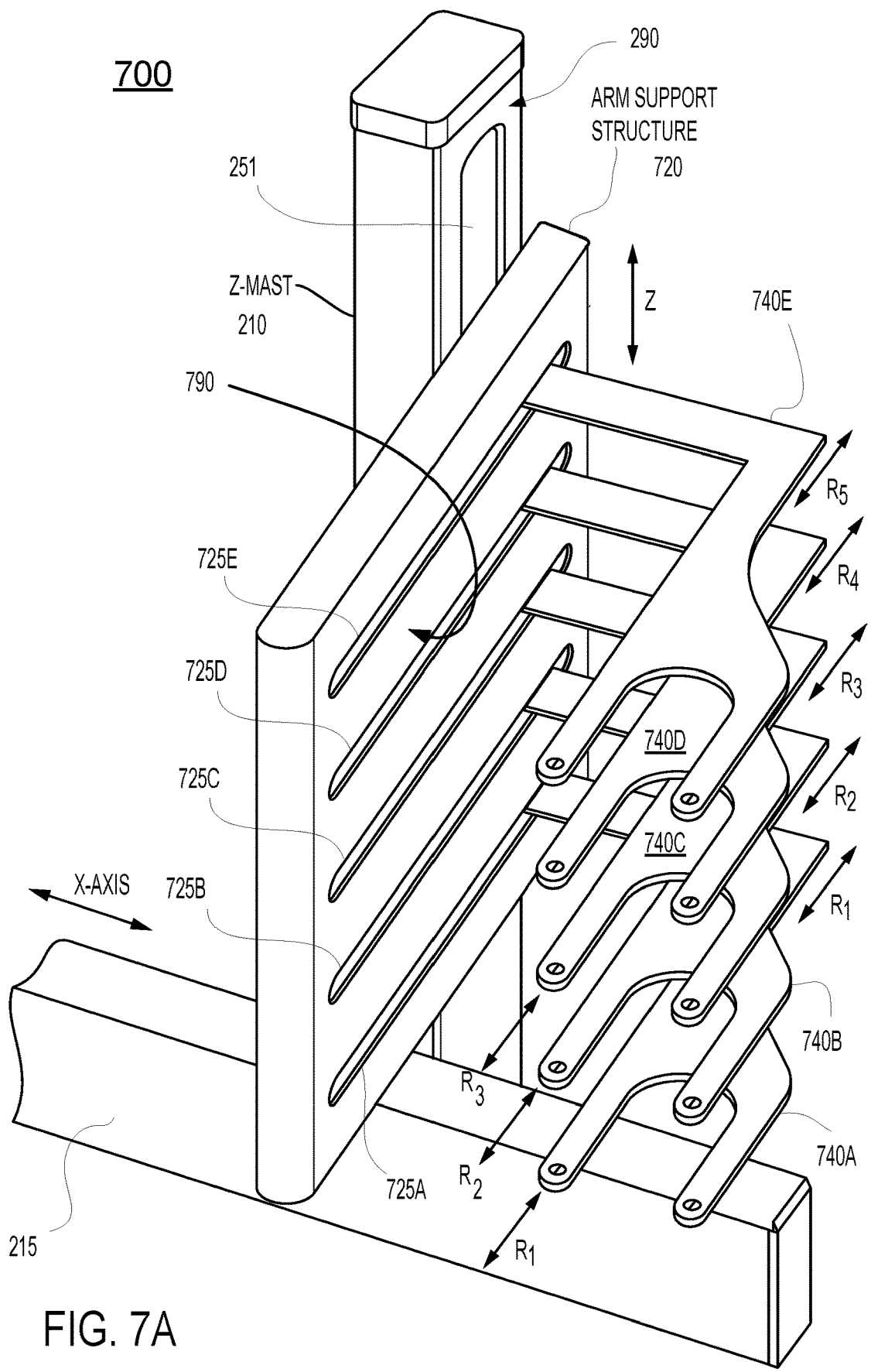
FIG. 7A illustrates a perspective view of an over/under linear axis robotic structure having multiple linear drives and linear drive mechanisms adapted for independent linear movement of each of a plurality of grippers, wherein the grippers are shown in a fully retracted position, wherein the grippers may be moved to any position between the fully retracted or fully extended positions, in accordance with one embodiment of the present disclosure.

In particular, in FIG. 7A, each of the grippers 740A-740E of arm extensions R1-R5 are in a fully retracted position, wherein grippers may be moved to any position between the fully retracted or fully extended positions.

Figure 7B:
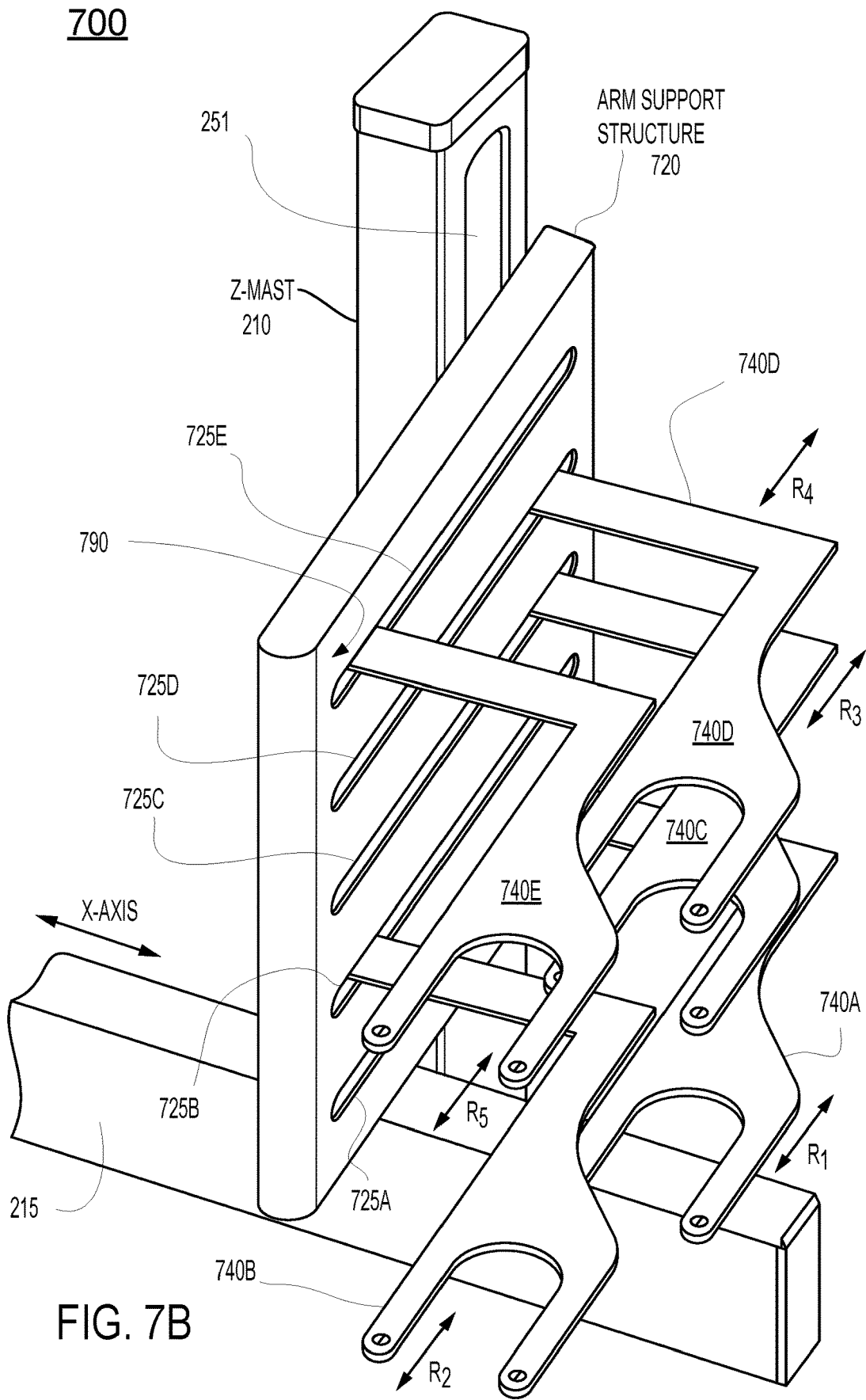
FIG. 7B illustrates a perspective view of the over/under linear axis robotic structure of FIG. 7A showing independent movement of each of the plurality of grippers, wherein the grippers are shown in one of a fully retracted position or a fully extended position, in accordance with one embodiment of the present disclosure.

In FIG. 7B, arm extensions R2 and R5 are in fully extended positions, such that grippers 725B and 725E are fully extended. The remaining arm extensions R1, R3, and R4 are in fully retracted positions, such that grippers 725A, 725C, and 725D are fully retracted.

Figure 7C:
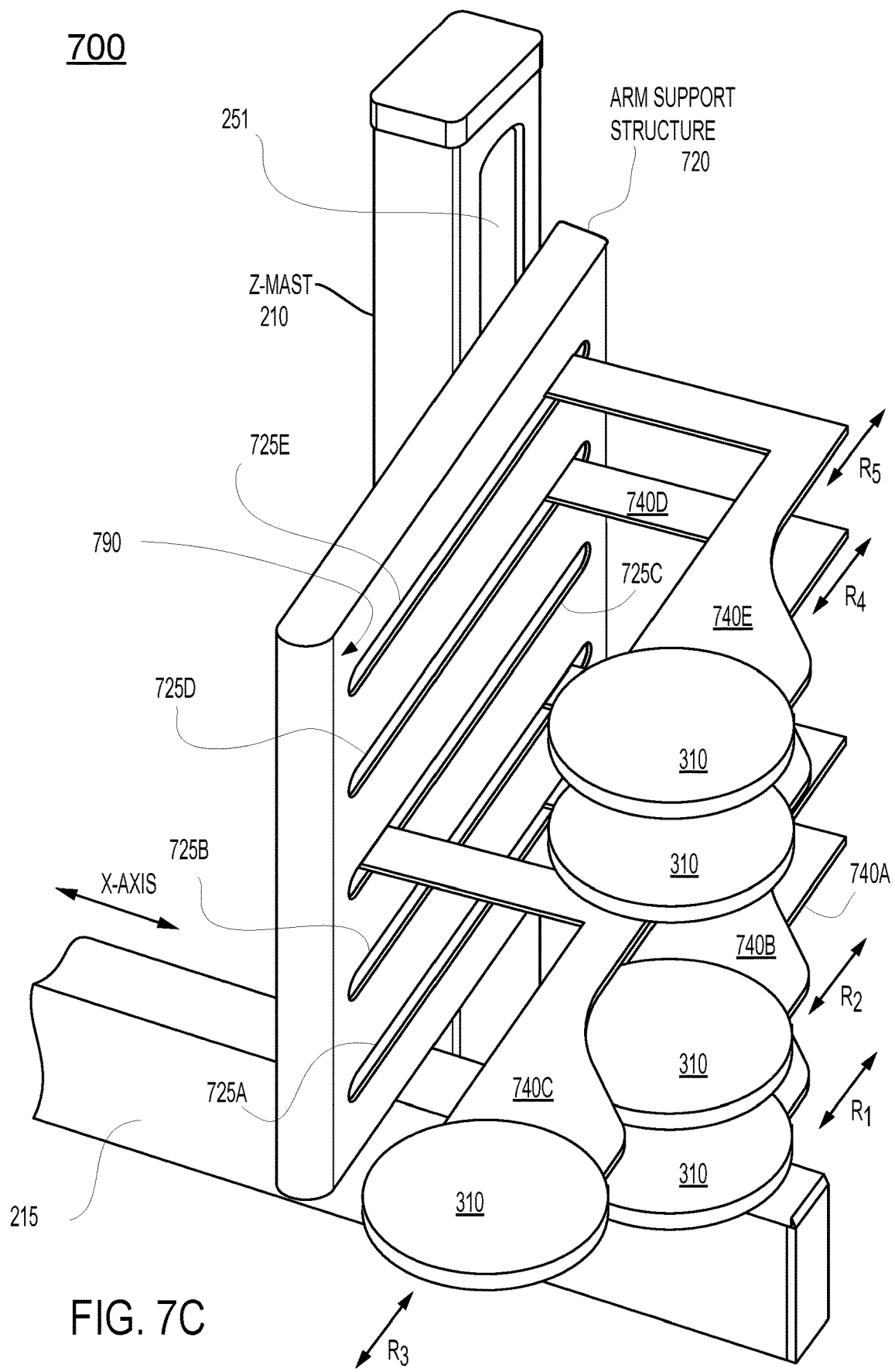
FIG. 7C illustrates a perspective view of the over/under linear axis robotic structure of FIG. 7A showing independent movement of each of the plurality of grippers, wherein the grippers are configured for handling wafers, wherein one gripper is shown in a fully extended position, and the remaining grippers are shown in a fully retracted position, in accordance with one embodiment of the present disclosure.

In FIG. 7C, arm extension R3 is in a fully extended position, such that gripper 725C is fully extended. The remaining arm extensions R1, R2, R4, and R5 are in fully retracted positions, such that grippers 725A, 725B, 725D, and 725E are fully retracted. Further, in FIG. 7C, arm extension R3 is shown after picking up a substrate 310, or in the process of dropping off the substrate 310. The same or different movements (e.g., moving from full extraction to full retraction) may be performed to extract the wafer 310 for purposes of transport using arm extension R3, such as when moving arm extensions to pick up substrates from a testing station or loader. In addition, each of the remaining arm extensions R1, R2, R4, and R5 have previously picked up substrates 310, and have moved to retracted positions for purposes of transport.

In FIG. 7C and in other figures throughout the specification, the substrate 310 is shown having the same diameter as the grippers 740A-740E. It is understood that the size of substrate 310 or of any other object that is being handled by the grippers 740A-740E (e.g., substrate, DUT, device, etc.) is variable. As such, the object, being handled by the corresponding gripper, may be smaller or larger than or of equal size as the corresponding gripper. That is, different grippers may be configured to be smaller or larger than the object being handled. For example, different grippers may be smaller than the substrate footprint or extend beyond the substrate footprint when supporting substrate transfers.

Figure 7D:
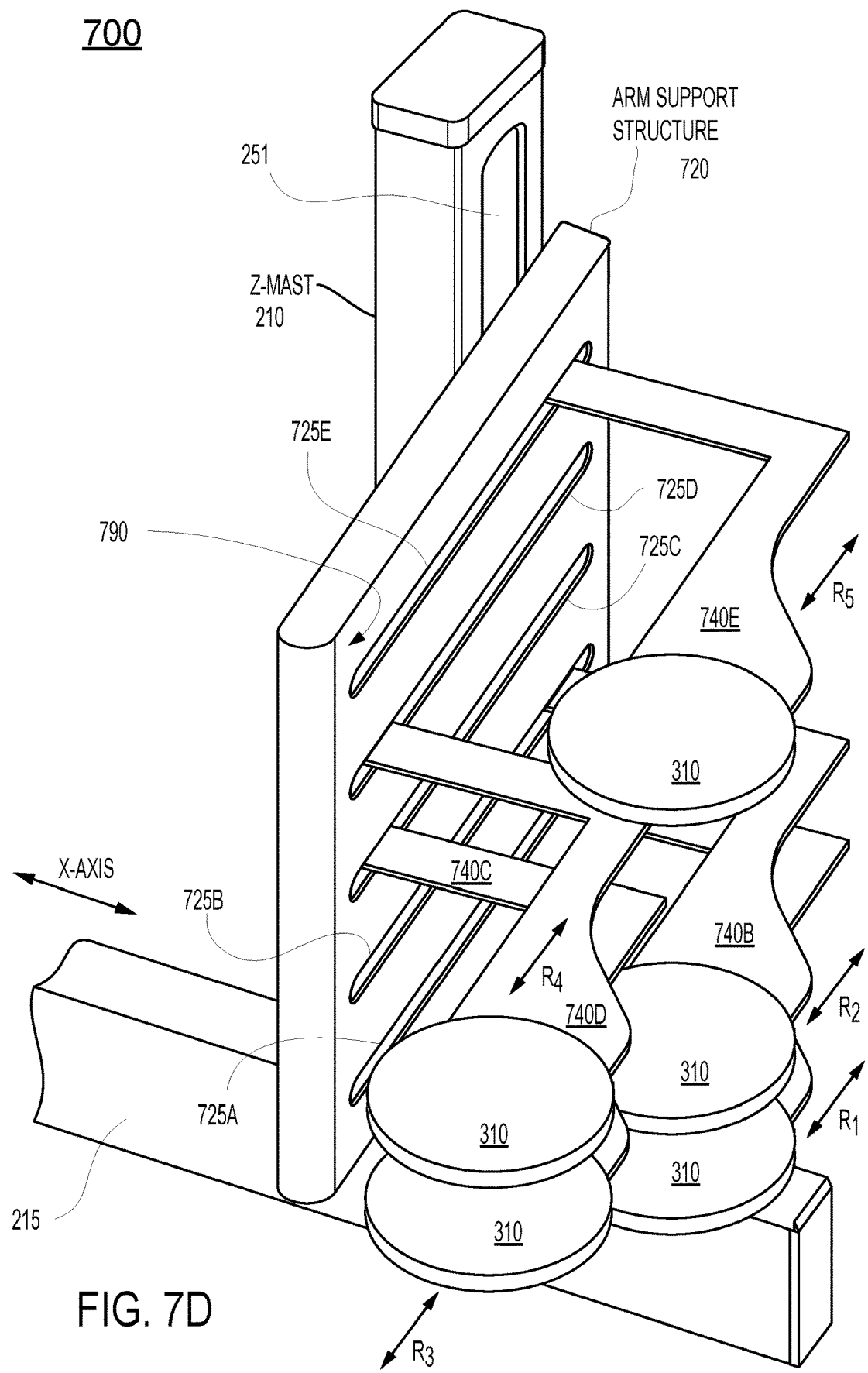
FIG. 7D illustrates a perspective view of the over/under linear axis robotic structure of FIG. 7A showing independent movement of each of the plurality of grippers, wherein the grippers are configured for handling wafers, wherein two grippers are shown fully extended, and the remaining grippers are shown fully retracted, in accordance with one embodiment of the present disclosure.

In FIG. 7D, two arm extensions R3 and R4 are shown dropping off and/or picking up substrates 310. For instance, arm extensions R3 and R4 are in fully extended position, such that grippers 725C and 725D are fully extended. The remaining arm extensions R1, R2, and R5 are in fully retracted positions, such that grippers 725A, 725B, and 725E are fully retracted for purposes of transport. For example, arm extensions R1, R2, and R5 may be next fully extended for dropping off substrates 310, or after retracting all arms R1-R5, the Z-tower 210 is moved along the X-axis for transporting to a different location (e.g., a different test station).

Figure 8:
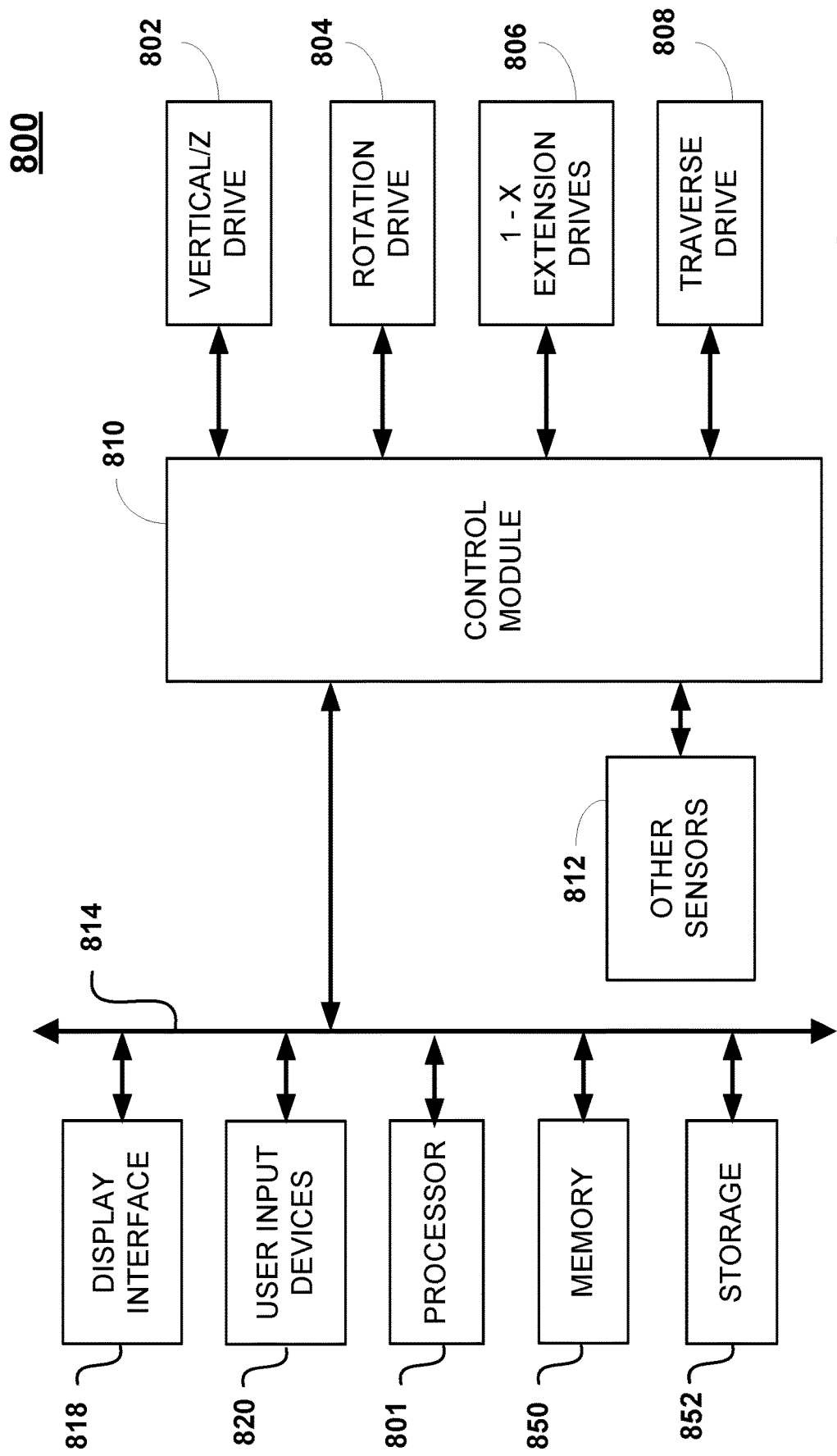
FIG. 8 shows a control module for controlling the systems described above.

FIG. 8 shows a control module 810 for controlling the systems described above. Control module 810 may be configured within an example device used to perform aspects of the various embodiments of the present disclosure. For example, FIG. 8 illustrates an exemplary hardware system 800 suitable for implementing a device in accordance with one embodiment. Hardware system 800 may be a computer system suitable for practicing embodiments of the disclosure, and may include processors, memory, and one or more interfaces. In particular, hardware system 800 includes a central processing unit or processor 801 for running software applications and optionally an operating system. Processor 801 may be one or more general-purpose microprocessors having one or more processing cores. Further, system 800 may include memory 850 for storing applications and data for use by processor 801. Storage 852 provides non-volatile storage and other computer-readable media for applications and data, and may include fixed disk drives, removable disk drives, flash memory devices, and CD-ROM, DVD-ROM, Blu-ray, HD-DVD, or other optical devices, as well as signal transmission and storage media. The components of system 800 are connected via one or more data buses 814.

The control module 800 may be employed to control devices in the system based in part on sensed values. For example only, the control module 800 may control one or more of vertical drive 802, rotation drive 804, dual extension drive 806 (e.g., used for extending and retracting arms of a robotic system), track system 808, and other sensors 812 based on the sensed values and other control parameters. The control module 800 will typically include one or more memory devices and one or more processors. Other computer programs stored on memory devices associated with the control module 800 may be employed in some embodiments.

There will typically be a user interface associated with the control module 800. The user interface may include a display interface 818 configured for providing instructions to a display screen and/or graphical software displays of the testing systems, and user input devices 820 such as pointing devices, keyboards, touch screens, microphones, etc., which are used to communicate user inputs to the system 800.

In some implementations, a controller is part of a system, which may be part of the above-described examples. Such systems can comprise testing systems. Still other systems may include semiconductor processing equipment, including a processing tool or tools, chamber or chambers, a platform or platforms for processing, and/or specific processing components (a substrate pedestal, a gas flow system, etc.). All of these systems may be integrated with electronics for controlling their operation before, during, and after testing or processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the various drive mechanisms, and arm mechanisms for the robotic structures described, and may also include control of the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein but may be modified within their scope and equivalents of the claims.

What is claimed is:

1. A linear axis robotic structure comprising:
    a Z-tower;
    a vertical drive, comprising a ball screw assembly, configured within the Z-tower;
    a vertical drive mechanism adapted to integrate with the vertical drive for linear movement along the Z-tower along a Z-axis;
    a first section arm adapted to attach to the vertical drive mechanism and having a horizontal orientation, wherein the first section arm is configured for linear movement along the Z-tower with movement of the vertical drive mechanism;

a first linear drive configured within the first section arm;

a first linear drive mechanism adapted to integrate with the first linear drive for linear movement along the first section arm along a Y-axis; and a first gripper adapted to attach to the first linear drive mechanism and adapted for linear movement along the Y-axis with movement of the first linear drive mechanism;

a second linear drive configured within the first section arm;

a second linear drive mechanism adapted to integrate with the second linear drive for linear movement along the first section arm along the Y-axis;

a second gripper adapted to attach to the second linear drive mechanism and adapted for linear movement along the Y-axis with movement of the second linear drive mechanism;

a second section arm adapted to attach to the vertical drive mechanism and having a horizontal orientation, wherein the second section arm is configured for linear movement along the Z-tower with movement of the vertical drive mechanism;

a third linear drive configured within the second section arm;

a third linear drive mechanism adapted to integrate with the third linear drive for linear movement along the second section arm along a Y-axis; and a third gripper adapted to attach to the third linear drive mechanism and adapted for linear movement along the Y-axis with movement of the third linear drive mechanism.

2. The robotic structure of claim 1, wherein the first gripper is adapted to connect with a container having a receptacle area suitable for holding one or more objects.

3. The robotic structure of claim 1, further comprising:
wherein the first linear drive mechanism comprises an extension bracket configured at a first end to integrate with the first linear drive, and a second end adapted to attach to the first gripper,
wherein the second linear drive is configured above the first linear drive, such that the second gripper is below the first gripper,
wherein the outrigger extension bracket is configured to have an outrigger section adapted to increase a clearance space horizontally located above the second gripper, such that the extension bracket does not interfere with a substrate placed on the second gripper and occupying the clearance space.

4. The robotic structure of claim 1, further comprising:
a controller configured for independently controlling movement of the first linear drive and the second linear drive.

5. The robotic structure of claim 1, further comprising:
a universal interface adapted at a first end to connect to the first linear drive mechanism, wherein a second end of the universal interface is adapted to releasably attach to one or more grippers, each gripper uniquely adapted to interface with a corresponding object.

6. The robotic structure of claim 1, further comprising:
a first slot arranged horizontally along an outer face of the first section arm that faces outwards away from the Z-tower, wherein the first linear drive mechanism is adapted to integrate with the first linear drive through the first slot; and a second slot arranged horizontally along an inner face of the section arm that that faces inwards towards the Z-tower, wherein the second linear drive mechanism is adapted to integrate with the second linear drive through the second slot.

7. The robotic structure of claim 1, further comprising:
a platform, wherein the Z-tower extends above the platform.

8. The robotic structure of claim 1, further comprising:
a platform, wherein the Z-tower extends below the platform.

9. The robotic structure of claim 1, wherein the gripper comprises an active device or a passive device.

10. The robotic structure of claim 1, wherein the first linear drive comprises a ball slide assembly.

11. The robotic structure of claim 1, wherein the first gripper comprises an end-effector adapted to hold a device under test (DUT).

12. A linear axis robotic structure comprising:
a platform;
a rotatable base mounted to the platform and adapted to rotate in theta about the platform;
a Z-tower attached to the rotatable base, wherein the Z-tower rotates with the rotatable base;
a vertical drive, comprising a ball screw assembly, configured within the Z-tower;
a vertical drive mechanism adapted to integrate with the vertical drive for linear movement along the Z-tower along a Z-axis;
a first section arm adapted to attach to the vertical drive mechanism and having a horizontal orientation, wherein the first section arm is configured for linear movement along the Z-tower with movement of the vertical drive mechanism;
a first linear drive configured within the first section arm;
a first linear drive mechanism adapted to integrate with the first linear drive for linear movement along the first section arm along a Y-axis
a first gripper adapted to attach to the first linear drive mechanism and adapted for linear movement along the Y-axis with movement of the first linear drive mechanism;
a second linear drive configured within the first section arm;
a second linear drive mechanism adapted to integrate with the second linear drive for linear movement along the first section arm along the Y-axis;
a second gripper adapted to attach to the second linear drive mechanism and adapted for linear movement along the Y-axis with movement of the second linear drive mechanism;
a second section arm adapted to attach to the vertical drive mechanism and having a horizontal orientation, wherein the second section arm is configured for linear movement along the Z-tower with movement of the vertical drive mechanism;
a third linear drive configured within the second section arm;
a third linear drive mechanism adapted to integrate with the third linear drive for linear movement along the second section arm along a Y-axis; and
a third gripper adapted to attach to the third linear drive mechanism and adapted for linear movement along the Y-axis with movement of the third linear drive mechanism.

13. The robotic structure of claim 12, wherein the first gripper comprises an end-effector adapted to hold a device under test (DUT).

14. The robotic structure of claim 12, wherein the first gripper is adapted to connect with a container having a receptacle area suitable for holding one or more objects.

15. The robotic structure of claim 12, further comprising:
   a universal interface adapted at a first end to connect to the first linear drive mechanism, wherein a second end of the universal interface is adapted to releasably attach to one or more grippers, each gripper uniquely adapted to interface with a corresponding object.

16. The robotic structure of claim 12, wherein the gripper comprises an active device or a passive device.

17. The robotic structure of claim 12, further comprising:
   a controller configured for independently controlling movement of the first linear drive and the second linear drive.

18. The robotic structure of claim 12, wherein the Z-tower extends above the platform.

19. The robotic structure of claim 12, further comprising:
   a track system, wherein the platform is adapted to movably attach to the track system for movement along the track.

* * * * *